(12) United States Patent
Dodoc et al.

(10) Patent No.: US 8,107,162 B2
(45) Date of Patent: Jan. 31, 2012

(54) CATADIOPTRIC PROJECTION OBJECTIVE WITH INTERMEDIATE IMAGES

(75) Inventors: Aurelian Dodoc, Oberkochen (DE); Wilhelm Ulrich, Aalen (DE); Alexander Epple, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 742 days.

(21) Appl. No.: 11/596,868

(22) PCT Filed: May 13, 2005

(86) PCT No.: PCT/EP2005/005250
§ 371 (c)(1), (2), (4) Date: Oct. 6, 2008

(87) PCT Pub. No.: WO2005/111689
PCT Pub. Date: Nov. 24, 2005

(65) Prior Publication Data
US 2009/0034061 A1    Feb. 5, 2009

Related U.S. Application Data

(60) Provisional application No. 60/571,533, filed on May 17, 2004.

(51) Int. Cl.
*G02B 17/08* (2006.01)
(52) U.S. Cl. .................................................. 359/364
(58) Field of Classification Search .............. 359/351, 359/355–357, 364–366, 730, 858, 649, 651; 250/492.2
See application file for complete search history.

(56) References Cited

U.S. PATENT DOCUMENTS

| 5,636,066 A | 6/1997 | Takahashi |
| 6,621,557 B2 * | 9/2003 | Takahashi ..................... 355/67 |
| 6,995,930 B2 * | 2/2006 | Shafer et al. ................. 359/727 |

(Continued)

FOREIGN PATENT DOCUMENTS

EP    1 191 378 A1    3/2002
(Continued)

OTHER PUBLICATIONS

M. Switkes and M. Rothschild, "Immersion Lithography at 157 nm", J. Vac. Sci. Technol. B vol. 19, No. 6, Nov./Dec. 2001, pp. 2353-2356.

*Primary Examiner* — Mark Consilvio
(74) *Attorney, Agent, or Firm* — Suhrue Mion, PLLC

(57) ABSTRACT

A catadioptric projection objective for imaging of a pattern, which is arranged on the object plane of the projection objective, on the image plane of the projection objective has a first objective part for imaging of an object field to form a first real intermediate image, a second objective part for production of a second real intermediate image using the radiation coming from the first objective part; and a third objective part for imaging of the second real intermediate image on the image plane. The second objective part is a catadioptric objective part with a concave mirror. A first folding mirror for deflection of the radiation coming from the object plane in the direction of the concave mirror and a second folding mirror for deflection of the radiation coming from the concave mirror in the direction of the image plane are provided. A field lens with a positive refractive power is arranged between the first intermediate image and/or the first folding mirror and the concave mirror, in an area close to the field of the first intermediate image.

42 Claims, 15 Drawing Sheets

U.S. PATENT DOCUMENTS

| | | | |
|---|---|---|---|
| 7,317,583 B2 * | 1/2008 | Oskotsky et al. | 359/727 |
| 7,362,508 B2 * | 4/2008 | Omura et al. | 359/649 |
| 7,426,082 B2 * | 9/2008 | Shafer et al. | 359/727 |
| 7,428,105 B2 * | 9/2008 | Shafer et al. | 359/649 |
| RE40,743 E * | 6/2009 | Fuerter et al. | 359/732 |
| 7,697,198 B2 * | 4/2010 | Shafer et al. | 359/365 |
| 2002/0019946 A1 | 2/2002 | Iwamura | |
| 2003/0011896 A1 * | 1/2003 | Shiraishi | 359/754 |
| 2003/0058494 A1 | 3/2003 | Roberts et al. | |
| 2003/0197946 A1 * | 10/2003 | Omura | 359/649 |
| 2004/0233405 A1 | 11/2004 | Kato et al. | |
| 2005/0185269 A1 * | 8/2005 | Epple et al. | 359/366 |
| 2005/0248856 A1 | 11/2005 | Omura et al. | |

FOREIGN PATENT DOCUMENTS

| | | |
|---|---|---|
| EP | 1 279 984 A1 | 1/2003 |
| JP | 09-312254 | 2/1997 |
| JP | 2002-372668 A | 12/2002 |
| JP | 2004-317534 A | 11/2004 |
| WO | WO 01/04682 A1 | 1/2001 |
| WO | WO 02/082159 A1 | 10/2002 |
| WO | WO 03/036361 A2 | 1/2003 |
| WO | WO 03/052462 A2 | 6/2003 |
| WO | WO 2004/019128 A2 | 3/2004 |
| WO | WO 2005040890 A2 * | 5/2005 |

* cited by examiner

CATADIOPTRIC PROJECTION OBJECTIVE WITH INTERMEDIATE IMAGES

This application is the National Stage of International Application No. PCT/EP2005/005250, filed May 13, 2005, which claims the benefit of U.S. Provisional Application No. 60/571,533 filed on May 17, 2004 which is herewith incorporated into this application by reference.

BACKGROUND OF THE INVENTION

1. Field of the Invention

The invention relates to a catadioptric projection objective for imaging of a pattern, which is arranged on the object plane of the projection objective, on the image plane of the projection objective.

2. Description of the Related Art

Projection objectives such as these are used in microlithography projection exposure systems for the production of semiconductor components and other finely structured components. They are used to project patterns of photomasks or reticles which are referred to in the following text in a general form as masks or reticles, onto an object which is coated with a light-sensitive layer, with very high resolution and on a reduced scale.

In this case, in order to produce ever finer structures, it is necessary on the one hand to enlarge the image-side numerical aperture (NA) of the projection objective, and on the other hand to use ever shorter wavelengths, preferably ultraviolet light at wavelengths of less than about 260 nm, for example 248 nm, 193 nm or 157 nm.

In the past, purely refractive projection objectives have been predominantly used for optical lithography. These are distinguished by a mechanically relatively simple, centered design, which has only a single optical axis, that is not folded. Furthermore, it is possible to use object fields which are centered with respect to the optical axis, which minimize the light transmission level to be corrected, and simplify adjustment of the objective.

However, the form of the refractive design is primarily characterized by two elementary imaging errors: the chromatic correction and the correction for the Petzval sum (image field curvature).

Catadioptric designs, which have at least one catadioptric objective part and a hollow mirror or a concave mirror, are used to simplify the correction for the Petzval condition and to provide a capability for chromatic correction. In this case, the Petzval correction is achieved by the curvature of the concave mirror and negative lenses in its vicinity, while the chromatic correction is achieved by the refractive power of the negative lenses upstream of the concave mirror (for CHL) as well as the diaphragm position with respect to the concave mirror (CHV).

One disadvantage of catadioptric designs with beam splitting is, however, that it is necessary to work either with off-axis object fields, that is to say with an increased light conductance value (in systems using geometric beam splitting) or with physical beam splitter elements, which generally cause polarization problems. The term "light conductance value" as used here refers to the Lagrange optical invariant or Etendue, which is defined here as the product of the image field diameter and the image-side numerical aperture.

In the case of off-axis catadioptric systems, that is to say in the case of systems with geometric beam splitting, the requirements for the optical design can be formulated as follows: (1) reduce the light transmission level to the maximum extent, (2) design the geometry of the foldings (beam deflections) such that a mounting technology can be developed for this purpose, and (3) provide effective correction, in particular the capability to correct the Petzval sum and the chromatic aberrations jointly in the catadioptric mirror group.

In order to keep the geometric light conductance value (Etendue) low, the folding of the design should in principle take place in the region of low NA, that is to say for example close to the object, or in the vicinity of a real intermediate image.

However, as the numeric aperture increases, the object-side numerical aperture also increases, and thus the distance between the first folding mirror and the reticle, so that the light transmission level rises. Furthermore, the diameter of the hollow mirror and the size of the folding mirror increase. This can lead to physical installation space problems.

These can be overcome by first of all imaging the reticle by means of a first relay system onto an intermediate image, and by carrying out the first folding in the area of the intermediate image. A catadioptric system such as this is disclosed in EP 1 191 378 A1. This has a refractive relay system, followed by a catadioptric objective part with a concave mirror. The light falls from the object plane onto a folding mirror (deflection mirror) which is located in the vicinity of the first intermediate image, from there to the concave mirror and from there onto a refractive object part, with a second real intermediate image being generated in the vicinity of a second deflection mirror, and the refractive object part images the second intermediate image on the image plane (wafer). Concatenated systems having, in that sequence, a refractive (R), a catadioptric (C), and a refractive (R) imaging subsystem will be denoted "R-C-R" type systems in the following.

Systems of type R-C-R with a similar folding geometry are disclosed in WO 2004/019128 A, WO 03/036361 A1 and US 2002/019946 A1. Patent application US 2004/0233405 A1 discloses R-C-R type projection objectives with different folding geometries including objectives where the first folding mirror is arranged optically downstream of the concave mirror to deflect radiation coming from the concave mirror towards the image plane.

Other catadioptric systems with two real intermediate images are disclosed in JP 2002-372668 and in U.S. Pat. No. 5,636,066. WO 02/082159 A1 and WO 01/04682 disclose other catadioptric systems with more than one intermediate image.

SUMMARY OF THE INVENTION

It is one object of the invention to provide a catadioptric projection objective which allows very high resolutions to be achieved, with a compact design with optimized dimensions. It is another object to allow correction of the Petzval sum and of the chromatic aberrations with good manufacturing conditions.

As a solution to these and other objects this invention, according to one formulation, provides a catadioptric projection objective for imaging of a pattern, which is arranged on the object plane of the projection objective, on the image plane of the projection objective, having: a first objective part for imaging of an object field to form a first real intermediate image; a second objective part for generating a second real intermediate image using the radiation coming from the first objective part; and a third objective part for imaging the second real intermediate image on the image plane; wherein the second objective part is a catadioptric objective part with a concave mirror; a first folding mirror for deflecting the radiation coming from the object plane in the direction of the concave mirror and a second folding mirror for deflecting the radiation coming from the concave mirror in the direction of the image plane are provided; and a field lens with a positive refractive power is arranged between the first intermediate image and the concave mirror, in a region close to the field of the first intermediate image.

According to another formulation, a field lens with a positive refractive power is arranged geometrically between the first folding mirror and the concave mirror in a region close to the field of the first intermediate image. This position is optically between the first intermediate image and the concave mirror if the first intermediate image is created optically upstream, i.e. before the field lens in light propagation direction. The first intermediate image may also be positioned optically downstream, i.e. behind the field lens, or may partly extend into the field lens.

The enlargement of the numerical aperture which is required in order to achieve very high resolutions frequently leads in conventional systems to a major increase in the diameter of the optical components which are located in the area of preferred diaphragm positions. The invention counteracts this effect.

The expression "field lens" describes an individual lens or a lens group with at least two individual lenses. The expression takes account of the fact that the function of a lens can fundamentally also be carried out by two or more lenses (splitting of lenses). The refractive power of this field lens is arranged close to the field, that is to say in the optical vicinity of a field plane. This area close to the field for a field plane is distinguished in particular by the chief ray height of the imaging being large in comparison to the marginal ray height. In this case, the marginal ray height is the ray height of a marginal ray which leads from the innermost point of the object field, which is closest to the optical axis, to an edge of an aperture diaphragm, while the chief ray (principal ray) leads from the outermost field point of the object field parallel to, or at an acute angle to, the optical axis and intersects the optical axis in the area of the system diaphragm, that is to say at a diaphragm location which is suitable for the fitting of an aperture diaphragm. The ratio between the marginal ray height and the chief ray height is thus less than unity in the area close to the field.

The expression "intermediate image" describes the area between a paraxial intermediate image and an marginal ray intermediate image. Depending on the correction state of the intermediate image, this area may extend over a certain axial range in which case, by way of example, the paraxial intermediate image may be located in the light path upstream or downstream of the marginal ray intermediate image, depending on the spherical aberration (undercorrection or overcorrection). The paraxial intermediate image and the marginal ray intermediate image may also essentially coincide. For the purposes of this application, an optical element A, for example a field lens, is located "between" an intermediate image and another optical element B when at least a portion of the optical element A is located between the (generally axially extended) intermediate image and the optical element B. The intermediate image may thus also partially extend beyond an optical surface which, for example, may be advantageous for correction purposes. The intermediate image is frequently located completely outside optical elements. Since the radiation energy density in the intermediate image area is particularly high, this may be advantageous, for example, with respect to the radiation load on the optical elements.

Positive refractive power in the divergent beam path between an upstream intermediate image and the concave mirror contributes to the capability for the downstream lenses in the beam path and the concave mirror to have small diameters. This applies in particular to the at least one negative lens which is provided in preferred embodiments in the immediate vicinity upstream of the concave mirror and which, in conjunction with the concave mirror, makes a major contribution to the correction of the chromatic longitudinal aberration CHL. If the chromatic longitudinal aberration is corrected in some other way, there is no need for this negative lens.

The insertion of positive refractive power between a field plane upstream of the concave mirror and the concave mirror leads in its own right to a contribution to the image field curvature which is proportional to the strength of the positive refractive power. In order to at least partially compensate for this effect, the concave mirror should have greater curvature than in the absence of the positive refractive power. In order, on the other hand, to keep the aberrations which are introduced by the reflection on the concave mirror as small as possible, it is advantageous for the radiation mirror as small as possible, it is advantageous for the radiation which strikes the concave mirror to strike it essentially at right angles. When positive refractive power is inserted downstream from the intermediate image, this leads to an increase in the negative refractive power directly upstream of the concave mirror, in order to ensure largely perpendicular radiation incidence by virtue of the scattering effect. The increase in the negative refractive power upstream of the concave mirror can at least partially compensate for the reduction in the CHL correction by reducing the size of the lens diameter in this area, so that good CHL correlation is ensured even with a relatively small mirror diameter.

In preferred embodiments, the first intermediate image is located in the vicinity of a folding mirror, which makes it possible to keep the Etendue of the system small. The field lens can generally be fitted very close to the intermediate image without being adversely affected by the folding mirror, thus allowing effective correction of imaging errors. In particular, the objective parts can be suitably designed in order to ensure that at least the intermediate image which is close to the field lens is subject to severe aberration. This allows particularly effective correction of imaging errors. The effectiveness of the correction can be assisted by designing at least that lens surface of the field lens which faces the intermediate image as an aspherical surface.

In one embodiment, the field lens is arranged geometrically between the concave mirror and at least one folding mirror in a region through which the beam passes twice, in such a manner that a first lens area of the field lens is arranged in the beam path between the object plane and the concave mirror, and a second lens area of the field lens is arranged in the beam path between the concave mirror and the image plane.

The field lens can be arranged such that it is arranged not only in the optical vicinity of an intermediate image plane which is located in the beam path upstream of the concave mirror, but also in the optical vicinity of an intermediate image plane which is located in the beam path downstream from the concave mirror. This results in an arrangement close to the field with respect to two successive field planes, so that a powerful correction effect can be achieved at two points in the beam path.

At least one multiple area lens can be arranged in a region of the projection objective through which the beam passes twice and has a first lens area, through which the beam passes in a first direction, and a second lens area, through which the beam passes in a second direction, with the first lens area and the second lens area not overlapping one another, at least on one side of the lens. This multiple area lens may be used as a field lens. If the footprints of the beam paths do not overlap on at least one of the two lens faces, a multiple area lens such as this allows two lenses which act independently of one another to be geometrically moved to a common point. It is also possible to physically manufacture two lenses which act independently of one another as one lens, specifically as an integral multiple area lens, from one lens blank. A multiple area lens such as this can be clearly distinguished from a conventional lens through which the beam passes twice since, in the case of a multiple area lens of this type its optical effect on the beams which pass through it independently of one another can be influenced by suitable independent shaping of the refractive surfaces of the lens areas independently of one another. Alternatively, a lens arrangement with one or two half-lenses or lens elements can also be arranged at the location of an integral multiple area lens in order to influence the beams as they pass one another, independently of one another.

Projection objectives with geometric beam splitting, an intermediate image and a multiple area lens have been disclosed, for example, in WO 03/052462 A1 from the same applicant. The disclosure in this patent application is included by reference in the content of this description.

The projection objective preferably has an image-side numerical aperture of NA>0.85, and an image-side working distance of $A \leqq 10$ mm. Projection objectives such as these may be used, if required, or immersion lithography with NA>1. The image-side working distance or the working distance in the image area is the (shortest) axial distance between the exit surface of the objective and the image plane. This working distance in the image area, which is filled with a gas during operation in dry systems, is filled with an immersion medium during operation in immersion systems, with the immersion medium having a refractive index which is relatively high in comparison to that of gas.

It is generally advantageous for the image-side working distance not to fall below a minimum value. In this case, it should be noted that scratches, dirt and inhomogeneities on or in the last optical element can lead to a disturbance of the image if the working distance is too short. A finite working distance of, for example, 1 mm or more can in contrast lead to relatively large sub-apertures (footprints of one specific field point) with the high image-side numerical apertures, so that an averaging effect can occur and any image disturbance is reduced or suppressed.

Particular criteria must be taken into account for the definition of the working distance in the image area in immersion systems. On the one hand, a long working distance results not only in greater radiation losses owing to the normally lower transmission of immersion liquids (in comparison to gases) but also to a greater amount of aberration of the surfaces which are located in the vicinity of the image plane, specifically for spherical aberration. On the other hand, the image-side working distance should be sufficiently large to allow laminar flow of an immersion fluid. It may also be necessary to provide space for measurement purposes and sensors. In preferred embodiments, the image-side working distance is between about 1 mm and about 8 mm, in particular between about 1.5 mm and about 5 mm. When using an immersion fluid between the exit surface and the image plane, preferred embodiments have an image-side numerical aperture of $NA \geqq 0.98$, with the image-side numerical aperture preferably being at least NA=1.0, or at least NA=1.1. The projection objective is preferably matched to an immersion medium which has a refractive index of $n_I > 1.3$ at an operating wavelength.

Very pure water for which $n_I \approx 1.43$ is suitable as an immersion medium for an operating wavelength of 193 nm. The article "Immersion Lithography at 157 nm by M. Switkes and M. Rothschild, J. Vac. Sci. Technol. B 19(6), November/ December 2001, pages 1 et seq proposes immersion liquids based on perfluoropolyethers (PFPE) which are sufficiently transparent for an operating wavelength of 157 nm and are compatible with a number of photoresist materials that are currently used in microlithography. One tested immersion liquid has a refractive index of $n_I = 1.37$ at 157 nm.

The optical design also allows use for non-contacting near-field projection lithography. In this case, sufficient light energy can be injected into the substrate to be exposed via a gap which is filled with gas, provided that a sufficiently short image-side working distance is maintained, averaged over time. This should be less than four times the operating wavelength that is used, in particular less than the operating wavelength. It is particularly advantageous for the working distance to be less than half the operating wavelength, for example less than one third, one quarter or one fifth of the operating wavelength. These short working distances allow imaging in the optical near field in which evanescent fields, which exist in the immediate vicinity of the last optical surface of the imaging system, are used for imaging.

The invention thus also covers a non-contacting projection exposure method in which evanescent fields of the exposure light which are located in the immediate vicinity of the exit surface can be used for the lithographic process. In this case, if the working distances are sufficiently short (finite), a light component which can be used for lithography can be emitted from the exit surface of the objective, and can be injected into an entry surface, which is immediately adjacent at a distance, despite geometrical total internal reflection conditions on the last optical surface of the projection objective.

Embodiments for non-contacting near-field projection lithography preferably use typical working distances in the region of the operating wavelength or less, for example between about 3 nm and about 200 nm, in particular between about 5 nm and about 100 nm. The working distance should be matched to the other characteristics of the projection system (characteristics of the projection objective close to the exit surface, characteristics of the substrate close to the entry surface) so as to achieve an input efficiency of at least 10%, averaged over time.

A method for production of semiconductor components and the like is thus possible within the scope of the invention, in which a finite working distance is set between an exit surface for exposure light which is associated with the projection objective and an entry surface for exposure light which is associated with the substrate, with the working distance within an exposure time interval being set, at least at times, to a value which is less than a maximum extent of an optical near field of the light emerging from the exit surface.

Use as a dry objective is also possible, if required, with minor modifications. Dry objectives are designed such that a gap which is filled with gas is produced during operation between the exit surface of the projection objective and the entry surface of an object to be exposed, for example a wafer, with this gap width typically being considerably greater than the operating wavelength. The achievable numerical apertures with systems such as these are restricted to values NA<1, since total internal reflection conditions occur on the exit surface on approaching the value NA=1, preventing any exposure light from being emitted from the exit surface. In preferred embodiments of dry systems, the image-side numerical aperture is $NA \geqq 0.85$ or $NA \geqq 0.9$.

The third objective part immediately upstream of the image plane is preferably designed to be purely refractive, and can be optimized in order to produce high image-side numerical apertures (NA). It preferably has a first lens group, which follows the second intermediate image, and has a positive refractive power, a second lens group, which immediately follows the first lens group and has a negative refractive power, a third lens group which immediately follows the second lens group and has a positive refractive power, a fourth lens group which immediately follows the third lens group and has a positive refractive power, and a pupil surface which is arranged in a transitional region from the third lens group to the fourth lens group and in whose vicinity a system diaphragm can be arranged. The third lens group preferably has an entry surface which is located in the vicinity of a point of inflection of a marginal ray height between the second lens group and the third lens group, with no negative lens with any substantial refractive power being arranged between this entry surface and the system diaphragm. There are preferably only positive lenses between this entry surface and the image plane. This allows a material-saving design, with moderate lens diameters.

The last optical element in the projection objective immediately upstream of the image plane is preferably a piano-convex lens with a high spherical or aspherically curved entry surface and an exit surface which is essentially planar. This may be in the form of a plano-convex lens which is virtually hemispherical or is not hemispherical. The last optical element, in particular the piano-convex lens, may also be composed of calcium fluoride in order to avoid problems resulting from radiation-induced density changes (in particular compaction).

The first objective part may be used as a relay system in order to produce a first intermediate image, with a predetermined correction state at a suitable position, from the radiation coming from the object plane. The first objective part is generally purely refractive. In some embodiments, at least one folding mirror is provided in this first objective part, which images the object plane to form a first intermediate image, such that the optical axis is folded at least once, and preferably no more than once, within the objective part which is closest to the object.

In some embodiments, the first objective path is a catadioptric objective part with a concave mirror and an associated folding mirror, which may be used as the first folding mirror for the overall projection objective.

The provision of at least two catadioptric subsystems has major advantages. In order to identify significant disadvantages of systems with only one catadioptric subsystem, it is necessary to consider how the Petzval sum and the chromatic aberrations are corrected in a catadioptric part. The contribution of a lens to the chromatic longitudinal aberration CHL is proportional to the square of the marginal ray height h, to the refractive power $\phi$ of the lens, and to the dispersion v of the material. On the other hand, the contribution of a surface to the Petzval sum depends only on the surface curvature and of the sudden change in the refractive index (which is −2 in the case of a mirror in air).

In order to allow the contribution of the catadioptric group to the chromatic correction to become large, large marginal ray heights (that is to say large diameters) are thus required, and large curvatures are required in order to allow the contribution to the Petzval correction to become large (that is to say small radii, which are best achieved with small diameters). These two requirements are contradictory.

The contradictory requirements based on Petzval correction (that is to say correction of the image field curvature) and chromatic correction can be solved by introduction of (at least) one further catadioptric part into the system. Since the first catadioptric objective part can be designed such that both the image field curvature and the chromatic longitudinal aberration can be largely or completely corrected, the first intermediate image may have a defined correction state with respect to these aberrations, so that the subsequent objective parts may have an advantageous design.

In one embodiment, the first objective part is a catadioptric objective part with a physical beam splitter, which has a polarization-selective beam splitter surface which is used as a folding mirror and at the same time separates that radiation which leads to the concave mirror of the first objective part from that radiation which is reflected by this concave mirror.

In some embodiments, a concave mirror is provided which is designed as an active mirror, so that the shape of the concave mirror surface can be varied by a suitable drive. This can be used to compensate for various imaging errors.

Some embodiments of projection objectives according to the invention have a crossed beam path at least one point. For this purpose, they are designed such that a first beam section which runs from the object plane to a concave mirror and a second beam section which runs from the concave mirror to the image plane can be produced, and one folding mirror is arranged with respect to the concave mirror in such a manner that one of the beam sections is folded on the folding mirror, and the other beam section passes through the folding mirror without any vignetting, and the first beam section and the second beam section cross over in a crossing region.

The crossed beam path in the region of a catadioptric objective part, allows projection objectives with a compact and mechanically robust arrangement of the optical components. In this case, a beam path without any vignetting can be achieved, so that no folding mirror intersects a beam which is either reflected on the folding mirror or is passed by the folding mirror without reflection. In this way, only the system diaphragm limits the angular distribution of the rays which contribute to imaging, in an axially symmetrical manner. At the same time, even with the largest numerical apertures, which are associated with large maximum beam diameters and, possibly, highly convergent or divergent beams in the region of the field planes, it is possible to achieve a moderate size for the overall field to be corrected. In this case, the expression "overall field" describes the field area which is enclosed by a minimum circle around the generally rectangular field. The size of the overall field to be corrected increases with the field size and the lateral offset of an axially asymmetric field with respect to the optical axis, and should be minimized in order to simplify the correction process.

Catadioptric projection objectives with a crossed beam path are disclosed, for example, in the U.S. provisional application with the Ser. No. 60/511,673, which was filed on Oct. 17, 2003, or the U.S. patent application with the Ser. No. 10/734,623, which was filed on Dec. 27, 2003, or the U.S. provisional application with the Ser. No. 60/530,622, which was filed on Dec. 19, 2003, by the same applicant. The disclosure content of these patent applications is included by reference in the content of this description.

In preferred embodiments, an off-axis effective object field arranged in the object surface of the projection objective is imaged onto an off-axis effective image field arranged in the image surface of the projection objective. Here, the term "effective object field" relates to the object field which can be effectively imaged by the projection objective without vignetting at a given numerical aperture. The amount of a lateral offset between the effective object field and the first part of the optical axis defined by the first objective part may be characterized by a finite object center height h. Likewise, on the image side of the projection objective, the effective image field is laterally offset with respect to the image side part of the optical axis by a finite image center height h' related to the object center height h by the magnification ratio β of the projection objective according to h'=|β·h|. In some conventional projection objectives having a refractive first objective part, a catadioptric second objective part, and a refractive third objective part (also denoted type R-C-R) efforts have been made to align the parts of the optical axis defined by the object side refractive objective part and the image side refractive objective part such that no lateral axis offset exists between these parts of the optical axis. However, under these conditions, a finite value of an object-image-shift (OIS) defined between an object field center and an image field center results. Where the object surface and the image surface of the projection objective are parallel to each other, the object-image-shift may be defined as a lateral offset between an object field center axis running parallel to the object side optical axis through the center of the effective object field and an image field center axis running parallel to the image side part of the optical axis through the center of the effective image field. It has been found that small values of object-image-shift may be desirable e.g. if the projection objective is to be incorporated into a projection exposure system designed for scanning operations. Also, measuring techniques used for the qualification of the projection objective may be simplified with respect to conventional measuring techniques if small amounts of object-image-shift are obtained. Therefore, in preferred embodiments, the following condition holds:

$$0 \leq OIS \leq |h \cdot (1+|\beta|)|.$$

In embodiments obeying this condition, the object-image-shift OIS is smaller than the object-image-shift of designs where the object side part of the optical axis and the image side part of the optical axis are coaxial. In preferred embodiments, no object-image-shift is present such that the condition OIS=0 is fulfilled.

These conditions may be useful in embodiments of the invention having a field lens with positive refractive power arranged between the first intermediate image and the concave mirror in the optical vicinity of the first intermediate image. However, small values for OIS may also be useful for conventional designs having no field lens of this type, such as shown e.g. in WO 2004/019128 A.

Another aspect of the invention enables designing projection objectives having potential for very high image side numerical apertures NA>1.2 or NA>1.3 while at the same time the overall track length (axial distance between object surface and image surface) can be limited to values allowing incorporation of the projection objective in conventional projection exposure systems and, at the same time, allowing to limit the maximum size (diameter) of lenses in the refractive objective parts upstream and/or downstream of a folding mirror. To this end, in preferred embodiments, a refractive power and a position of the field lens is set such that for a first chief ray direction cosine $CRA_1$ at the first intermediate image the following condition holds:

$$|CRA1| < |\beta_1 * (Y_{OB})/(L_{HOA})|$$

where $\beta_1$ denotes the magnification of the first objective part, $Y_{OB}$ is the object height of the outermost field point for which the chief ray is considered and $L_{HOA}$ is the geometrical distance from the first intermediate image to the concave mirror (length of the horizontal axis). With other words, it may be desirable that the chief ray is telecentric or almost telecentric at a an intermediate image. A chief ray obeying the condition given above will be denoted as an "essentially telecentric chief ray" in the following. Providing an essentially telecentric chief ray at a folding mirror close to such intermediate image allows to limit the size of lenses immediately upstream and/or downstream of the folding mirror. In addition, it has been found that installation space within the third objective part responsible for providing high image side numerical apertures is obtained.

Further, in some embodiments it has been found beneficial for obtaining very high image side numerical apertures if a first axial length AL1 of the first objective part is smaller than a third axial length AL3 of the third objective part, wherein the axial length AL1 is measured between the object plane and an intersection of the optical axis with the first folding mirror and the axial length AL3 is measured between the intersection of the optical axis with the second folding mirror and the image plane. In preferred embodiments, the condition AL1/AL3<0.9, more preferably AL1/AL3<0.8 holds Systems according to the invention can preferably be used in the deep UV band, for example at 248 nm, 193 nm or 157 nm, or less.

These features and further features are evident not only from the claims but also from the description and the drawings, in which case the individual features can be implemented in their own right or together in the form of subcombinations of embodiments of the invention, and in other fields, and can represent advantageous embodiments, as well as embodiments which are worthy of protection in their own right.

In the following description of preferred embodiments, the expression "optical axis" means a straight line or a sequence of straight line sections through the centers of curvature of the optical components. The optical axis is folded on folding mirrors (deflection mirrors) or on other reflective surfaces. Directions and distances are described as being on the "image side" when they are directed in the direction of the image plane or of the substrate which is located there and is to be exposed, and as on the "object side" when they are directed toward the object plane or toward a reticle located there, with respect to the optical axis. The object in the examples is a mask (reticle) with the pattern of an integrated circuit, although it may also be a different pattern, for example a grating. The image in the examples is projected onto a wafer which is provided with a photoresist layer and is used as a substrate. Other substrates, for example elements for liquid crystal displays or substrates for optical gratings, are also possible.

Figure 1:
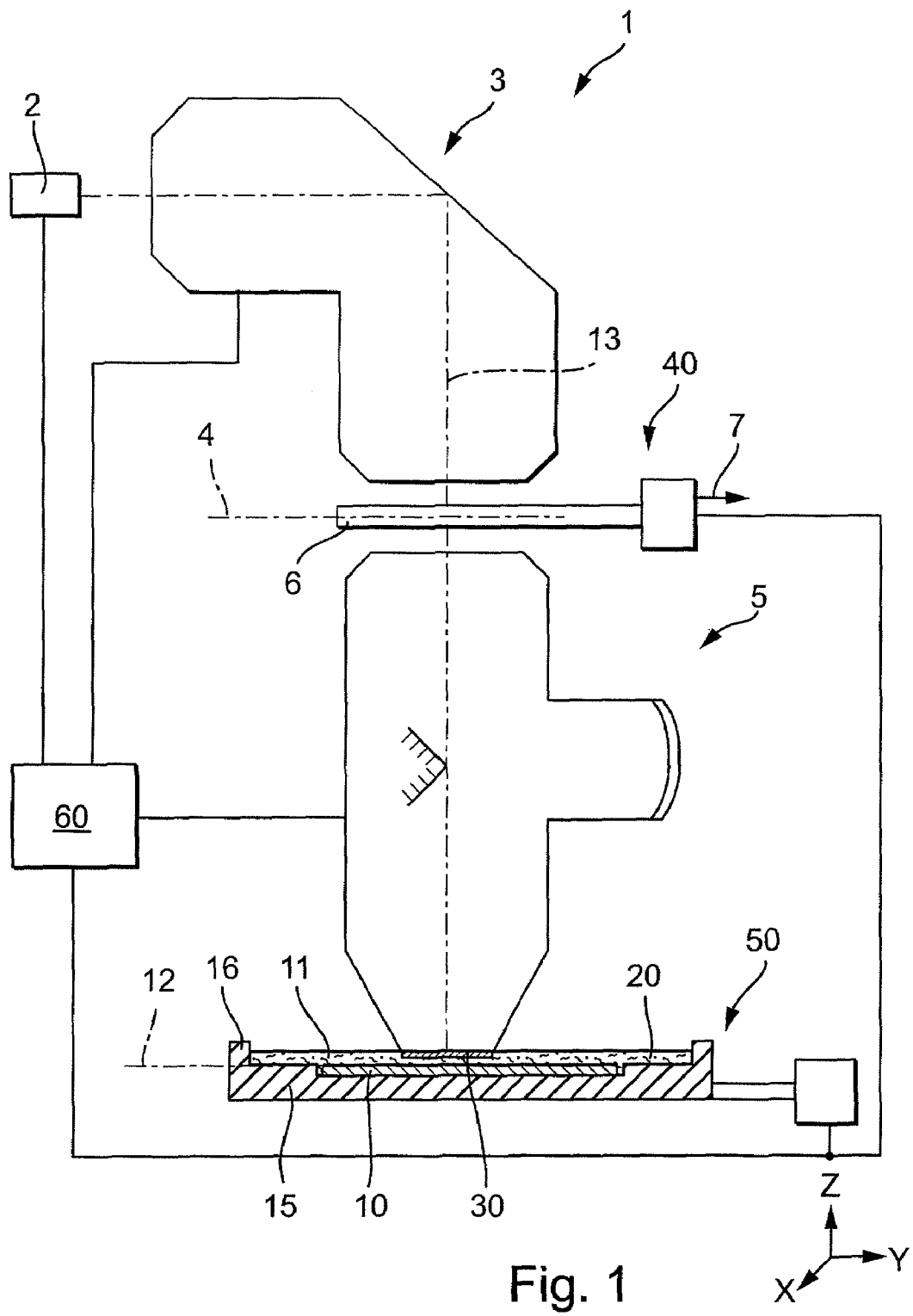
FIG. 1 shows a schematic illustration of a projection exposure system for immersion lithography with one embodiment of a catadioptric projection objective according to the invention.

FIG. 1 shows, schematically, a microlithographic projection exposure system in the form of a wafer stepper 1, which is intended for production of large-scale integrated semiconductor components by means of immersion lithography. The projection exposure system 1 has an excimer laser 2 as the light source, with an operating wavelength of 193 nm, although other operating wavelengths, for example 157 nm or 248 nm, are also possible. A downstream illumination system 3 produces a large, sharply constricted, highly homogeneously illuminated illumination field, which is matched to the telecentric requirements of the downstream projection objective 5 on its exit plane 4. The illumination system 3 has devices for selection of the illumination mode and, in the example, can be switched between conventional illumination with a variable coherence degree, annular field illumination and dipole or quadrupole illumination.

A device 40 (reticle stage) for holding and manipulating a mask 6 is arranged behind the illumination system in such a way that it is located on the object plane 4 of the projection objective 5, and can be moved in a departure direction 7 (y direction) on this plane, for scanning purposes.

The plane 4, which is also referred to as the mask plane, is followed by the catadioptric reduction objective 5, which images an image of the mask on a reduced scale of 4:1 on a wafer 10 which is covered with a photoresist layer. Other reduction scales, for example 5:1, 10:1 or 100:1 or more, are likewise possible. The wafer 10 which is used as a light-sensitive substrate, is arranged such that the planar substrate surface 11 together with the photoresist layer essentially coincides with the image plane 12 of the projection objective 5. The wafer is held by a device 50 (wafer stage) which comprises a scanner drive in order to move the wafer synchronously with the mask 6 and parallel to it. The device 50 also has manipulators, in order to move the wafer both in the z direction parallel to the optical axis 13 of the projection objective and in the x and y directions at right angles to this axis. A tilting device is integrated, and has at least one tilting axis which runs at right angles to the optical axis 13.

The device 50, which is provided for holding the wafer 10, is designed for use for immersion lithography. It has a holding device 15, which can be moved by a scanner drive and whose base has a flat depression or recess for holding the wafer 10. A flat liquid-tight holder, which is open at the top, for a liquid immersion medium 20 is formed by a circumferential rim 16, and the immersion medium 20 can be introduced into the holder, and can be carried away from it, by devices that are not shown. The height of the rim is designed such that the filled immersion medium completely covers the surface 11 of the wafer 10, and the exit-side end area of the projection objective 5 can be immersed in the immersion liquid between the objective exit and the wafer surface while the working distance is set correctly. The entire system is controlled by a central computer unit 60.

Figure 2:
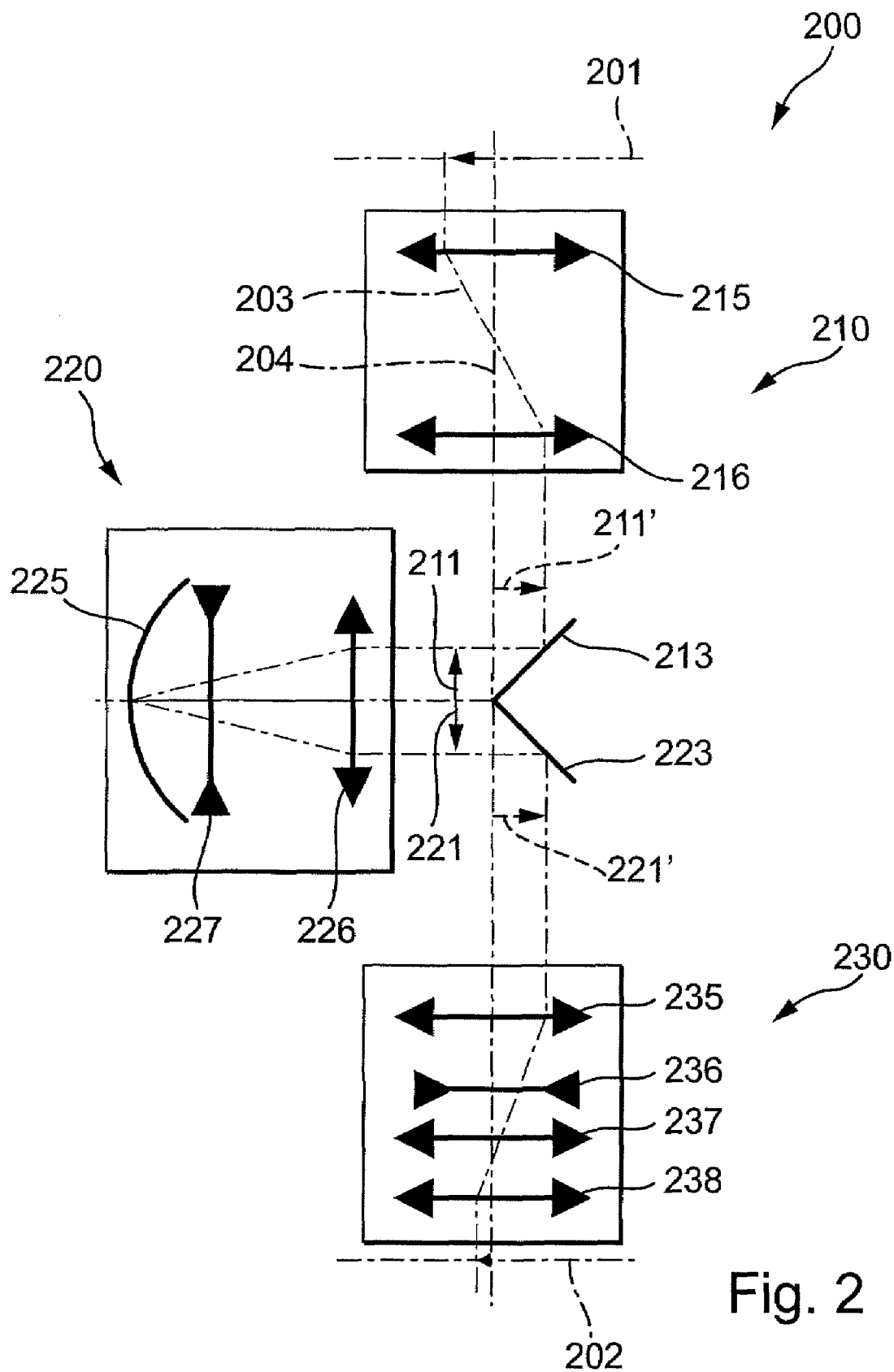
FIG. 2 shows a schematic illustration of the design of preferred embodiments of projection objectives according to the invention, with a refractive first objective part, a catadioptric second objective part, and a refractive third objective part.

FIG. 2 schematically illustrates one preferred embodiment of projection objectives according to the invention. The projection objective 200 is used to image a pattern (which is arranged on its object plane 201) of a mask on a reduced scale on its image plane 202, which is aligned parallel to the object plane, on a reduced scale. It has a first, refractive objective part 210, which images the object field to form a first, real intermediate image 211, a second, catadioptric objective part 220, which images the first intermediate image to form a second real intermediate image 221, and a third, refractive objective part 230, which images the second intermediate image on a reduced scale on the image plane 202. The catadioptric objective part 220 has a concave mirror 225. A first folding mirror 213 is arranged in the vicinity of the first intermediate image, at an angle of 45° to the optical axis 204, such that it reflects the radiation coming from the object plane in the direction of the concave mirror 225. A second folding mirror 223, whose planar mirror surface is aligned at right angles to the planar mirror surface of the first folding mirror, reflects the radiation coming from the concave mirror 225 in the direction of the image plane 202.

The folding mirrors 213, 223 are each located in the optical vicinity of the intermediate images, so that the light conductance value can be kept low. The intermediate images, that is the entire region between the paraxial intermediate image and the marginal ray intermediate image, are preferably not located on the mirror surfaces, thus resulting in a finite minimum distance between the intermediate image and the mirror surface, so that any faults in the mirror surface, for example scratches or impurities, are not imaged sharply on the image plane. The minimum distance should be set such that sub-apertures of the radiation, that is to say footprints of beams which originate from a specific field point or converge on it do not have a diameter of less than 5 mm, or 10 mm, on the mirror surface. Embodiments exist in which both the first intermediate image 211, that is to say the second intermediate image 221 as well, are located in the geometric space between the folding mirrors and the concave mirror 225 (solid arrows). This side arm is also referred to as the horizontal arm (HOA). In other embodiments, the first intermediate image 211' may be located in the beam path upstream of the first folding mirror 213, and the second intermediate image 221' may be located in the beam path downstream from the second folding mirror (arrows represented by dashed lines).

The folding angles in this exemplary embodiment are exactly 90°. This is advantageous for the performance of the mirror layers of the folding mirrors. Deflections by more or less than 90° are also possible, thus resulting in an obliquely positioned horizontal arm.

All of the objective parts 210, 220, 230 have a positive refractive power. In the schematic illustration, lenses or lens groups with a positive refractive power are represented by double-headed arrows with points pointing outwards, while lenses or lens groups with a negative refractive power are, in contrast, represented by double-headed arrows with heads pointing inwards.

The first objective part 210 comprises two lens groups 215, 216 with a positive refractive power, between which a possible diaphragm position exists where the chief ray 203, which is shown by a solid line, intersects the optical axis 204, which is shown by a dashed-dotted line. The optical axis is folded through 90° at the first folding mirror 213. The first intermediate image 211 is produced in the light path immediately downstream from the first folding mirror 213.

The first intermediate image 211 acts as an object for the subsequent catadioptric objective part 220. This has a positive lens group 226 close to the field, a negative lens group 227 close to the diaphragm, and the concave mirror 225 which is arranged immediately downstream from this and images the first intermediate image to form the second intermediate image 221. The lens group 226, which has a positive effect overall, is used as a "field lens" and is formed by a single positive lens, whose effect can also be produced, however, by two or more individual lenses with a positive refractive power overall. The negative lens group 227 comprises one or more lenses with a negative effect.

The second intermediate image 221, which is located optically immediately in front of the second folding mirror 223, is imaged by the third refractive objective part 230 on the image plane 202. The refractive objective part 230 has a first positive lens group 235, a second negative lens group 236, a third positive lens group 237 and a fourth positive lens group 238. There is a possible diaphragm position between the positive lens groups 237, 238, where the chief ray intercepts the optical axis.

Figure 3:
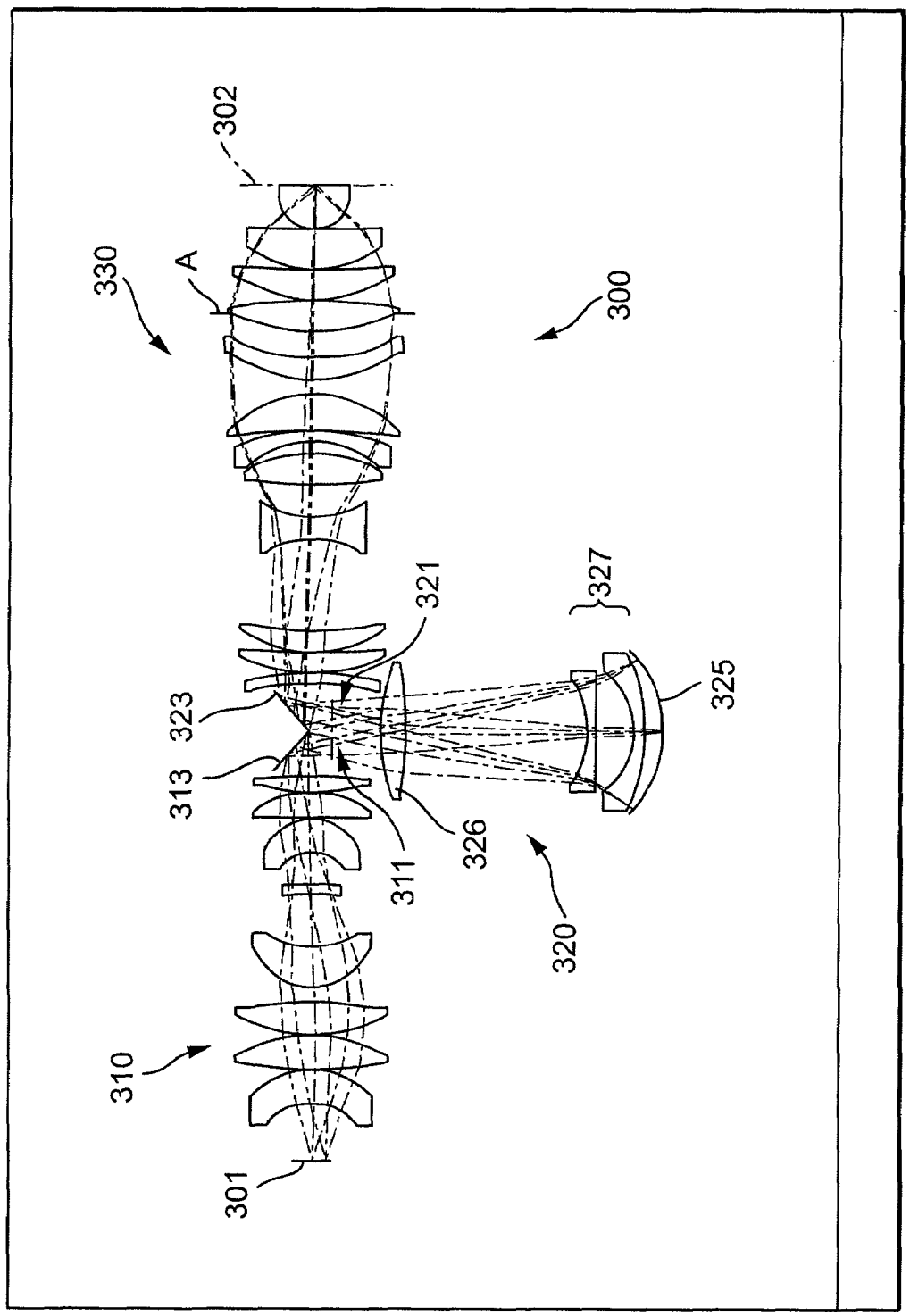
FIG. 3 shows a lens section through a first embodiment of a projection objective according to the invention.

FIG. 3 shows a lens section through a projection objective 300 which is essentially formed using the principles explained with reference to FIG. 2. Identical or corresponding elements or element groups are annotated with the same reference symbols as in FIG. 2, increased by 100.

One special feature of the system is that a biconvex positive lens 326, through which the beam passes in two opposite directions, is provided geometrically between the folding mirrors 313, 323 and the concave mirror 325 in a region of the projection objective through which the beam passes twice, with the beam passing through it both in the light path between the first intermediate image 311 and the concave mirror 325 and in the light path between the concave mirror and the second intermediate image 321, or the image plane 302, in mutually offset lens areas. The positive lens 326 is arranged closer to the folding mirrors 313, 323 than to the concave mirror 325, in particular in the first third of the axial distance between the folding mirrors and the concave mirror. In the region of the positive lens 326, the marginal ray height is small in comparison to the chief ray height, with the ratio of the marginal ray height to the chief ray height being approximately 0.3. The positive lens 326 is thus arranged close to the field both with respect to the first intermediate image 311 and with respect to the second intermediate image 321, and thus acts as a field lens for both intermediate images. The positive refractive power in the light path between the first intermediate image 311 and the concave mirror 325 ensures, inter alia, that the diameters of the subsequent lenses 327 and of the concave mirror 325 can be kept small. The positive refractive power in the light path from the concave mirror to the second intermediate image 321 and to the image plane results in a reduction in the incidence angle bandwidth of the radiation which also arrives at the second folding mirror 323 and can thus be coated with advantageous reflection layers, as well as for limiting the lens diameters in the refractive objective part 330 which is closest to the image field and is essentially responsible for production of the high image-side numerical aperture (NA=1.20) of the immersion projection objective.

The positive lens can be moved very close to the two intermediate images when required, without being impeded by the folding mirrors, so that a strong correction effect is possible. The positive refractive power which is arranged close to the field allows the horizontal arm to be longer. Because of the large aperture in the first intermediate image 311, the length of the horizontal arm would normally be shortened, so that the diameter of the concave mirror 325 and of the negative meniscus lenses in the negative group 327 which are arranged immediately upstream of it is linked to the color correction and should therefore not be indefinitely large. The inclusion of a positive lens group 326 close to the field also increases the refractive power of the negative lenses 327, owing to the compensation for the Petzval curvature (in comparison to the concave mirror), and thus increases the correction of the color longitudinal error for relatively small diameters in the area of the concave mirror. The catadioptric objective part can thus be designed to be compact and with relatively small lens dimensions, with adequate color correction.

The field lens 326 which is arranged in the immediate vicinity of two intermediate images 311, 321 also has major advantages with respect to optical correction, as will be explained in more detail in the following text. In principle, it is advantageous for the correction of imaging errors to have optical surfaces in the vicinity of intermediate images which are subject to major aberrations. The reason for this is as follows: at a long distance from the intermediate image, for example in the vicinity of the system diaphragm or its conjugate planes, all of the opening rays in a light beam have a finite and monotonally rising height with the pupil coordinate, that is to say an optical surface acts on all the opening rays. Opening beams which are located further outwards at the pupil edge also have an increasingly greater height on this surface (or more correctly: an increasing distance from the chief ray).

However, this is no longer the case in the vicinity of an intermediate image which is subject to severe aberrations. If one is, in fact, located within the caustic of the intermediate image, then it is possible for the surface to be located approximately in or close to the marginal ray image, that is to say effectively it does not act on the marginal rays, but has a considerable optical effect on the zone rays. It is thus possible, for example, to correct a zone error in the optical aberrations. This principle may be used, for example, in order to deliberately influence the spherical zone error.

The convex lens surface of the positive lens 326 which faces the intermediate images 311, 321 and is arranged in their immediate proximity is aspherically curved. In conjunction with the arrangement close to the field, this allows a very major corrective effect to be achieved.

At least the two to three lenses closest to the image can be manufactured from calcium fluoride, in order to avoid compaction problems. In order to compensate for intrinsic birefringence, the crystallographic major axes of the lenses can be rotated with respect to one another. The concave mirror 325 may also be in the form of an active mirror, in which the shape of the mirror surface can be varied by means of suitable manipulators. This can be used to compensate for various imaging errors. The beam path in the vicinity of at least one of the intermediate images is virtually telecentric.

Table 1 shows the specification of the design in tabular form. In this case, column 1 shows the number of the surface which is refractive, reflective or is distinguished in some other way, column 2 shows the radius r of the surface (in mm), column 3 shows the distance d between the surface and the subsequent surface (in mm), column 4 shows the material of a component, and column 5 shows the optically useable free diameters of the optical components (in mm). Reflective surfaces are annotated by "R" in column 1. Table 2 shows the corresponding aspherical data, with the arrow heights of the aspherical surfaces being calculated using the following rule:

$$p(h)=[((1/r)h^2/(1+SQRT(1-(1+K)(1/r)^2h^2))]+C1*h^4+C2*h^6+\ldots$$

In this case, the reciprocal (1/r) of the radius indicates the surface curvature at the surface apex, and h indicates the distance between the surface point and the optical axis. The arrow height is thus p(h), that is to say the distance between the surface point and the surface apex in the z direction, that is to say in the direction of the optical axis. The constants K, C1, C2, etc. are shown in Table 2.

The immersion objective 300 is designed for an operating wavelength of about 157 nm, at which the calcium fluoride which is used for all of the lenses has a refractive index of n=1.5593. This is matched to a perfluoropolyether (Fomblin®) which is used in vacuum technology, as an immersion medium for which $n_f$=1.37 at 157 nm, and has an image-side working distance of about 1.5 mm. The image-side numerical aperture NA is 1.2, and the imaging scale reduction factor is 4:1. The system is designed for an image field whose size is 26×5.0 mm², and it is double telecentric.

Figure 4:
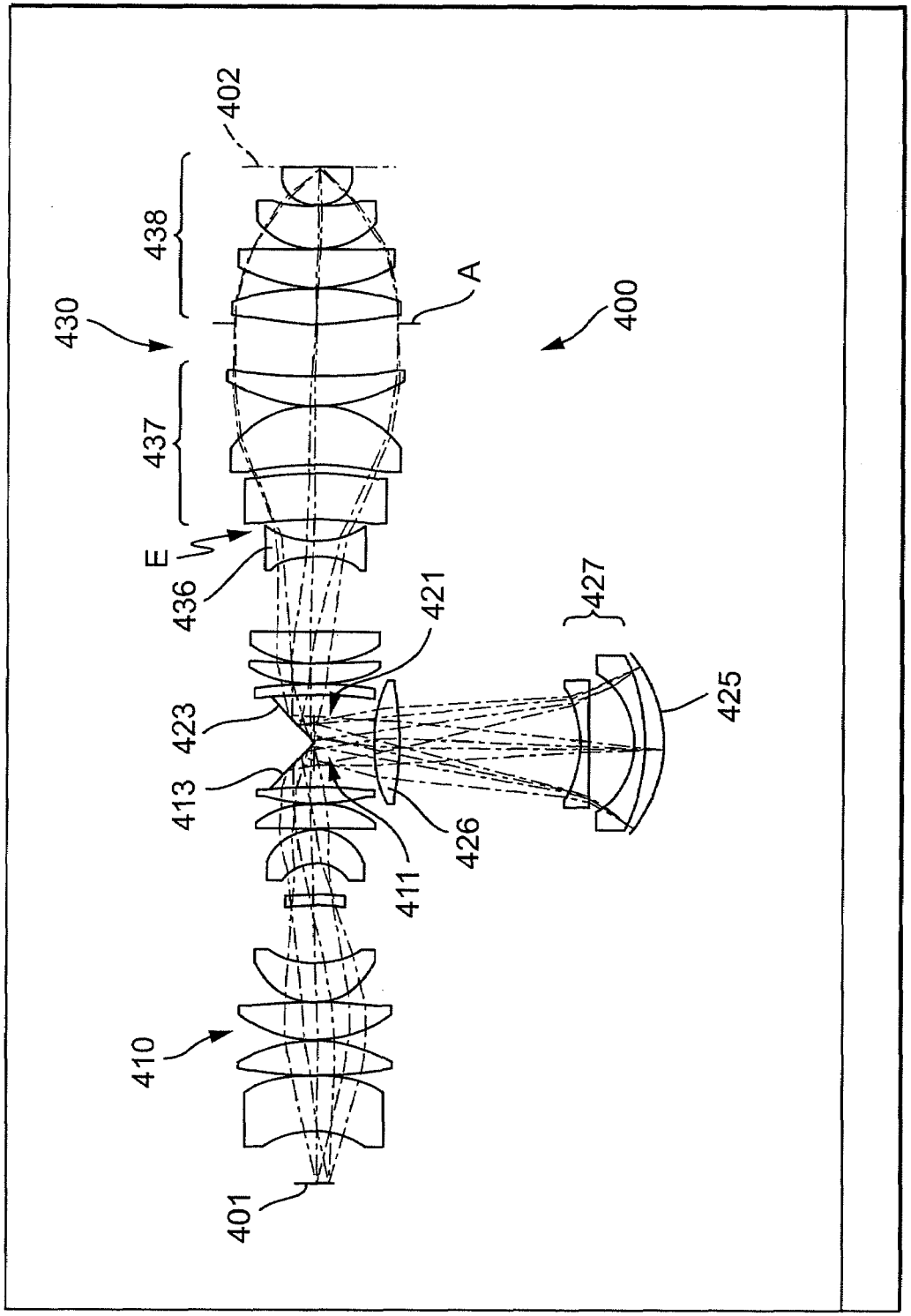
FIG. 4 shows a lens section through a second embodiment of a projection objective according to the invention.

FIG. 4 shows a lens section through a projection objective 400 which represents a variant of the embodiment shown in FIG. 3 and is likewise formed using the principles explained with reference to FIG. 2. Identical or corresponding elements or element groups are annotated with the same reference symbols as in FIG. 3, increased by 100. The specifications for this exemplary embodiment are shown in Tables 3 and 4.

In this embodiment as well, a biconvex positive lens 426 which is used as a field lens is arranged in the horizontal arm in the immediate optical vicinity of the intermediate images 411, 421 which are arranged between the folding mirrors 413, 423 and the concave mirror 425, thus resulting in the horizontal arm having small dimensions and on the other hand in a major corrective effect to the intermediate images.

A further special feature of this embodiment is the design of the third, refractive objective part 430, which has a particularly compact configuration, with small dimensions and a small maximum diameter. The basic design with an initial positive group 435, followed by the negative group 436 and two subsequent positive groups 437, 438 with an aperture diaphragm (aperture stop) A in between corresponds to the design shown in FIG. 3. The entry surface E of the third lens group 437 is located behind the biconcave negative lens 436, which is the only lens in the second lens group 436, in the area of maximum divergence of the beam diameter and in the area of a point of inflection of the marginal ray height. There are no negative lenses with a scattering effect that is significant for the optical design between this entry surface and the aperture diaphragm A, or between the aperture diaphragm and the image plane. In particular, only positive lenses are provided between the entry surface E and the image plane.

If there are no negative lenses with a significant refractive power in the region in which the beam diameter is relatively large then this allows the maximum diameters of the lenses to be limited to practicable sizes in this region. "Relatively large beam diameter" for the purposes of this application occur in particular when the marginal ray height on a lens is at least as large as half the marginal ray height at a potential diaphragm position, for example at the system diaphragm. This measure takes account of the fact that the scattering effect of a negative lens may admittedly be desirable for correction reasons, but that any scattering effect downstream from the negative lens has a tendency to lead to larger lens diameters than will be necessary in the absence of a negative lens. Furthermore, the rays of the beam are joined together in the direction of the downstream image plane, and positive refractive power is required for this purpose. The positive lenses which are required for this purpose may overall be designed relatively moderately provided that there is also no need to compensate for the scattering effect of negative lenses in the combination of the beams. Furthermore, the number of lenses may be limited. The invention thus allows compact projection objectives with minimal lens dimensions.

Figure 5:
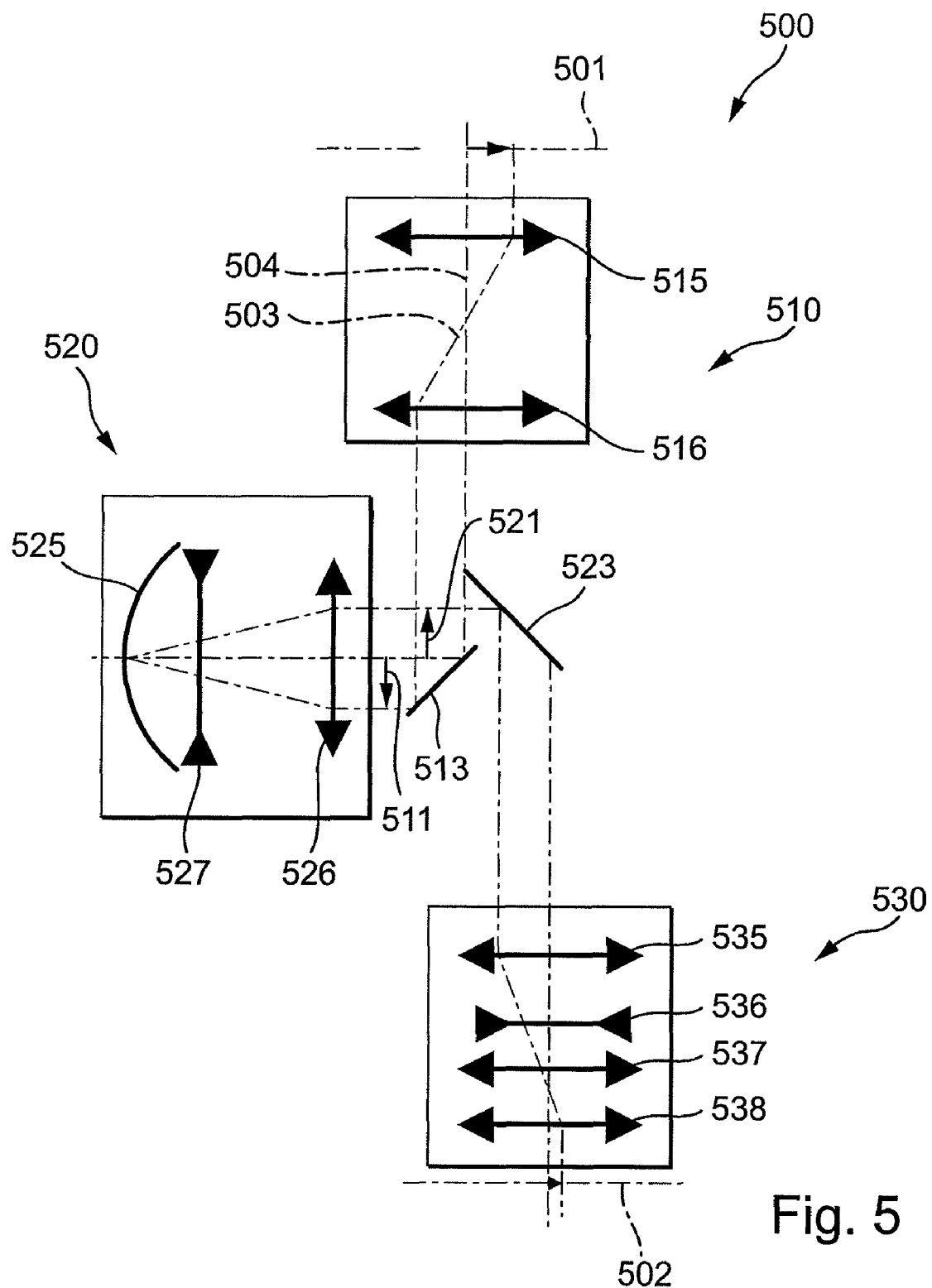
FIG. 5 shows a schematic illustration of the design of one embodiment of a projection objective according to the invention, with a different folding geometry and a crossed beam path.

FIG. 5 shows one embodiment of a projection objective 500 which, from the optical point of view, is designed on the basis of the principles explained with reference to FIG. 2. Identical or corresponding elements or element groups are annotated with the same reference symbols as in FIG. 2, increased by 300.

A comparison between the beam profiles in the systems shown in FIG. 2 and FIG. 5 shows that different beam paths are possible within the scope of the invention. An uncrossed beam path is shown in the system in FIG. 2, since a first beam section which runs from the object plane to the concave mirror 225 and a second beam section which runs from this concave mirror to the image plane do not intersect anywhere. The embodiment shown in FIG. 5, in contrast, has a crossed-over beam path. The first folding mirror 513 is arranged on the side of the optical axis 504 facing away from the second folding mirror 523, with the second folding mirror being geometrically located closer to the object plane. In consequence, a first beam section 540 which runs from the object plane 501 to the concave mirror 525 and a second beam section 550 which runs from the concave mirror 525 via the second folding mirror 523 to the image plane cross over in the region immediately upstream of the mirror surface of the second folding mirror 523, in the vicinity of the intermediate images 511, 521. In this case, the second intermediate image 521 is located optically immediately before the second folding mirror 523, and geometrically in the vicinity of an inner mirror edge 528, which faces the optical axis 504, of the first folding mirror. This crossed beam path, in which the radiation is "forced by" the first folding mirror without any vignetting in the direction of the second folding mirror, in the region of the inner mirror edge 528, allows optimization of the light conductance value of the system. It also provides more physical space for the two folding mirrors.

In this embodiment as well, the positive field lens group 526 is located in the optical vicinity of both intermediate images, geometrically between the folding mirrors and the concave mirror, although the second folding mirror and the second intermediate image are somewhat further away from the positive lens 526.

Figure 6:
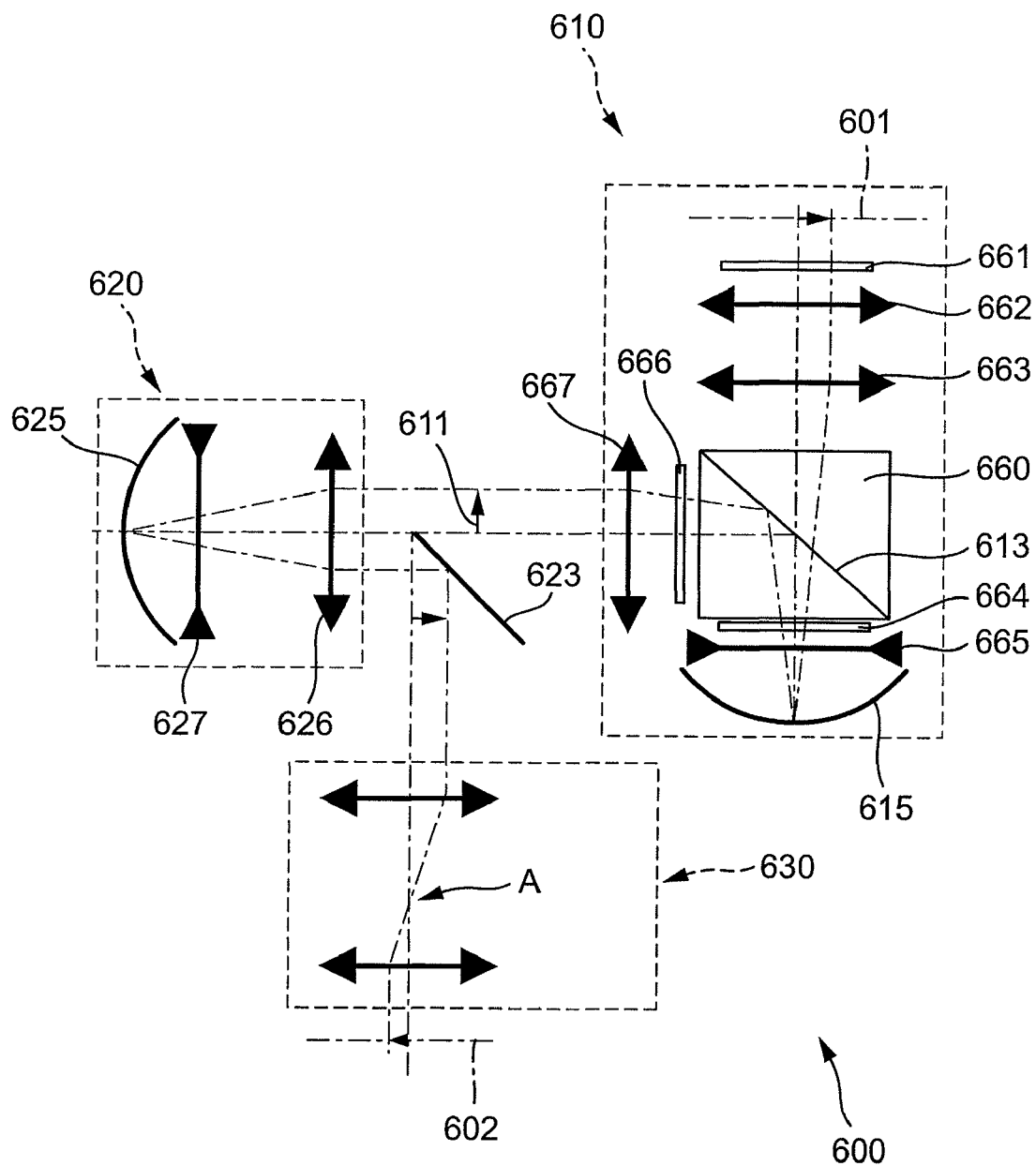
FIG. 6 shows a schematic illustration of one embodiment of a projection objective according to the invention, with a catadioptric first objective part, a catadioptric second objective part and a refractive third objective part.

One embodiment of a projection objective 600 will be explained with reference to FIG. 6, in which a pattern which is arranged on its object plane 601 is imaged on an image plane 602 aligned parallel to the object plane, generating two real intermediate images 611, 621. The projection objective has a first, catadioptric objective part 610 which produces a first real intermediate image 611 of the object field, a subsequent, catadioptric second objective part 620, which images the first intermediate image to form a second real intermediate image 621, and a subsequent third, refractive objective part, which images the second intermediate image 621 directly, that is to say without any further intermediate image, on the image plane 602.

One major difference from the embodiments described so far is that the first objective part 610 is a compact catadioptric subsystem. The catadioptric objective part 610 has a concave mirror 615 whose optical axis is at right angles to the object plane, and a polarization-selective beam splitter 660 (Beamsplitter Cube, BSC) which is arranged between the object plane and the concave mirror and has a planar beam splitter surface 613 which is inclined at 45° to the optical axis 604 and is used as a first folding mirror for the projection objective 610. A λ/4 plate 661, a first positive group 662, a second positive group 663, the beam splitter 660, a further λ/4 plate 664 and a negative group 665 arranged immediately in front of the concave mirror are arranged in this sequence between the object plane and the concave mirror. This is followed by a further λ/4 plate 666 and a positive group 667 in the beam path downstream from the folding mirror 613. The basic configuration of the second, catadioptric objective part 620 with a positive group 626 close to the field corresponds essentially to the basic design shown in FIG. 2. The third, refractive objective part has only positive groups between which a diaphragm position is located.

In this exemplary embodiment, folding thus takes place within the first, catadioptric objective part, with positive refractive power in the form of at least one positive lens 667 being arranged between the folding mirror 613, which is responsible for this, and the first intermediate image 611, which is produced by the first subsystem. The overall system is operated with circularly polarized input light, which is converted by the first λ/4 plate to linear-polarized radiation, which is p-polarized with respect to the obliquely positioned beam splitter layer 613 and thus essentially completely passes through it to the concave mirror 650. The λ/4 plate which is arranged between the beam splitter layer and the concave mirror is passed through twice by the linear-polarized radiation and in the process rotates the polarization preferred direction through 90° such that the radiation arriving from the concave mirror at the polarization splitter layer 613 is s-polarized with respect to this, and is reflected in the direction of the subsequent objective parts. The third λ/4 plate 666 converts the radiation to circularly polarized radiation, which then passes through the subsequent subsystems.

Since the first, catadioptric objective part 610 can be designed such that, in conjunction with the mirror curvature and the negative refractive power upstream of the mirror, it can largely or completely correct both the image field curvature and the chromatic longitudinal aberration, the subsequent partial objectives are not loaded, or are only slightly loaded, by these imaging errors. Furthermore, this arrangement allows the physical space between the object plane and the horizontally aligned, catadioptric objective part 620 to be enlarged, which can be used in order to reduce the light conductance value.

The aperture diaphragm A is preferably arranged in the third objective part 630, which is closest to the image, where the chief ray intersects the optical axis. Two further possible diaphragm positions are shown in the first and second objective part, in each case close to the concave mirrors 615, 625.

Figure 7:
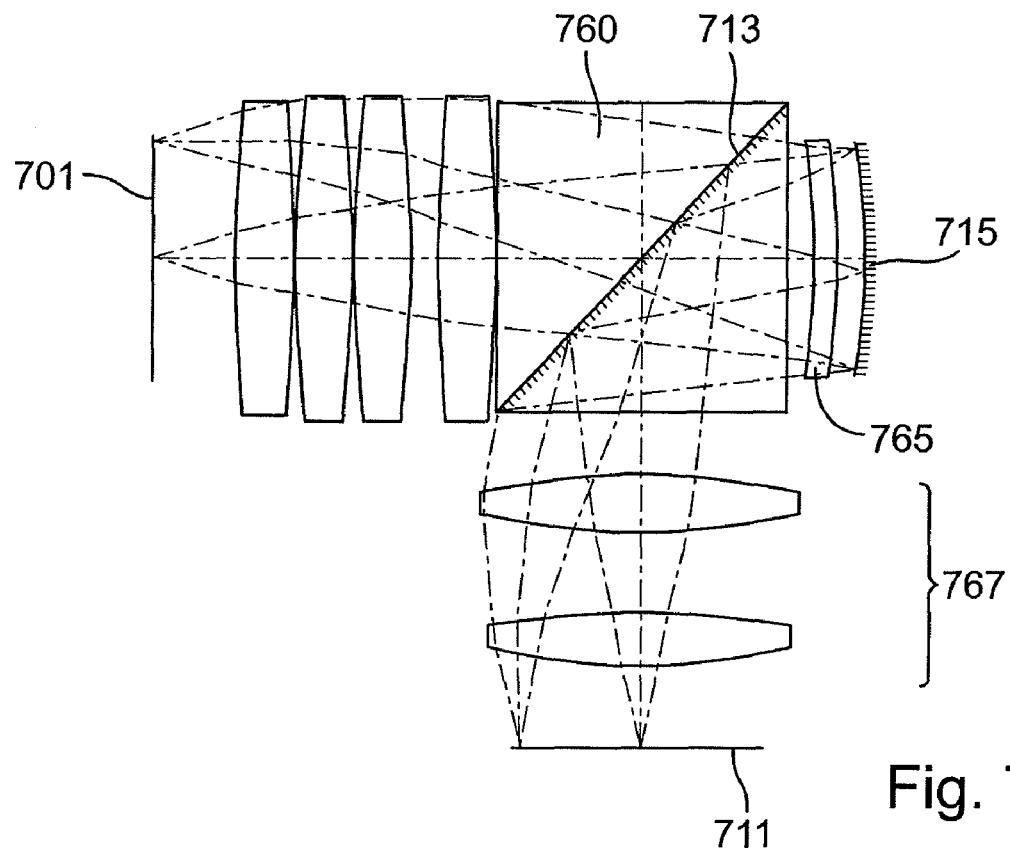
FIG. 7 shows a lens section for one embodiment of a catadioptric first objective part with a physical beam splitter, which can be used for the design shown in FIG. 6.
Figure 8A:
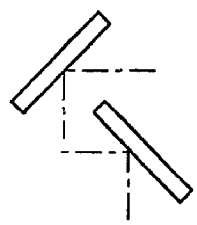
FIG. 8 shows various mirror arrangements for folding mirrors for projection objectives according to the invention.
Figure 8B:
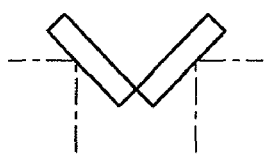
Figure 8C:
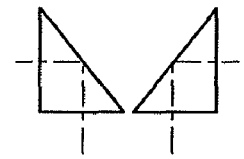
Figure 8D:
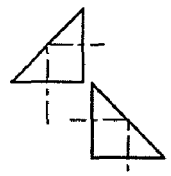
Figure 8E:
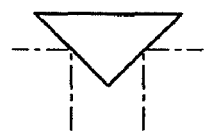

The first objective part may be physically compact. FIG. 7 shows an embodiment of a catadioptric subsystem which can be used as the first objective part 610 for the system shown in FIG. 6, and whose specification is shown in Table 5. Identical or corresponding elements or element groups are annotated with the same reference symbols as in FIG. 6, increased by 100. All the lenses are spherical, and all the transparent components including the beam splitter block 760 are composed of synthetic quartz glass.

FIG. 8 shows various implementation options, schematically, for the folding mirrors which are provided for folding the beam path. The folding mirrors may, for example, be in the form of free-standing planar mirrors, in particular as front surface mirrors (FIGS. 8(*a*) and (*b*)). In this case, in the embodiments shown in FIG. 2, separate mirrors as shown in FIG. 8(*b*) can be held jointly, as well. The folding mirrors may also be in the form of free-standing prisms, as shown in FIGS. 8(*c*) and (*d*). The reflective prism surfaces may, if required, act as total internal reflection surfaces depending on the incidence angles that occur on them, or may have a reflection coating. In particular for the embodiments shown in FIGS. 2 to 4, the mirrors may also be in the form of reflective outer surfaces of a mirror prism as shown in FIG. 8 (*e*).

Figure 9:
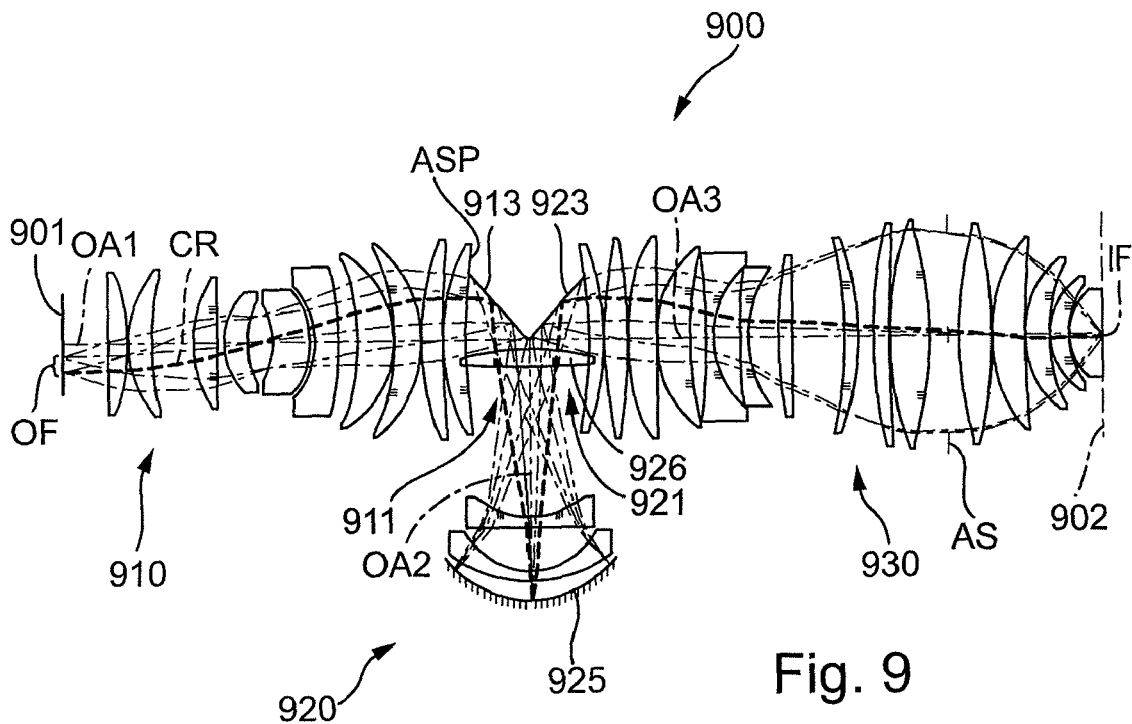
FIG. 9 shows a lens section for an embodiment having coaxial first and third objective parts.

In FIG. 9 a further embodiment of a projection objective 900 having R-C-R-type as explained in connection with FIG. 2 is shown. Reference is made to that description for the basic construction. A first, refractive objective part 910 is designed to image an off-axis effective object field OF arranged in the object surface 901 onto a first intermediate image 911. A first planar folding mirror 913 is arranged within the first objective part immediately upstream of the first intermediate image. A second, catadioptric objective part 920 including a concave mirror 925 is designed for imaging the first intermediate image into a second intermediate image 921 positioned immediately upstream of a second folding mirror 923 at a distance therefrom. A third, refractive objective part 930 including a freely accessible aperture stop AS is designed to image the second intermediate image onto the image surface 902, where an effective image field IF arranged outside the optical axis is created. The first objective part 910 serves as a relay system to place the first intermediate image close to the first folding mirror 913. The catadioptric second objective part 920 includes a single positive lens (field lens 926) geometrically close to the folding mirrors and optically close to both intermediate images, thereby allowing efficient correction of field related imaging errors. The third objective part serves as a focussing lens group providing the major part of the reduction ratio of the projection objective to obtain the image side numerical aperture, which is NA=1.20 in this embodiment at a field size of 26 mm ~5.5 mm of the effective object field OF. The overall track length (axial distance between object surface 901 and image surface 902) is 1400 mm. The wavefront aberration is about 4 mλ rms. The specification is given in tables 9, 9A. The chief ray CR of the imaging is drawn bold to facilitate following trajectory of the chief ray.

The lenses of the first objective part 910 define a first part OA1 of the optical axis, which is the axis of rotational symmetry of the lenses and is perpendicular to the object surface 901. The axis of rotational symmetry of the concave mirror 925 and the lenses of the second objective part define a second part OA2 of the optical axis which, in this embodiment, is aligned perpendicular to the object side first part OA1 of the optical axis. With other words, the optical axis is folded by the first folding mirror 913 at 90°. The lenses of the third objective part 930 define a third part OA3 of the optical axis, which is parallel to the first part OA1 of the optical axis and perpendicular to the image surface 902. In this embodiment, the object-side first part OA1 of the optical axis and the image-side third part OA3 of the optical axis are coaxial such that no lateral axis offset exists between these parts of the optical axis. This construction may be desirable with regard to mounting of the lenses of the refractive objective parts. A similar construction with coaxial first and third parts OA1, OA3 of the optical axis is shown as projection objective 1000 in FIG. 10. The specification of that design is given in table 10, 10A. In both embodiments a finite value for the object-image-shift OIS exists.

In the projection objective 900 the lens surface ASP immediately upstream of the first folding mirror 913 is an aspheric surface, which is optically close to the first intermediate image. Efficient correction of field related imaging errors are obtained. In the projection objective 1000 the field lens 1026 has an aspheric lens surface ASP facing the concave mirror. This aspheric surface is the lens surface closest to both the first and second intermediate image 1011, 1021 and therefore very effective for correction at two positions along the beam path. The wave front aberration of this design is about 3 mλ rms.

Figure 11:
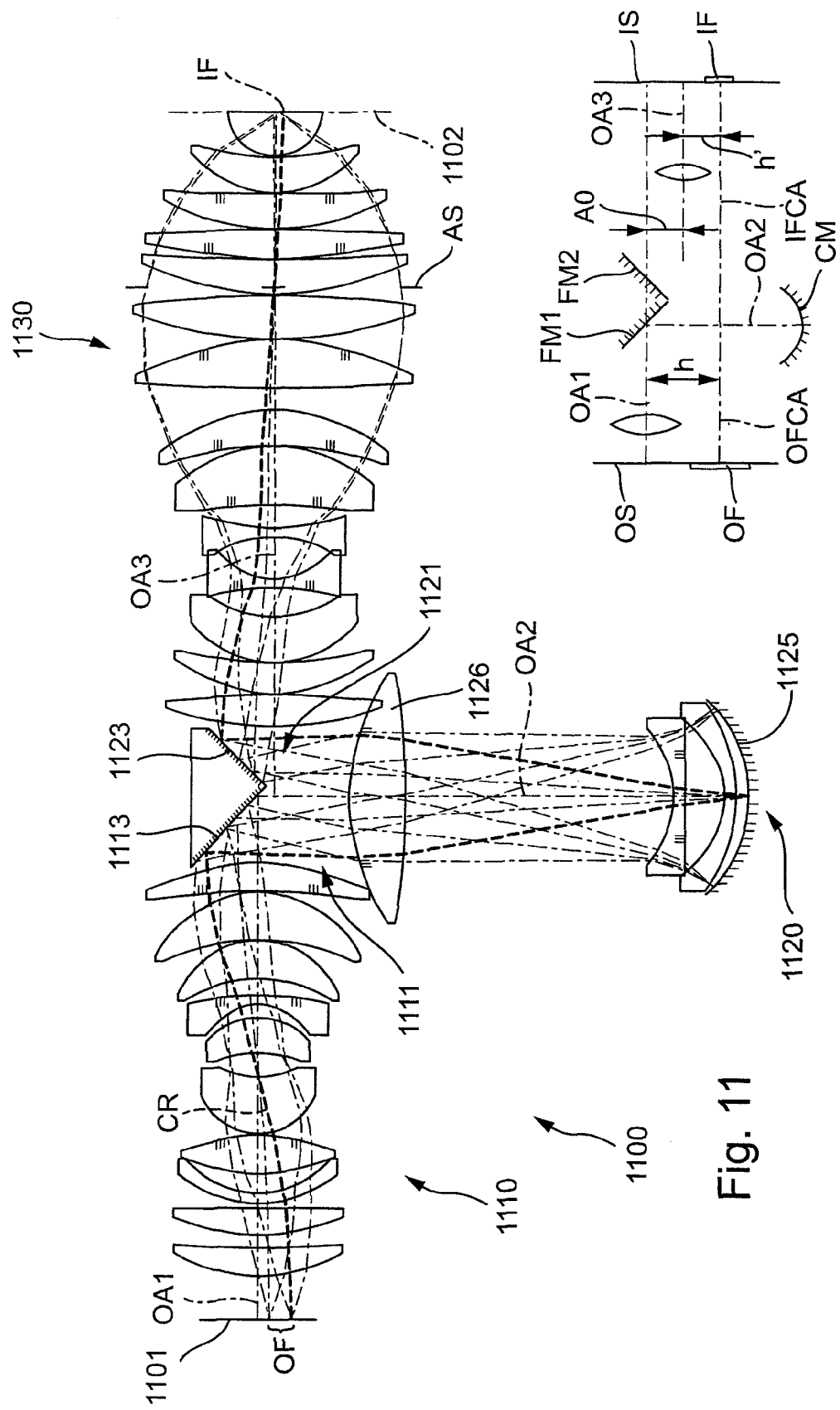
FIG. 11 shows a lens section through an embodiment having laterally offset first and third objective parts such that there is no object-image-shift (OIS), where FIG. 11' illustrates the conditions therefore.

The embodiment of a projection objective 1100 shown in FIG. 11 (specification in tables 11, 11A) is an example to demonstrate that practical advantages can be obtained in preferred embodiments if a lateral axis offset AO between the first part OA1 of the optical axis on the object side and a third part OA3 of the optical axis on the image side is adjusted appropriately. In order to facilitate understanding of the terms used in the following, FIG. 11' shows a schematic drawing where important features and parameters are shown.

From an optical point of view, an off-axis effective object field OF is imaged by the first objective part 1110 into a first intermediate image 1111 arranged between a first folding mirror 1113 and a positive field lens 1126 of the second objective part 1120. The second objective part includes the concave mirror 1125 and is designed as an imaging subsystem to create a second intermediate image 1121 positioned between positive lens 1126 and a second folding mirror 1123. The third objective part 1130 serves as a focussing group to generate the off-axis effective image field IF at a very high image-side numerical aperture NA, wherein here NA=1.30.

Figure 10:
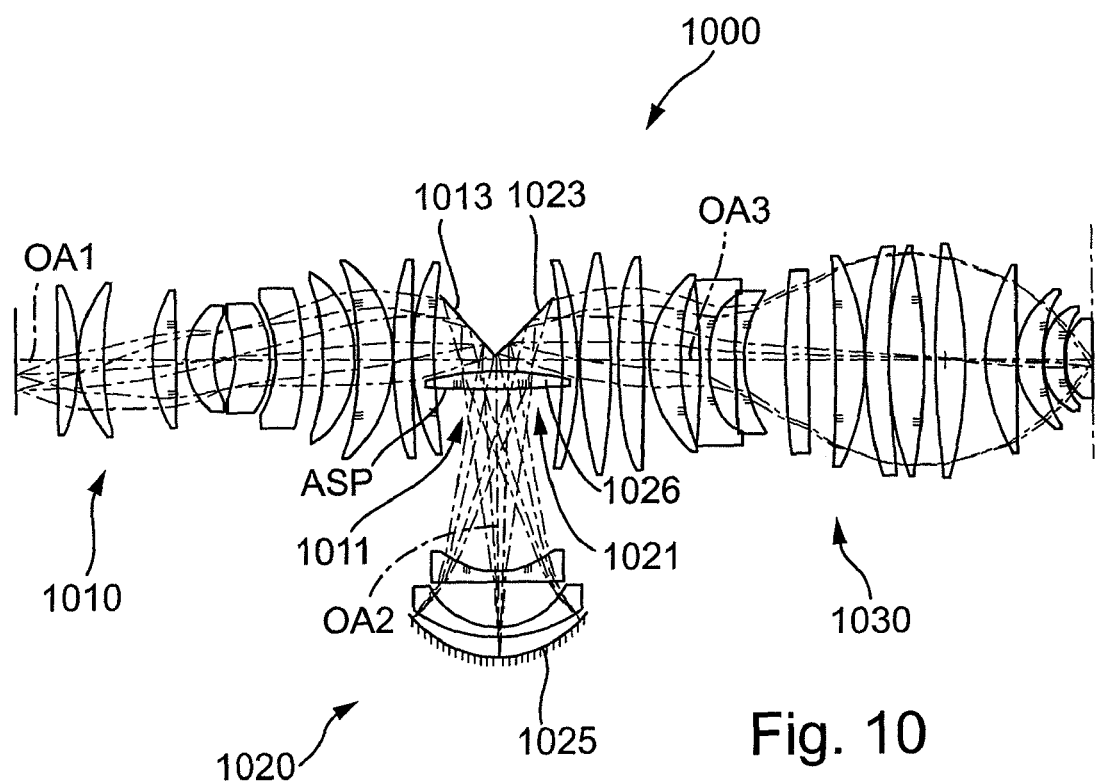
FIG. 10 shows a lens section for another embodiment having coaxial first and third objective parts.

In contradistinction to the embodiments of FIGS. 9 and 10 the folding prism forming with perpendicular planar faces the first and second folding mirrors is used asymmetrically, whereby a lateral axis offset AO is obtained between the first part OA1 of the optical axis on the object side and the third part OA3 of the optical axis on the image side (see FIG. 11'). In this particular embodiment the axis offset AO is set in such a way that an object field center axis OFCA running parallel to the first part OA1 of the optical axis through the object field center and an image field center axis IFCA running through the center of the image field IF and parallel to the third part OA3 of the optical axis coincide (are coaxial). With other words, there is no object-image-shift (OIS) between the centers of the effective object field OF and image field IF. This property is usually not obtained in catadioptric projection objectives with off-axis object field, but only in projection objectives having an effective object field centered around the optical axis (e.g. purely refractive objectives or catadioptric objectives having a physical beam splitter or objectives with pupil obscuration). As evident from FIG. 11' the amount of lateral axis offset AO is to be set such that the sum of the lateral axis offset AO and an image field center height h' is equal to the object field center height h if OIS=0 is desired. In that case:

$$|AO|=|h*(1+|\beta|)|$$

Figure 12:
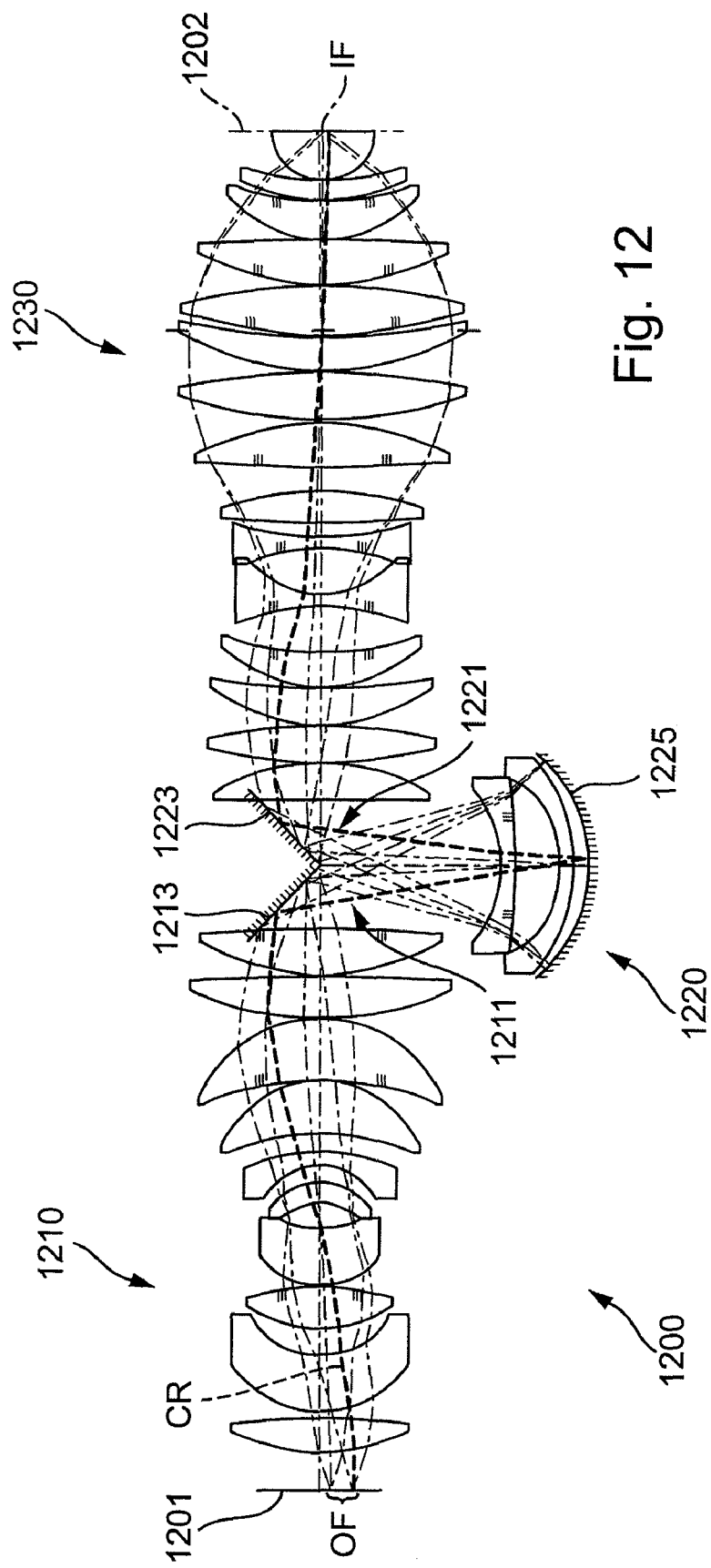
FIG. 12 shows a lens section through a reference system having no field lens.

Another beneficial aspect of preferred embodiments of the invention relates to an appropriate selection of positive refractive power for the field lens. As will be demonstrated exemplarily in the following, a proper selection of refractive power allows to manufacture projection objectives with very high image side numerical apertures, such as NA=1.3 or NA=1.35, while maintaining a maximum size of lenses upstream and/or downstream of the folding mirrors and the overall track length of the projection objective moderate. For demonstration purposes, FIG. 12 shows a variant of a prior art projection objective of type R-C-R as shown in WO 2004/019128 having an image side numerical aperture NA=1.25 and 1250 mm track length, which is smaller than the track length of the related prior art objective (1400 mm, FIG. 19 in WO 2004/019128 A1). There is no field lens geometrically between the folding mirrors and the concave mirror.

Figure 13:
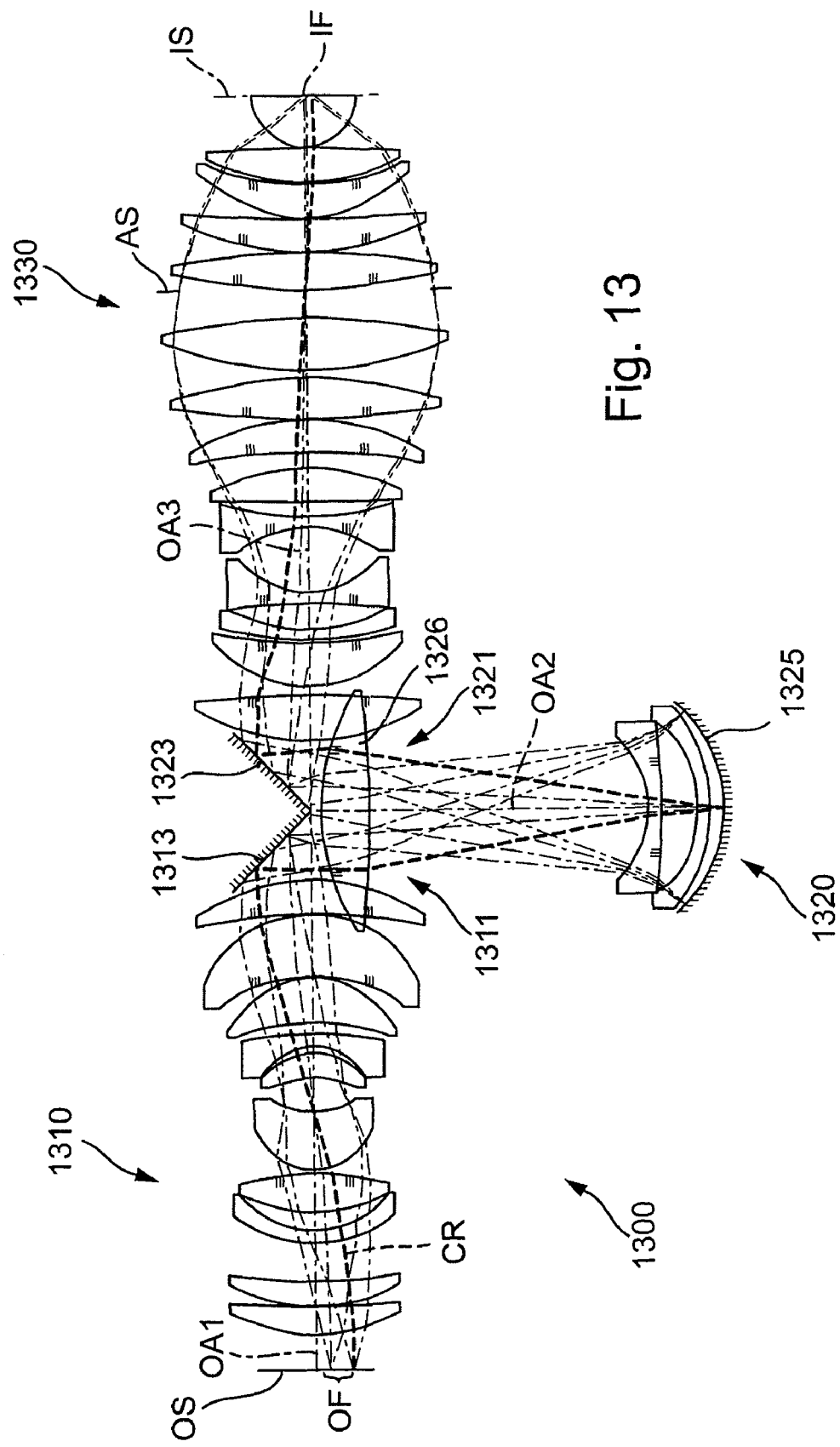
FIG. 13 shows a lens section through an embodiment having an essentially telecentric chief ray at the folding mirrors.

For comparison, FIG. 13 shows a projection objective 1300 as an embodiment of the invention, having the same numerical aperture (NA=1.25) and track length (1250 mm), where a positive field lens 1326 is positioned geometrically between the folding mirrors 1313, 1323 and the concave mirror 1325. To facilitate comparison, schematic FIG. 14 shows a prior art system without field lens in (a) and an embodiment of the invention including a field lens FL in (b). The trajectory of a chief ray CR is drawn and bold in FIGS. 12 and 13 and also outlined in FIG. 14 where, in addition, the trajectory of a marginal ray MR is shown.

Figure 14B:
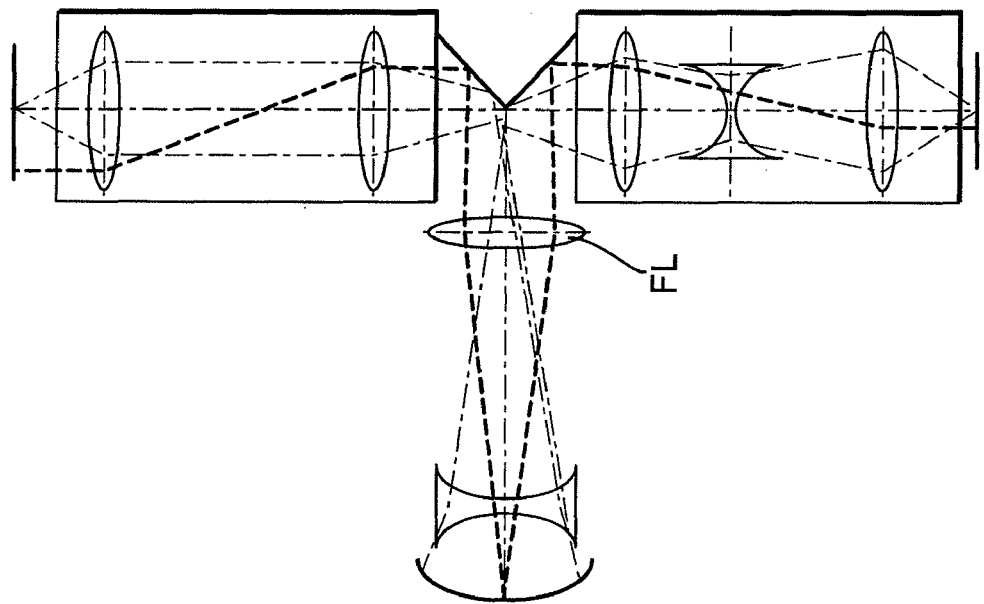
FIG. 14 shows schematic drawings illustrating the trajectories of the chief ray in a conventional system (a) and according to embodiments having an essentially telecentric chief ray at the folding mirrors (b)
Figure 14A:
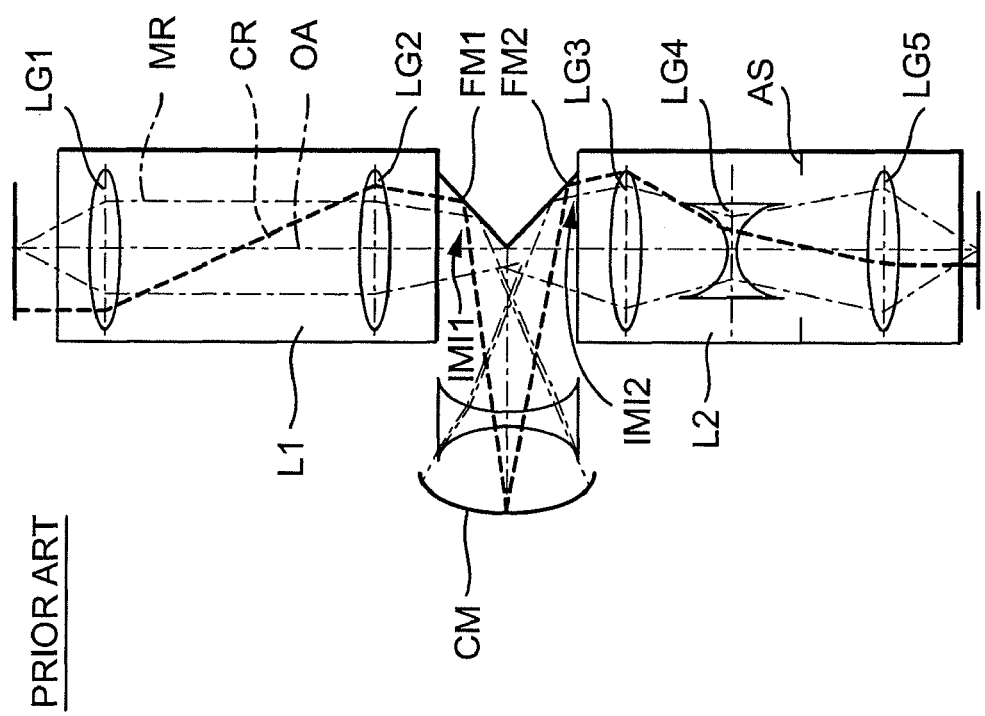

Next, some characteristic features of prior art systems related to the embodiment of FIG. 12 are summarized using the reference identifications of FIG. 14(a). The first objective part is a refractive relay group L1 designed to create the first intermediate image IMI1 close to the first folding mirror FM1 of the folding prism. An axially compact (short) catadioptric second objective part including the concave mirror CM creates the second intermediate image IMI2 close to the second folding mirror FM2. A purely refractive main focussing group L2 formed by the third objective part forms the image.

The first objective part is subdivided into a first lens group LG1 and a second lens group LG2 (each positive refractive power), a pupil surface being positioned between these lens groups where the chief ray CR intersects the optical axis OA. The third objective part includes, in that sequence, a third lens group LG3 with positive refractive power, a fourth lens group LG4 with negative refractive power, and a fifth lens group LG5 with positive refractive power. An image side pupil surface is positioned in the third objective part where the chief ray crosses the optical axis. An aperture stop AS is usually positioned at this position. A pupil surface optically between the first and second intermediate image is positioned close to or at the concave mirror CM.

Alternatively an aperture stop may also be positioned in one of the other pupil surfaces, namely in the refractive relay group L1 or in the catadioptric group, close to the concave mirror.

The chief ray CR is convergent at the first intermediate image IMI1 and the first folding mirror optically close to that intermediate image. Here, a convergent chief ray is a chief ray where the chief ray height CRH, i.e. the radial distance between the chief ray and the optical axis, is decreasing in light propergation direction. On the other hand, the chief ray is divergent (i.e. chief ray height increasing in light propergation direction) at the second intermediate image IMI2 and the second folding mirror.

Due to the folding geometry having the intermediate images between the folding mirrors and the concave mirror, the lenses of the second lens group LG2 and the third lens group LG3 closest to the first intermediate image and the second intermediate image, respectively, are optically relatively far away from the intermediate images since the folding mirror is placed between these lenses and the intermediate images. As a consequence of the convergence/divergence of the chief ray these lenses closest to the folding mirrors have a tendency to become large (large lens diameter). Note that this effect may be weaker if a larger distance is set between the concave mirror and the folding mirrors, thereby forming a longer horizontal arm (HOA) of the objective.

Given these conditions, there is a tendency for the horizontal optical axis to become shorter if the image side numerical aperture NA is to be increased. This can be understood as follows. The primary purpose of the concave mirror is to correct the Petzvalsum (image field curvature) of the projection objective. The contribution of the concave mirror for Petzval sum correction is directly proportional to the curvature of the concave mirror. If the numerical aperture of the system is to be increased and, at the same time, the length of the horizontal arm HOA would remain constant, the diameter of the catadioptric group including the concave mirror would be increased. One potential consequence is that the curvature of the concave mirror would become smaller, whereby the effect of the concave mirror on Petzval sum correction would decrease. This is considered less desirable since the Petzval sum correction must then be provided in other parts of the projection objective, thereby making the design more complicated.

On the other hand, if it desired to maintain the correcting effect of the catadioptric group on Petzval sum correction, the diameter of the catadioptric group including the concave mirror should be maintained essentially constant. This, however, corresponds to a decreasing length of the horizontal arm which, in turn, leads to relatively large chief ray angles at the intermediate images, as shown schematically in FIG. 14(a) and in the projection objective 1200 of FIG. 12.

It is evident from FIG. 12 that very large lens diameters are required particularly for the two or three positive lenses of the second lens group LG2 immediately upstream of the first folding mirror.

However, if it is desired to increase the numerical aperture, sufficient space for lenses must be provided in the third objective part, mainly in the vicinity of the closest pupil position next to the wafer. If it is further desired to limit the track length of the objective to reasonable values, it appears that it is desirable to design the first objective part (relay group L1) axially shorter and to decrease the diameters of the lenses immediately upstream of the first folding mirror.

These objects can be obtained by introducing a field lens having sufficient positive refractive power geometrically between the folding mirrors and the concave mirror optically close to the intermediate images, as shown schematically in FIG. 14(b) and exemplarily in embodiment 1300 of FIG. 13. As evident from FIG. 13, the positive refractive power provided by a lens 1326 allows to guide the chief ray CR almost parallel to the optical axis or slightly divergent onto the first folding mirror 1313, whereby the diameters of the two or three lenses immediately upstream of the first folding mirror can be substantially reduced when compared to the design of FIG. 12. Also, the first axial length AL1 of the first objective part 1310 is substantially reduced when compared to the corresponding length of the first objective part 1210 in FIG. 12. As a consequence, more space is available in the third objective part for introducing lenses contributing to an increase in numerical aperture. Also, the horizontal arm including the concave mirror is substantially longer and the concave mirror is substantially smaller when a field lens is introduced.

In the embodiment of FIG. 13, it is also evident that both the first and second intermediate image are positioned in a space between the field lens 1326 and the mirror group including the concave mirror 1325. Specifically, an axial distance between the intermediate images and the closest optical surface (lens surface of positive lens 1326 facing the concave mirror) is sufficiently large such that the closest optical surface lies outside an intermediate image space defined axially between the paraxial intermediate image (intermediate image formed by paraxial rays) and the marginal ray intermediate image (formed by marginal rays of the imaging). A minimum distance of at least 10 mm is obtained here. The field lens is effective as a last lens of the first objective part 1310 and as a first lens of the third objective part 1330 (when viewed in light propagation direction at the intended use as reduction projection objective). Therefore, it is worth to note that FIG. 13 shows a projection objective having two refractive imaging subsystems (formed by the first objective part 1310 and the third objective part 1330), where a lens (the field lens 1326) is arranged optically within both the first and the third imaging subsystem. Also, each folding mirror is positioned inside a refractive imaging subsystem between lenses of the respective subsystem.

Figure 15:
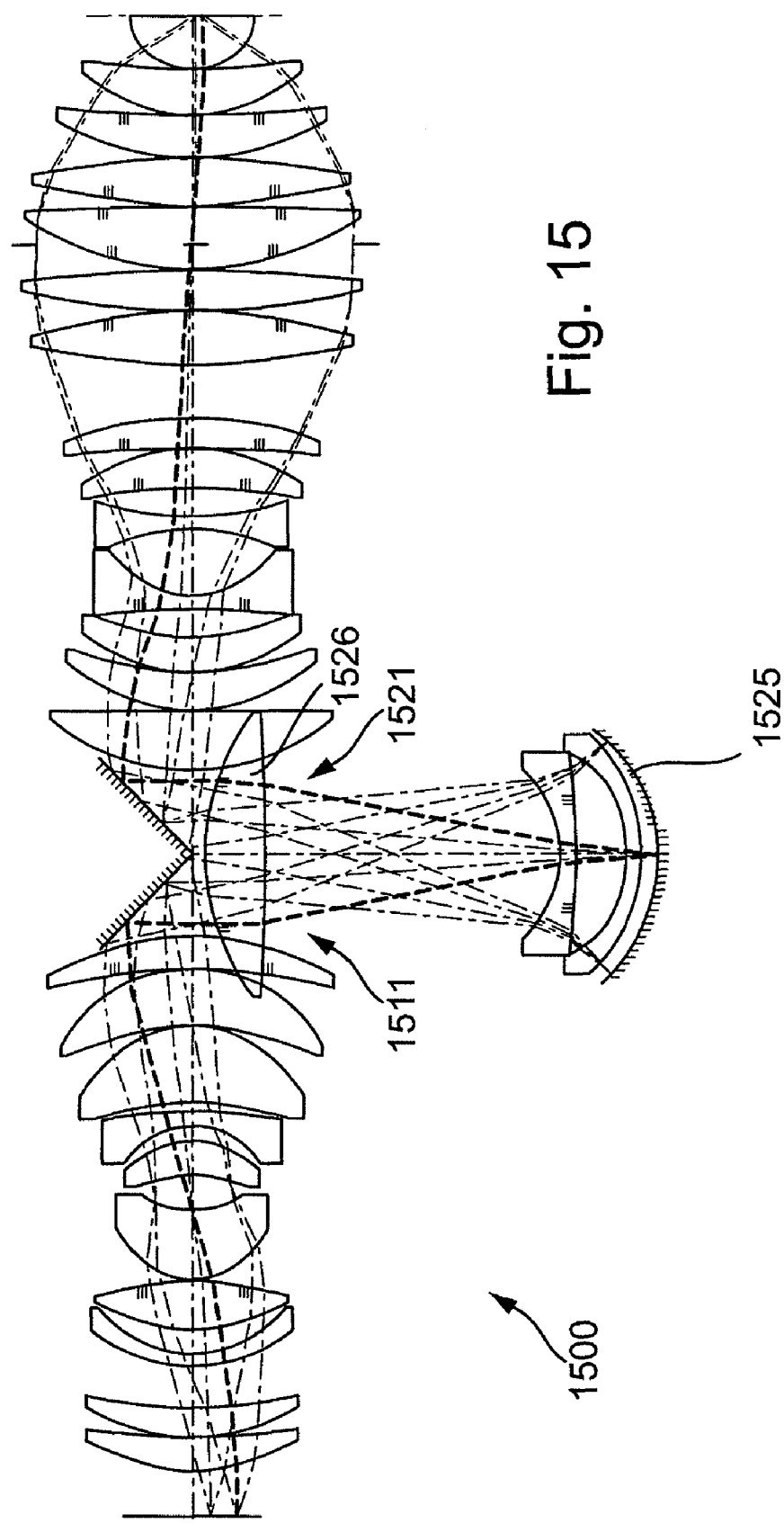
FIG. 15 shows a lens section through another embodiment having essentially telecentric chief rays at the folding mirrors and a field lens geometrically close to the folding mirrors, where the field lens is optically situated both in the first objective part and in the third objective part.
Figure 16:
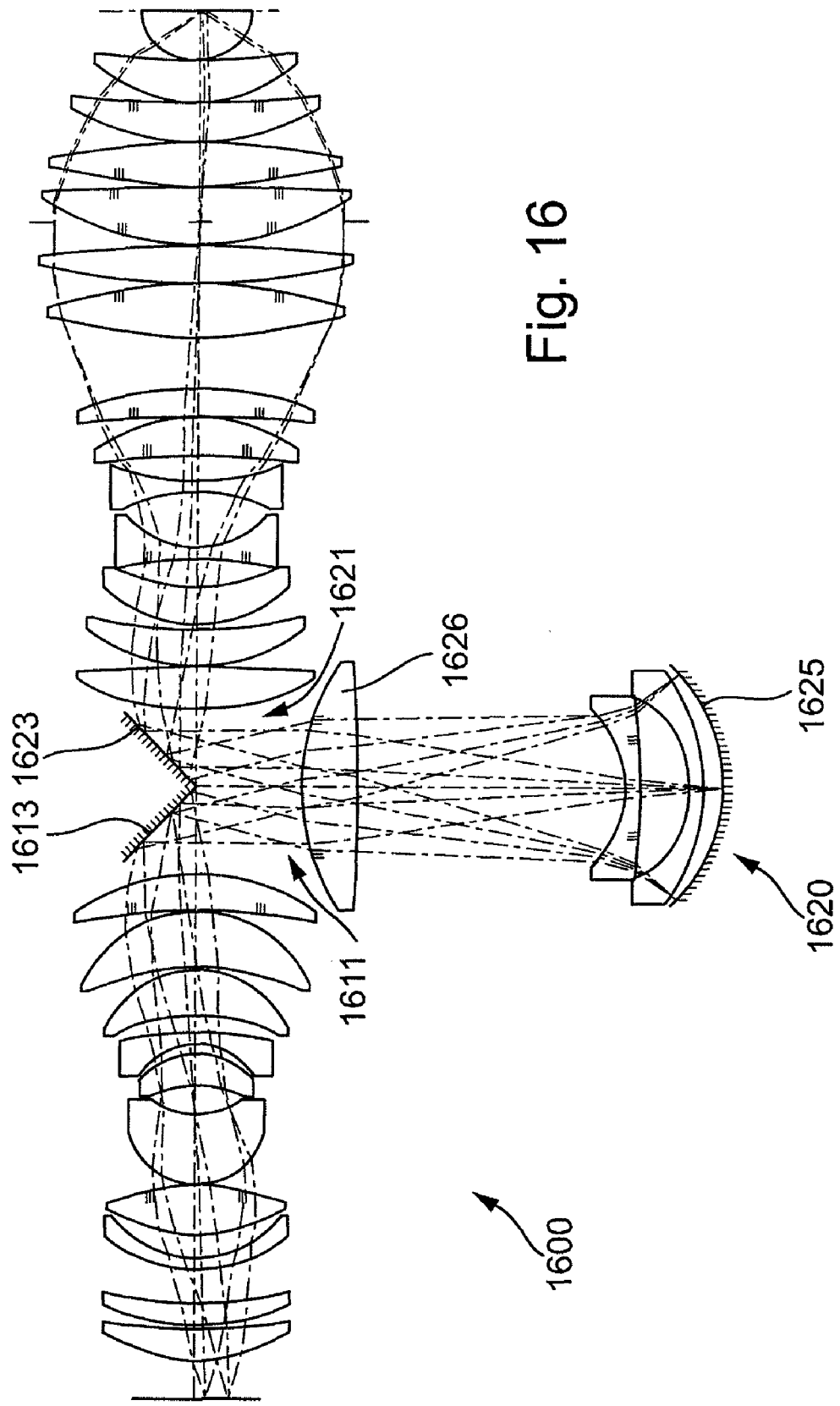
FIG. 16 shows a lens section of an embodiment having a field lens further apart from the folding mirrors optically within the catadioptric, second objective part and having NA=1.30.
Figure 17:
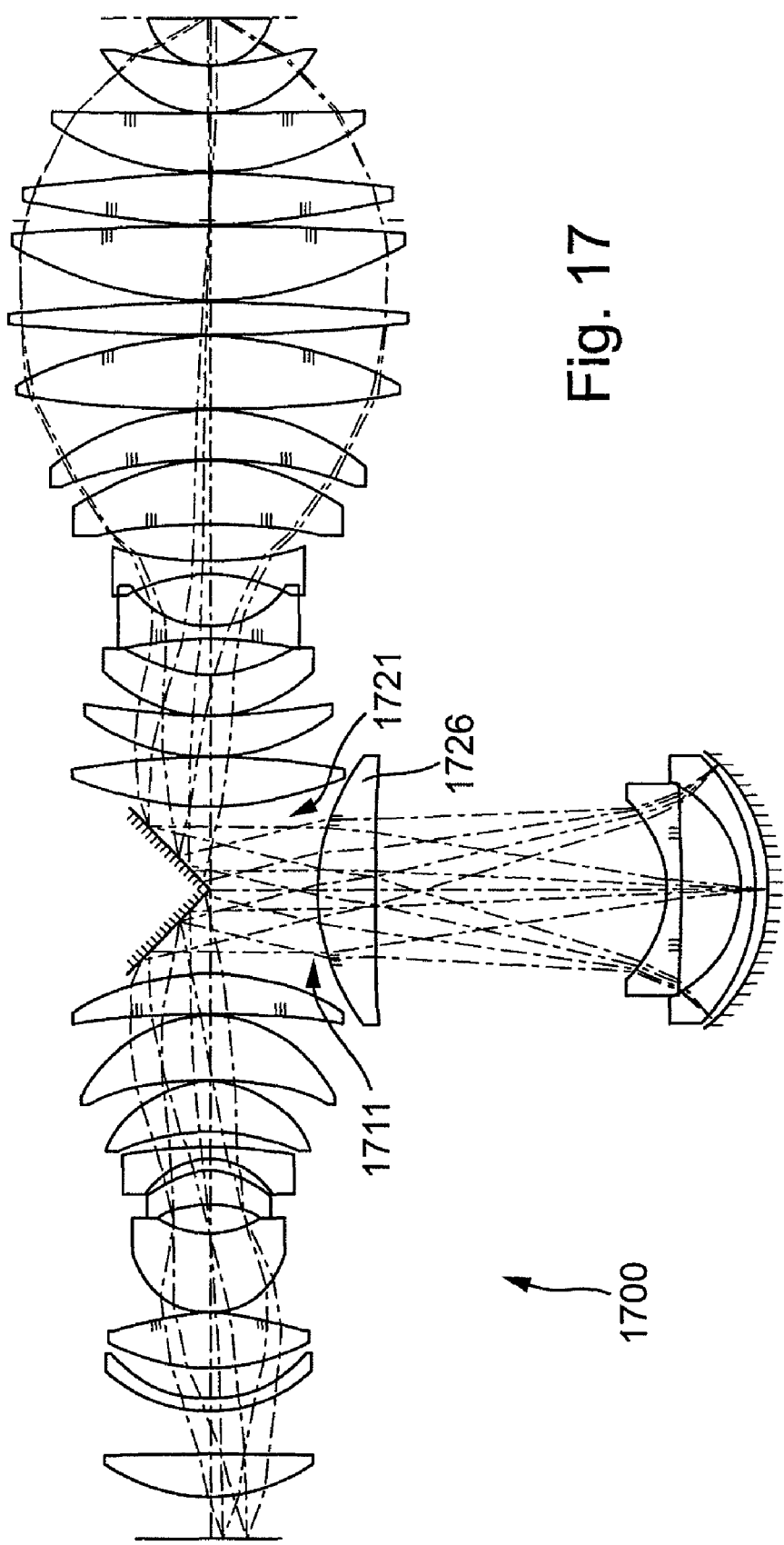
FIG. 17 shows a variant of the projection objective of FIG. 16 having NA=1.35.

The embodiments of the following FIGS. 15 to 17 (specifications in tables 15, 15A, 16, 16A and 17, 17A, respectively) are based on the embodiment of FIG. 13 and show exemplarily that a basic design having a field lens with sufficient refractive power allows to obtain even higher image side numerical apertures with moderate lens sizes. The specifications are given in tables 15, 15A, 16, 16A and 17, 17A, respectively.

An image side numerical aperture NA=1.30 is obtained for the projection objective 1500 in FIG. 15. Here, the chief ray CR is almost parallel to the optical axis at the first and second folding mirror. Specifically, a first chief ray direction cosine |CRA1|=0.055 is obtained at the first folding mirror and a second chief ray direction cosine CRA2=0.058 is obtained at the second folding mirror.

In the projection objectives 1300 and 1500, the positive field lens 1326, 1526 in the horizontal arm is arranged very close to the folding mirrors such that intermediate images follow within a space free of optical material between that field lens and the concave mirror. However, as evident from the intersecting lens symbols, one or more truncated lenses must be used close to the folding mirrors, which makes lens mounting more complicated.

Such mounting problem is avoided for the projection objective 1600 in FIG. 16, where the positive field lens 1626 is positioned far away from the folding mirrors 1613, 1623 mostly outside a cylindrical space defined between the lenses immediately upstream and down-stream of the folding mirrors. In this embodiment, circular lenses with a stable mounting technique can be used. From an optical point of view, the chief ray angles at the first and second folding mirrors are almost zero (essentially telecentric chief ray). As both intermediate images 1611 and 1621 are positioned essentially between the folding mirrors and the field lens 1626, the field lens is now part of the catadioptric second imaging objective part 1620 including the concave mirror 1625. In this variant, the installation space problem close to the folding mirror is avoided. An image side numerical aperture NA=1.30 is obtained.

The design type has potential for even higher numerical apertures, which is evident from projection objective 1700 shown in FIG. 17 having an image side numerical aperture NA=1.35. Like in the embodiment of FIG. 16, the chief ray is almost telecentric at the folding mirrors and the intermediate images 1711, 1721 are essentially positioned between the folding mirrors and the field lens 1726. The increase in numerical aperture with respect to the embodiment of FIG. 16 shows that in that embodiment sufficient space for further and/or stronger lenses is available in the third objective part responsible for providing the high numerical aperture.

As mentioned earlier, the invention allows to built catadioptric projection objectives with high numerical aperture, particularly allowing immersion lithography at numerical apertures NA>1, that can be built with relatively small amounts of optical material. The potential for small material consumption is demonstrated in the following considering parameters describing the fact that particularly compact projection objectives can be manufactured.

Generally, the dimensions of projection objectives tend to increase dramatically as the image side numerical aperture NA is increased. Empirically it has been found that the maximum lens diameter $D_{max}$ tends to increase stronger than linear with increase of NA according to $D_{max} \sim NA^k$, where k>1. A value k=2 is an approximation used for the purpose of this application. Further, it has been found that the maximum lens diameter $D_{max}$ increases in proportion to the image field size (represented by the image field height Y', where Y' is the maximum distance between an image field point and the optical axis). A linear dependency is assumed for the purpose of the application. Based on these considerations a first compactness parameter COMP1 is defined as:

$$COMP1 = D_{max}/(Y' \cdot NA^2).$$

It is evident that, for given values of image field height and numerical aperture, the first compaction parameter COMP1 should be as small as possible if a compact design is desired.

Considering the overall material consumption necessary for providing a projection objective, the absolute number of lenses, $N_L$ is also relevant. Typically, systems with a smaller number of lenses are preferred to systems with larger numbers of lenses. Therefore, a second compactness parameter COMP2 is defined as follows:

$$COMP2 = COMP1 \cdot N_L.$$

Again, small values for COMP2 are indicative of compact optical systems.

Further, projection objectives according to preferred embodiments of the invention have at least three objective parts for imaging an entry side field surface into an optically conjugate exit side field surface, where the imaging objective parts are concatenated at intermediate images. Typically, the number of lenses and the overall material necessary to build an projection objective will increase the higher the number $N_{OP}$ of imaging objective parts of the optical system is. It is desirable to keep the average number of lenses per objective part, $N_L/N_{OP}$, as small as possible. Therefore, a third compactness parameter COMP3 is defined as follows:

$$COMP3 = COMP1 \cdot N_L/N_{OP}.$$

Again, projection objectives with low optical material consumption will be characterized by small values of COMP3.

Table 18 summarizes the values necessary to calculate the compactness parameters COMP1, COMP2, COMP3 and the respective values for these parameters for each of the systems presented with a specification table (the table number (corresponding to the same number of a figure) is given in column 1 of table 18). Therefore, in order to obtain a compact catadioptric projection objective having at least one concave mirror and at least two imaging objective parts (i.e. at least one intermediate image) at least one of the following conditions (1) to (3) should be observed:

$$COMP1 < 11 \tag{1}$$

Preferably COMP1<10.7 should be observed.

$$COMP2 < 340 \tag{2}$$

Preferably COMP2<320, more preferably COMP2<300 should be observed.

$$COMP3 < 110 \tag{3}$$

Preferably COMP3<100 should be observed.

In some embodiments COMP1<11 and, at the same time, COMP2<340, which allows particularly compact designs.

Another aspect concerns the size of the concave mirror, which is particularly small in relation to the largest lenses in some embodiments, thereby facilitating manufacturing and mounting. In some embodiments the concave mirror has a mirror diameter $D_M$, the projection objective has a maximum lens diameter $D_{max}$, and the condition $D_M < 0.75 \cdot D_{max}$ holds. Preferably $D_M < 0.70 \cdot D_{max}$ may be fulfilled.

Table 18 shows that preferred embodiments according to the invention generally observe at least one of these conditions indicating that compact designs with moderate material consumption and/or small concave mirror are obtained according to the design rules laid out in this specification.

The invention has been described in detail using examples of R-C-R type catadioptric projection objectives having a first folding mirror for deflecting the radiation coming from the object plane in the direction of the concave mirror and a second folding mirror for deflecting the radiation coming from the concave mirror in the direction of the image plane. The invention can also be implemented in designs having different folding geometry, for example those where radiation coming from the object plane is directly directed at the concave mirror prior to a reflection on a first folding mirror arranged for deflecting the radiation coming from the concave mirror in the direction of the image plane. In those embodiments, a second folding mirror is usually provided downstream of the first folding mirror to allow a parallel arrangement of object plane and image plane.

It is self-evident that all of the systems described above may be complete systems, that is to say systems for forming a real image (for example on a wafer) of a real object (for example a photolithography mask). The systems may, however, also be used as subsystems for larger systems. For example, the "object" of one of the systems described above may thus be an image which is produced by an imaging system (for example a relay system) positioned upstream of the object plane. An image which is formed by one of the systems described above may likewise be used as an object for a system (for example a relay system) downstream from the image plane. The enumeration of the objective parts with the expressions "first objective part" and "second objective part" etc. relates to the sequence in which the beam passes through them when they are used as a reduction objective. The expressions "first" and "second" etc. should be understood as being relative to one another. The "first" objective part is arranged upstream of the "second" objective part in the direction in which the beam passes through them. This need not necessarily be the first objective part in the overall system, that is to say the objective part which immediately follows the image plane in the system. However, this is the case in the illustrated exemplary embodiments.

TABLE 1

| Surface | Radius | Distance | Material | ½ Diameter |
|---|---|---|---|---|
| 0 | 0.000000000 | 48.029632171 | AIR | 57.700 |
| 1 | 0.000000000 | 39.172776328 | AIR | 72.768 |
| 2 | −96.971407438 | 43.719958386 | CAF2 | 74.418 |
| 3 | −158.002766036 | 5.165244231 | AIR | 98.534 |
| 4 | 781.518257267 | 56.238731708 | CAF2 | 120.188 |
| 5 | −253.290501301 | 4.909571912 | AIR | 123.211 |
| 6 | 288.016848173 | 49.396794919 | CAF2 | 124.172 |
| 7 | −435.168087157 | 26.736905514 | AIR | 122.368 |
| 8 | 105.910945049 | 62.394238960 | CAF2 | 94.783 |
| 9 | 178.598362309 | 79.753912118 | AIR | 79.042 |
| 10 | −274.352911686 | 15.001130830 | CAF2 | 42.116 |
| 11 | −481.511902624 | 46.498544862 | AIR | 46.787 |
| 12 | −70.442117850 | 52.555341121 | CAF2 | 55.942 |
| 13 | −90.455727573 | 1.806830035 | AIR | 78.160 |
| 14 | 3232.255140950 | 36.176140320 | CAF2 | 91.116 |
| 15 | −186.488036306 | 1.000000000 | AIR | 92.734 |
| 16 | 365.731282758 | 20.809036457 | CAF2 | 90.268 |
| 17 | −2611.121142850 | 101.825417590 | AIR | 88.935 |
| 18 | 0.000000000 | 0.000000000 | AIR | 84.274 |
| 19 | 0.000000000 | 65.181628952 | AIR | 84.274 |
| 20 | 258.735107311 | 37.578859051 | CAF2 | 105.187 |
| 21 | −1152.159158690 | 288.921175238 | AIR | 104.969 |
| 22 | −129.279458408 | 15.003276235 | CAF2 | 81.991 |
| 23 | −2262.350961510 | 56.312694509 | AIR | 88.341 |
| 24 | −117.450410520 | 15.001009008 | CAF2 | 91.957 |
| 25 | −309.800170740 | 28.401147541 | AIR | 113.929 |
| 26 R | −175.988719829 | 0.000000000 | AIR | 117.602 |
| 27 R | 0.000000000 | 28.401147541 | AIR | 168.871 |
| 28 | 309.800170740 | 15.001009008 | CAF2 | 112.745 |
| 29 | 117.450410520 | 56.312694509 | AIR | 87.774 |
| 30 | 2262.350961510 | 15.003276235 | CAF2 | 78.116 |
| 31 | 129.279458408 | 288.921175238 | AIR | 70.315 |
| 32 | 1152.159158690 | 37.578859051 | CAF2 | 91.290 |
| 33 | −258.735107311 | 65.181629067 | AIR | 91.634 |
| 34 | 0.000000000 | 0.000000000 | AIR | 84.438 |
| 35 | 0.000000000 | 95.566202561 | AIR | 84.438 |
| 36 | −385.455042894 | 15.000000000 | CAF2 | 93.816 |
| 37 | −452.475904634 | 1.000000003 | AIR | 97.482 |
| 38 | 254.248242468 | 32.034900497 | CAF2 | 105.601 |
| 39 | 5899.473023640 | 1.000023801 | AIR | 105.353 |
| 40 | 190.848967014 | 30.278271846 | CAF2 | 104.456 |
| 41 | 621.351654529 | 138.920391104 | AIR | 102.039 |
| 42 | −123.640610032 | 33.881654714 | CAF2 | 76.579 |
| 43 | 158.155949669 | 49.867792861 | AIR | 80.512 |
| 44 | 412.757602931 | 47.829461944 | CAF2 | 98.825 |
| 45 | −208.949912656 | 17.094373280 | AIR | 103.896 |
| 46 | −158.641772839 | 15.212844332 | CAF2 | 105.038 |
| 47 | −313.678744542 | 1.052590482 | AIR | 118.827 |
| 48 | −829.528825093 | 55.527291516 | CAF2 | 125.550 |
| 49 | −184.492343437 | 11.796257723 | AIR | 129.573 |
| 50 | 260.696800337 | 37.374556186 | CAF2 | 132.314 |
| 51 | 497.808165974 | 65.844307831 | AIR | 127.088 |
| STO | 0.000000000 | 0.000000000 | AIR | 127.776 |
| 53 | 0.000000000 | −22.615444914 | AIR | 128.288 |
| 54 | 358.239917958 | 44.763751865 | CAF2 | 128.404 |
| 55 | −739.494996855 | 1.004833255 | AIR | 127.649 |
| 56 | 242.528908132 | 44.488018592 | CAF2 | 121.037 |
| 57 | 3949.584753010 | 1.000094237 | AIR | 116.970 |
| 58 | 201.527861764 | 58.711711773 | CAF2 | 103.897 |
| 59 | −1366.391075450 | 1.000007100 | AIR | 89.104 |
| 60 | 62.439639631 | 63.828426005 | CAF2 | 55.026 |
| 61 | 0.000000000 | 1.550000000 | IMM | 17.302 |
| 62 | 0.000000000 | 0.000000000 | AIR | 14.425 |

| | | | |
|---|---|---|---|
| NA = 1.2 | Y = 57.7 mm | | |
| WL | 157.2852 | 157.2862 | 157.2842 |
| CAF2 | 1.55930394 | 1.55930133 | 1.55930655 |
| IMM | 1.37021435 | 1.37021206 | 1.37021665 |

TABLE 2

Aspherical constant

| Surface No. 2 | Surface No. 7 | Surface No. 12 |
|---|---|---|
| K  0.0000 | K  0.0000 | K  0.0000 |
| C1  1.90827109e−008 | C1  4.29834963e−008 | C1  7.12539594e−008 |
| C2  1.04825601e−012 | C2  −9.32018657e−013 | C2  7.81169353e−012 |
| C3  −1.78093208e−017 | C3  3.88421097e−017 | C3  2.24285994e−016 |
| C4  2.90254732e−020 | C4  −1.41048066e−021 | C4  2.70399434e−019 |
| C5  −9.28646308e−025 | C5  3.20036532e−026 | C5  −5.33658325e−023 |
| C6  9.92757252e−029 | C6  −2.55377630e−031 | C6  1.07824675e−026 |
| C7  0.00000000e+000 | C7  0.00000000e+000 | C7  0.00000000e+000 |
| C8  0.00000000e+000 | C8  0.00000000e+000 | C8  0.00000000e+000 |
| C9  0.00000000e+000 | C9  0.00000000e+000 | C9  0.00000000e+000 |

| Surface No. 17 | Surface No. 20 | Surface No. 22 |
|---|---|---|
| K  0.0000 | K  0.0000 | K  0.0000 |
| C1  3.44530878e−008 | C1  5.99206839e−009 | C1  6.63814399e−008 |
| C2  −3.20209778e−013 | C2  −2.26778093e−013 | C2  1.50151781e−012 |
| C3  4.32090602e−018 | C3  −5.52734742e−019 | C3  3.42715896e−017 |
| C4  3.71891782e−022 | C4  3.37919534e−020 | C4  1.13418489e−020 |
| C5  −2.41461999e−026 | C5  −2.42416300e−026 | C5  −1.20800658e−024 |
| C6  6.86020285e−031 | C6  5.56746821e−031 | C6  1.36760067e−028 |
| C7  0.00000000e+000 | C7  0.00000000e+000 | C7  0.00000000e+000 |
| C8  0.00000000e+000 | C8  0.00000000e+000 | C8  0.00000000e+000 |
| C9  0.00000000e+000 | C9  0.00000000e+000 | C9  0.00000000e+000 |

| Surface No. 31 | Surface No..33 | Surface No. 41 |
|---|---|---|
| K  0.0000 | K  0.0000 | K  0.0000 |
| C1  −6.63814399e−008 | C1  −5.99206839e−009 | C1  3.02036913e−008 |
| C2  −1.50151781e−012 | C2  2.26778093e−013 | C2  −8.49897291e−013 |
| C3  −3.42715896e−017 | C3  5.52734742e−019 | C3  −2.62757380e−018 |
| C4  −1.13418489e−020 | C4  −3.37919534e−022 | C4  2.42290737e−021 |
| C5  1.20800658e−024 | C5  2.42416300e−026 | C5  −1.80384886e−025 |
| C6  −1.36760067e−028 | C6  −5.56746821e−031 | C6  4.40130958e−030 |
| C7  0.00000000e+000 | C7  0.00000000e+000 | C7  0.00000000e+000 |

TABLE 2-continued

Aspherical constant

| | | | | | |
|---|---|---|---|---|---|
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

| Surface No. 42 | Surface No. 44 | Surface No. 51 |
|---|---|---|
| K   0.0000 | K   0.0000 | K   0.0000 |
| C1  1.57083344e-007 | C1 -6.63114425e-008 | C1  3.97980700e-008 |
| C2 -5.70047014e-012 | C2  1.06389778e-012 | C2 -1.14363396e-015 |
| C3  9.96269363e-016 | C3 -1.73700448e-016 | C3  2.12173627e-019 |
| C4 -9.51074757e-020 | C4  7.83565903e-021 | C4 -1.81177143e-022 |
| C5  2.78023503e-024 | C5 -3.69851418e-025 | C5 -9.65440963e-027 |
| C6  2.11268686e-028 | C6  6.43100123e-031 | C6  3.69511989e-031 |
| C7  0.00000000e+000 | C7  0.00000000e+000 | C7  0.00000000e+000 |
| C8  0.00000000e+000 | C8  0.00000000e+000 | C8  0.00000000e+000 |
| C9  0.00000000e+000 | C9  0.00000000e+000 | C9  0.00000000e+000 |

| Surface No. 59 |
|---|
| K   0.0000 |
| C1  3.28933356e-008 |
| C2 -4.67953085e-013 |
| C3  1.96156711e-017 |
| C4  1.01627452e-022 |
| C5 -3.59201172e-026 |
| C6  2.16163436e-030 |
| C7  0.00000000e+000 |
| C8  0.00000000e+000 |
| C9  0.00000000e+000 |

TABLE 3

| Surface | Radius | Distance | Material | ½ Diameter |
|---|---|---|---|---|
| 0 | 0.000000000 | 47.596241819 | AIR | 57.700 |
| 1 | 0.000000000 | 21.484078486 | AIR | 71.361 |
| 2 | -130.196528296 | 81.232017348 | CAF2 | 71.411 |
| 3 | -201.970612192 | 1.090292328 | AIR | 102.064 |
| 4 | 0.000000000 | 43.035190104 | CAF2 | 111.239 |
| 5 | -219.688636866 | 1.000008083 | AIR | 113.511 |
| 6 | 196.835177454 | 48.645753259 | CAF2 | 112.440 |
| 7 | -1062.563638620 | 1.011278327 | AIR | 109.626 |
| 8 | 102.486371771 | 51.257817769 | CAF2 | 88.766 |
| 9 | 125.152226832 | 78.537765316 | AIR | 72.052 |
| 10 | -276.036111675 | 19.246024827 | CAF2 | 35.565 |
| 11 | -344.559129459 | 44.417965355 | AIR | 42.153 |
| 12 | -73.158562407 | 46.803238343 | CAF2 | 53.934 |
| 13 | -81.595671547 | 1.005611042 | AIR | 71.774 |
| 14 | 917.859457951 | 35.862144308 | CAF2 | 83.802 |
| 15 | -184.688054893 | 1.002179985 | AIR | 85.191 |
| 16 | 520.342292054 | 23.034106261 | CAF2 | 82.478 |
| 17 | -768.099839930 | 99.999802859 | AIR | 80.816 |
| 18 | 0.000000000 | 0.000000000 | AIR | 72.928 |
| 19 | 0.000000000 | 49.999962118 | AIR | 72.928 |
| 20 | 241.487091044 | 30.190977973 | CAF2 | 85.575 |
| 21 | -1164.355916310 | 264.025266484 | AIR | 85.757 |
| 22 | -132.516232462 | 15.000193519 | CAF2 | 81.831 |
| 23 | -1356.484422410 | 61.385058143 | AIR | 89.265 |
| 24 | -108.588059874 | 14.999993604 | CAF2 | 92.698 |
| 25 | -296.429590341 | 28.045104017 | AIR | 119.543 |
| 26 R | -171.604551151 | 0.000000000 | AIR | 121.617 |
| 27 R | 0.000000000 | 28.045104017 | AIR | 187.566 |
| 28 | 296.429590341 | 14.999993604 | CAF2 | 118.640 |
| 29 | 108.588059874 | 61.385058143 | AIR | 87.692 |
| 30 | 1356.484422410 | 15.000193519 | CAF2 | 75.436 |
| 31 | 132.516232462 | 264.025266484 | AIR | 68.614 |
| 32 | 1164.355916310 | 30.190977973 | CAF2 | 79.925 |
| 33 | -241.487091044 | 49.999914356 | AIR | 79.985 |
| 34 | 0.000000000 | 0.000000000 | AIR | 73.069 |
| 35 | 0.000000000 | 107.612168038 | AIR | 73.069 |
| 36 | -693.184976623 | 16.117644573 | CAF2 | 81.276 |
| 37 | -696.986438150 | 2.228062889 | AIR | 84.557 |
| 38 | 272.001870523 | 26.851322582 | CAF2 | 90.453 |
| 39 | -11518.014964700 | 1.683452367 | AIR | 90.747 |
| 40 | 204.924277454 | 41.781211890 | CAF2 | 91.627 |
| 41 | 3033.528484830 | 106.582128113 | AIR | 88.228 |
| 42 | -134.400581416 | 22.683343530 | CAF2 | 70.595 |
| 43 | 149.085276952 | 30.111359058 | AIR | 72.323 |
| 44 | -1571.459281550 | 66.592767742 | CAF2 | 74.527 |
| 45 | -685.256687590 | 11.096249234 | AIR | 101.072 |
| 46 | -661.646567779 | 85.751986497 | CAF2 | 106.788 |
| 47 | -157.414472118 | 1.578582665 | AIR | 121.872 |
| 48 | 281.442061787 | 38.097581301 | CAF2 | 126.470 |
| 49 | 2477.671193110 | 77.916990124 | AIR | 123.978 |
| 50 | 0.000000000 | 0.000000000 | AIR | 117.805 |
| 51 | 0.000000000 | -4.224796803 | AIR | 118.082 |
| 52 | 629.850672554 | 48.195853438 | CAF2 | 118.380 |
| 53 | -440.009879814 | 0.999978780 | AIR | 118.034 |
| 54 | 243.613408298 | 52.262412712 | CAF2 | 109.822 |
| 55 | 11973.088705700 | 1.027491789 | AIR | 101.920 |
| 56 | 115.269169988 | 60.712228046 | CAF2 | 83.889 |
| 57 | 372.135519803 | 1.030688086 | AIR | 63.468 |
| 58 | 72.776794128 | 53.208894511 | CAF2 | 48.890 |
| 59 | 0.000000000 | 0.000000000 | CAF2 | 14.425 |
| 60 | 0.000000000 | 0.000000000 | AIR | 14.425 |

NA = 1.1   Y = 57.7 mm
WL   157.2852   157.2862   157.2842
CAF2   1.55930394   1.55930133   1.55930655

TABLE 4

Aspherical constants

| Surface No. 2 | Surface No. 7 | Surface No. 12 |
|---|---|---|
| K   0.0000 | K   0.0000 | K   0.0000 |
| C1 -4.90420246e-011 | C1  2.96559302e-008 | C1  6.82301843e-008 |

TABLE 4-continued

Aspherical constants

| | | |
|---|---|---|
| C2  7.22127484e−014 | C2  −4.45892297e−013 | C2  6.13339976e−012 |
| C3  1.72996941e−017 | C3  1.35851832e−017 | C3  −1.47536226e−016 |
| C4  −3.83158229e−021 | C4  −9.75107227e−022 | C4  −7.56092252e−020 |
| C5  1.65903133e−024 | C5  6.40021152e−026 | C5  1.52586945e−023 |
| C6  −1.68929866e−028 | C6  −9.93085086e−031 | C6  −1.35801785e−027 |
| C7  0.00000000e+000 | C7  0.00000000e+000 | C7  0.00000000e+000 |
| C8  0.00000000e+000 | C8  0.00000000e+000 | C8  0.00000000e+000 |
| C9  0.00000000e+000 | C9  0.00000000e+000 | C9  0.00000000e+000 |

| Surface No. 17 | Surface No. 20 | Surface No. 22 |
|---|---|---|
| K  0.0000 | K  0.0000 | K  0.0000 |
| C1  4.47108229e−008 | C1  2.82365956e−009 | C1  6.25856212e−008 |
| C2  −4.00171489e−013 | C2  −3.11781699e−013 | C2  9.37857950e−013 |
| C3  4.13032418e−018 | C3  −1.69631649e−018 | C3  3.67635940e−017 |
| C4  6.29956500e−022 | C4  1.14900242e−021 | C4  8.35698619e−021 |
| C5  −3.85978221e−026 | C5  −1.52629451e−025 | C5  −1.33482892e−024 |
| C6  2.31708241e−030 | C6  8.81503206e−030 | C6  1.38831758e−028 |
| C7  0.00000000e+000 | C7  0.00000000e+000 | C7  0.00000000e+000 |
| C8  0.00000000e+000 | C8  0.00000000e+000 | C8  0.00000000e+000 |
| C9  0.00000000e+000 | C9  0.00000000e+000 | C9  0.00000000e+000 |

| Surface No. 31 | Surface No..33 | Surface No. 41 |
|---|---|---|
| K  0.0000 | K  0.0000 | K  0.0000 |
| C1  −6.25856212e−008 | C1  −2.82365956e−009 | C1  2.31765306e−008 |
| C2  −9.37857950e−013 | C2  3.11781699e−013 | C2  −1.15108202e−012 |
| C3  −3.67635940e−017 | C3  1.69631649e−018 | C3  2.55992541e−017 |
| C4  −8.35698619e−021 | C4  −1.14900242e−021 | C4  6.87393928e−022 |
| C5  1.33482892e−024 | C5  1.52629451e−025 | C5  −3.66676084e−026 |
| C6  −1.38831758e−028 | C6  −8.81503206e−030 | C6  −2.77895503e−030 |
| C7  0.00000000e+000 | C7  0.00000000e+000 | C7  0.00000000e+000 |
| C8  0.00000000e+000 | C8  0.00000000e+000 | C8  0.00000000e+000 |
| C9  0.00000000e+000 | C9  0.00000000e+000 | C9  0.00000000e+000 |

| Surface No. 42 | Surface No. 44 | Surface No. 49 |
|---|---|---|
| K  0.0000 | K  0.0000 | K  0.0000 |
| C1  1.23211770e−007 | C1  −1.18481725e−007 | C1  2.68959500e−008 |
| C2  −2.94099944e−012 | C2  −2.04738790e−012 | C2  −9.41267411e−014 |
| C3  1.13325221e−015 | C3  −5.33930585e−016 | C3  2.54969437e−018 |
| C4  −1.09316744e−019 | C4  −1.51638014e−020 | C4  −1.50502498e−022 |
| C5  2.28727473e−024 | C5  1.67227571e−024 | C5  6.35633774e−027 |
| C6  1.03306617e−027 | C6  −4.91365155e−028 | C6  −9.71849339e−032 |
| C7  0.00000000e+000 | C7  0.00000000e+000 | C7  0.00000000e+000 |
| C8  0.00000000e+000 | C8  0.00000000e+000 | C8  0.00000000e+000 |
| C9  0.00000000e+000 | C9  0.00000000e+000 | C9  0.00000000e+000 |

| Surface No. 57 |
|---|
| K  0.0000 |
| C1  3.32050996e−008 |
| C2  4.58821096e−012 |
| C3  −7.80384116e−016 |
| C4  1.16466986e−019 |
| C5  −1.04436731e−023 |
| C6  4.66260861e−028 |
| C7  0.00000000e+000 |
| C8  0.00000000e+000 |
| C9  0.00000000e+000 |

TABLE 5

| Surface | Radius | Distance | Material | ½ Diameter |
|---|---|---|---|---|
| 0 | 0.000000000 | 40.000000000 | AIR | 56.080 |
| 1 | 700.000000000 | 30.000000000 | SIO2 | 70.401 |
| 2 | −700.000000000 | 1.000000000 | AIR | 74.095 |
| 3 | 700.000000000 | 30.000000000 | SIO2 | 75.879 |
| 4 | −700.000000000 | −1.000000000 | AIR | 77.689 |
| 5 | 500.000000000 | 30.000000000 | SIO2 | 78.339 |
| 6 | −1000.000000000 | 15.000000000 | AIR | 78.060 |
| 7 | 700.000000000 | 30.000000000 | SIO2 | 76.609 |
| 8 | −700.000000000 | 0.000000000 | AIR | 74.839 |
| 9 | 0.000000000 | 75.000000000 | SIO2 | 74.070 |
| 10 | 0.000000000 | 75.000000000 | SIO2 | 64.964 |
| 11 | 0.000000000 | 13.000000000 | AIR | 55.857 |
| 12 | −300.000000000 | 10.000000000 | SIO2 | 54.317 |
| 13 | −500.000000000 | 5.000000000 | AIR | 53.682 |
| 14 | 0.000000000 | 10.000000000 | AIR | 52.538 |
| 15 | −290.000000000 | 0.000000000 | AIR | 55.162 |
| 16 | 0.000000000 | 15.000000000 | AIR | 54.666 |
| 17 | 500.000000000 | 10.000000000 | SIO2 | 56.801 |
| 18 | 300.000000000 | 13.000000000 | AIR | 57.279 |
| 19 | 0.000000000 | 75.000000000 | SIO2 | 58.589 |
| 20 | 0.000000000 | 75.000000000 | SIO2 | 66.927 |

TABLE 5-continued

| | | | | |
|---|---|---|---|---|
| 21 | 0.000000000 | 30.000000000 | AIR | 75.266 |
| 22 | 300.000000000 | 30.000000000 | SIO2 | 82.546 |
| 23 | −400.000000000 | 40.000100000 | AIR | 82.595 |
| 24 | 500.000000000 | 25.000000000 | SIO2 | 76.453 |

TABLE 5-continued

| | | | | |
|---|---|---|---|---|
| 25 | −400.000000000 | 41.206360088 | AIR | 74.915 |
| 26 | 0.000000000 | 0.000000000 | AIR | 63.567 |

NAO = 0.27   Y = 56.08 mm
WL            193.3685        193.368         193.3675
SiO22         1.56078491      1.5607857       1.56078649

TABLE 9

| SURFACE | RADIUS | THICKNESS | MATERIAL | INDEX | SEMIDIAM. |
|---|---|---|---|---|---|
| 0 | 0.000000 | 59.209510 | | | 64.0 |
| 1 | 6291.598274 | 23.678332 | SILUV | 1.560491 | 85.8 |
| 2 | −280.600902 | 1.025405 | | | 87.8 |
| 3 | 144.511042 | 32.290800 | SILUV | 1.560491 | 93.4 |
| 4 | 416.821920 | 57.132926 | | | 91.4 |
| 5 | 163.242835 | 31.337729 | SILUV | 1.560491 | 78.6 |
| 6 | −661.478201 | 9.882827 | | | 75.2 |
| 7 | 85.805375 | 31.336035 | SILUV | 1.560491 | 59.0 |
| 8 | 97.841124 | 32.157174 | | | 46.3 |
| 9 | −110.558780 | 50.000185 | SILUV | 1.560491 | 43.4 |
| 10 | −105.568468 | 7.861299 | | | 62.9 |
| 11 | −95.869843 | 33.360087 | SILUV | 1.560491 | 64.6 |
| 12 | −396.465160 | 25.208502 | | | 89.8 |
| 13 | −295.388642 | 49.666565 | SILUV | 1.560491 | 103.3 |
| 14 | −127.525234 | 0.999856 | | | 109.4 |
| 15 | −279.794894 | 36.644817 | SILUV | 1.560491 | 118.2 |
| 16 | −160.830350 | 0.999370 | | | 121.6 |
| 17 | 321.280433 | 28.683439 | SILUV | 1.560491 | 121.8 |
| 18 | 1713.098384 | 0.999141 | | | 120.6 |
| 19 | 249.641678 | 30.928964 | SILUV | 1.560491 | 117.3 |
| 20 | 1775.118866 | 84.998661 | | | 114.7 |
| 21 | 0.000000 | −14.998086 | REFL | | 183.2 |
| 22 | −322.738827 | −22.708716 | SILUV | 1.560491 | 86.5 |
| 23 | 1794.276655 | −198.953288 | | | 84.1 |
| 24 | 102.167956 | −12.500000 | SILUV | 1.560491 | 72.4 |
| 25 | 15297.224085 | −58.562725 | | | 82.5 |
| 26 | 106.167570 | −12.500000 | SILUV | 1.560491 | 89.2 |
| 27 | 192.760260 | −27.399192 | | | 107.8 |
| 28 | 154.038668 | 27.399192 | REFL | | 115.3 |
| 29 | 192.760260 | 12.500000 | SILUV | 1.560491 | 107.8 |
| 30 | 106.167570 | 58.562725 | | | 89.2 |
| 31 | 15297.224085 | 12.500000 | SILUV | 1.560491 | 82.5 |
| 32 | 102.167956 | 198.954271 | | | 72.4 |
| 33 | 1794.276655 | 22.708716 | SILUV | 1.560491 | 84.1 |
| 34 | −322.738827 | 14.999504 | | | 86.5 |
| 35 | 0.000000 | −84.999766 | REFL | | 179.0 |
| 36 | 665.918045 | −20.162556 | SILUV | 1.560491 | 112.6 |
| 37 | 332.340267 | −0.999827 | | | 115.0 |
| 38 | −545.416435 | −30.156611 | SILUV | 1.560491 | 121.7 |
| 39 | 972.309758 | −0.999891 | | | 122.2 |
| 40 | −239.092507 | −40.367741 | SILUV | 1.560491 | 122.8 |
| 41 | −3867.765964 | −1.000866 | | | 121.0 |
| 42 | −145.814165 | −43.782811 | SILUV | 1.560491 | 108.8 |
| 43 | −475.322286 | −20.838629 | | | 103.7 |
| 44 | 994.251725 | −9.999791 | SILUV | 1.560491 | 100.7 |
| 45 | −102.926902 | −38.025955 | | | 82.3 |
| 46 | −666.254624 | −9.999917 | SILUV | 1.560491 | 82.7 |
| 47 | −120.991218 | −38.125943 | | | 83.4 |
| 48 | −444.529439 | −19.995612 | SILUV | 1.560491 | 93.9 |
| 49 | 7256.085975 | −72.078976 | | | 96.0 |
| 50 | 861.320622 | −16.316029 | SILUV | 1.560491 | 115.4 |
| 51 | 367.114240 | −21.532267 | | | 118.5 |
| 52 | −578.781634 | −19.544116 | SILUV | 1.560491 | 135.3 |
| 53 | −1539.844110 | −1.000064 | | | 136.2 |
| 54 | −409.215581 | −53.967605 | SILUV | 1.560491 | 140.1 |
| 55 | 388.259251 | −21.190519 | | | 140.0 |
| 56 | 0.000000 | −14.363454 | | | 131.6 |
| 57 | −492.744559 | −42.747305 | SILUV | 1.560491 | 135.3 |
| 58 | 596.175995 | −0.999975 | | | 134.4 |
| 59 | −188.727208 | −44.971247 | SILUV | 1.560491 | 119.1 |
| 60 | −1267.900423 | −0.999664 | | | 114.6 |
| 61 | −118.853763 | −29.974419 | SILUV | 1.560491 | 90.5 |
| 62 | −172.286110 | −2.720285 | | | 82.2 |
| 63 | −83.065857 | −24.574193 | SILUV | 1.560491 | 67.0 |
| 64 | −111.658319 | −1.105096 | | | 56.0 |
| 65 | −69.828581 | −43.055955 | SILUV | 1.560491 | 50.3 |

TABLE 9-continued

| SURFACE | RADIUS | THICKNESS | MATERIAL | INDEX | SEMIDIAM. |
|---|---|---|---|---|---|
| 66 | 0.000000 | −1.001571 | H2OV193 | 1.436823 | 20.5 |
| 67 | 0.000000 | 0.000000 | | | 19.0 |

TABLE 9A

ASPHERIC CONSTANTS

| | SRF | | | |
|---|---|---|---|---|
| | 6 | 15 | 20 | 24 |
| K | 0 | 0 | 0 | 0 |
| C1 | 7.168010E−08 | −6.564766E−09 | 1.990247E−08 | −1.434139E−07 |
| C2 | 7.874235E−13 | 4.352930E−13 | 2.214975E−13 | −3.992456E−12 |
| C3 | 3.026860E−16 | −2.400883E−17 | −2.046213E−17 | −3.265156E−16 |
| C4 | −3.434246E−20 | 3.866886E−22 | 9.725329E−22 | 3.104990E−21 |
| C5 | 3.870353E−25 | 1.162444E−27 | −2.756730E−26 | −1.874174E−24 |
| C6 | 7.234455E−29 | −1.259764E−32 | 4.143527E−31 | −4.628892E−28 |

| | SRF | | | |
|---|---|---|---|---|
| | 43 | 45 | 47 | 50 |
| K | 0 | 0 | 0 | 0 |
| C1 | −1.007015E−08 | −4.489903E−08 | 5.184442E−08 | 3.174451E−08 |
| C2 | −3.821558E−13 | 1.198606E−12 | 5.582183E−12 | 5.537615E−14 |
| C3 | 8.872440E−17 | −1.562441E−16 | 2.393671E−16 | 3.190712E−18 |
| C4 | −6.956619E−21 | 1.250805E−20 | 7.608169E−21 | −6.524213E−22 |
| C5 | 3.866469E−25 | 2.467619E−24 | −1.988373E−24 | −7.379838E−27 |
| C6 | −7.623750E−30 | −1.675469E−28 | 2.670495E−28 | −9.847764E−31 |

| | SRF | |
|---|---|---|
| | 62 | 64 |
| K | 0 | 0 |
| C1 | 6.908374E−08 | −2.282295E−07 |
| C2 | −7.414546E−12 | −2.062783E−11 |
| C3 | 1.971662E−16 | 1.258799E−15 |
| C4 | −5.334580E−20 | −2.146440E−19 |
| C5 | 5.884223E−24 | 4.332875E−23 |
| C6 | −3.743875E−28 | −1.189088E−27 |

TABLE 10

| SURFACE | RADIUS | THICKNESS | MATERIAL | INDEX | SEMIDIAM. |
|---|---|---|---|---|---|
| 0 | 0.000000 | 51.000259 | | | 64.0 |
| 1 | 1084.670740 | 20.061470 | SILUV | 1.560491 | 84.0 |
| 2 | −489.591572 | 8.024505 | | | 85.7 |
| 3 | 147.977412 | 33.265720 | SILUV | 1.560491 | 93.2 |
| 4 | 533.607588 | 60.035648 | | | 91.5 |
| 5 | 162.257926 | 31.487872 | SILUV | 1.560491 | 79.2 |
| 6 | −641.542087 | 12.321334 | | | 75.9 |
| 7 | 88.691635 | 37.381348 | SILUV | 1.560491 | 60.1 |
| 8 | 113.767960 | 26.723349 | | | 45.6 |
| 9 | −117.888976 | 42.501530 | SILUV | 1.560491 | 42.0 |
| 10 | −162.865349 | 13.700402 | | | 59.6 |
| 11 | −116.482373 | 32.902705 | SILUV | 1.560491 | 63.1 |
| 12 | −306.816392 | 26.438566 | | | 83.9 |
| 13 | −323.530175 | 41.085951 | SILUV | 1.560491 | 99.9 |
| 14 | −137.244758 | 5.556612 | | | 105.5 |
| 15 | −451.636628 | 44.589731 | SILUV | 1.560491 | 115.9 |
| 16 | −154.769207 | 0.999820 | | | 119.2 |
| 17 | 392.370175 | 25.008628 | SILUV | 1.560491 | 118.0 |
| 18 | 3014.562689 | 0.999723 | | | 117.0 |
| 19 | 289.177591 | 25.844242 | SILUV | 1.560491 | 114.3 |
| 20 | 925.962044 | 84.999670 | | | 112.1 |
| 21 | 0.000000 | −14.999476 | REFL | | 175.2 |
| 22 | −331.395343 | −22.607980 | SILUV | 1.560491 | 89.7 |
| 23 | 3332.007318 | −230.559976 | | | 87.1 |
| 24 | 98.691313 | −12.500000 | SILUV | 1.560491 | 73.1 |
| 25 | 28881.747267 | −55.643371 | | | 84.0 |

TABLE 10-continued

| SURFACE | RADIUS | THICKNESS | MATERIAL | INDEX | SEMIDIAM. |
|---|---|---|---|---|---|
| 26 | 105.777999 | −12.500000 | SILUV | 1.560491 | 89.4 |
| 27 | 190.916612 | −27.579443 | | | 109.5 |
| 28 | 155.323230 | 27.579443 | REFL | | 118.2 |
| 29 | 190.916612 | 12.500000 | SILUV | 1.560491 | 109.5 |
| 30 | 105.777999 | 55.643371 | | | 89.4 |
| 31 | 28881.747267 | 12.500000 | SILUV | 1.560491 | 84.0 |
| 32 | 98.691313 | 230.560091 | | | 73.1 |
| 33 | 3332.007318 | 22.607980 | SILUV | 1.560491 | 87.1 |
| 34 | −331.395343 | 14.999815 | | | 89.7 |
| 35 | 0.000000 | −85.031452 | REFL | | 185.4 |
| 36 | 632.234731 | −21.937556 | SILUV | 1.560491 | 116.1 |
| 37 | 312.776852 | −1.989523 | | | 118.6 |
| 38 | −419.317799 | −39.548184 | SILUV | 1.560491 | 126.0 |
| 39 | 679.933212 | −11.879717 | | | 126.0 |
| 40 | −359.055554 | −33.826228 | SILUV | 1.560491 | 122.0 |
| 41 | 1713.588185 | −6.930143 | | | 120.4 |
| 42 | −130.793879 | −40.665153 | SILUV | 1.560491 | 103.0 |
| 43 | −297.152405 | −24.525611 | | | 97.5 |
| 44 | 888.942670 | −10.000074 | SILUV | 1.560491 | 94.8 |
| 45 | −95.853886 | −38.822971 | | | 77.7 |
| 46 | −1286.530610 | −10.502279 | SILUV | 1.560491 | 78.3 |
| 47 | −122.332491 | −53.312951 | | | 80.5 |
| 48 | −1046.310490 | −29.995767 | SILUV | 1.560491 | 98.8 |
| 49 | −3155.314818 | −35.731529 | | | 106.3 |
| 50 | −2635.516216 | −38.906996 | SILUV | 1.560491 | 121.6 |
| 51 | 253.216058 | −1.026566 | | | 125.0 |
| 52 | −477.178385 | −27.726167 | SILUV | 1.560491 | 136.5 |
| 53 | −1111.410551 | −1.006437 | | | 137.0 |
| 54 | −419.465047 | −45.153215 | SILUV | 1.560491 | 138.9 |
| 55 | 657.652879 | −27.561809 | | | 138.4 |
| 56 | 0.000000 | 11.279146 | | | 129.1 |
| 57 | −1714.364190 | −34.463306 | SILUV | 1.560491 | 133.1 |
| 58 | 435.051330 | −26.422505 | | | 131.9 |
| 59 | −217.425708 | −40.030383 | SILUV | 1.560491 | 113.2 |
| 60 | 191072.918549 | −0.999778 | | | 109.6 |
| 61 | −106.841172 | −32.593766 | SILUV | 1.560491 | 85.0 |
| 62 | −202.323930 | −0.999427 | | | 77.0 |
| 63 | −79.299863 | −25.891843 | SILUV | 1.560491 | 63.5 |
| 64 | −117.061751 | −0.998476 | | | 52.9 |
| 65 | −70.340516 | −36.868819 | SILUV | 1.560491 | 46.7 |
| 66 | 0.000000 | −1.001571 | H2OV193 | 1.436823 | 20.5 |
| 67 | 0.000000 | 0.000000 | | | 19.0 |

TABLE 10A

ASPHERIC CONSTANTS

| | SRF | | | | |
|---|---|---|---|---|---|
| | 6 | 15 | 23 | 24 | 32 |
| K | 0 | 0 | 0 | 0 | 0 |
| C1 | 8.416890E−08 | −2.308559E−08 | −8.485003E−09 | −1.223767E−07 | −1.223767E−07 |
| C2 | 1.006640E−12 | 1.109550E−13 | −6.734945E−14 | −7.438273E−12 | −7.438273E−12 |
| C3 | 3.617643E−16 | −6.344353E−18 | 5.661979E−19 | −4.704304E−16 | −4.704304E−16 |
| C4 | −4.192188E−20 | 1.566682E−22 | −2.504587E−22 | 3.963572E−21 | 3.963572E−21 |
| C5 | 6.704096E−26 | −4.902118E−27 | 2.908669E−26 | −6.736661E−24 | −6.736661E−24 |
| C6 | 1.721955E−28 | 4.306889E−32 | −1.350234E−30 | −4.531767E−28 | −4.531767E−28 |

| | SRF | | | | |
|---|---|---|---|---|---|
| | 33 | 43 | 45 | 47 | 50 |
| K | 0 | 0 | 0 | 0 | 0 |
| C1 | −8.485003E−09 | −3.497951E−09 | −4.202804E−08 | 6.218114E−08 | 3.138180E−08 |
| C2 | −6.734945E−14 | −5.106017E−13 | 1.982600E−12 | 4.755456E−12 | −3.924136E−13 |
| C3 | 5.661979E−19 | 6.844726E−17 | −1.463517E−16 | 4.467358E−16 | 5.657046E−18 |
| C4 | −2.504587E−22 | −3.263478E−21 | 9.687863E−21 | 2.313332E−20 | −6.552593E−22 |
| C5 | 2.908669E−26 | 9.349870E−26 | 2.764278E−24 | −3.886568E−24 | 2.087202E−26 |
| C6 | −1.350234E−30 | 2.248476E−30 | 7.460803E−29 | 4.543438E−28 | −5.207993E−31 |

TABLE 10A-continued

| ASPHERIC CONSTANTS | | | |
|---|---|---|---|
| | SRF | | |
| | 55 | 62 | 64 |
| K | 0 | 0 | 0 |
| C1 | −5.022929E−10 | −2.500268E−08 | −1.132630E−07 |
| C2 | −3.387071E−14 | −7.360583E−12 | −3.255025E−11 |
| C3 | −1.887886E−17 | 1.175353E−15 | 6.754420E−15 |
| C4 | 6.061750E−22 | −2.566402E−19 | −9.778374E−19 |
| C5 | −8.730441E−27 | 2.406082E−23 | 6.403897E−23 |
| C6 | 4.736715E−32 | −1.314800E−27 | 1.523975E−27 |

TABLE 11

| SURF | RADIUS | THICKNESS | MATERIAL | INDEX | SEMIDIAM. |
|---|---|---|---|---|---|
| 0 | 0.000000 | 42.716567 | | | 63.0 |
| 1 | 187.082284 | 29.074103 | SIO2 | 1.560491 | 87.7 |
| 2 | 1122.624300 | 13.704059 | | | 87.8 |
| 3 | 257.788495 | 25.970502 | SIO2 | 1.560491 | 89.3 |
| 4 | 4087.92371 | 96.751806 | | | 88.2 |
| 5 | 149.090802 | 9.999268 | SIO2 | 1.560491 | 84.3 |
| 6 | 112.190840 | 20.619019 | | | 79.4 |
| 7 | 222.671339 | 39.005001 | SIO2 | 1.560491 | 79.4 |
| 8 | −171.486868 | 0.999098 | | | 77.9 |
| 9 | 72.242638 | 58.534093 | SIO2 | 1.560491 | 61.0 |
| 10 | 103.263585 | 23.657309 | | | 38.2 |
| 11 | −120.537552 | 36.218695 | SIO2 | 1.560491 | 39.7 |
| 12 | −79.009690 | 13.559024 | | | 52.6 |
| 13 | −70.743286 | 10.000301 | SIO2 | 1.560491 | 55.6 |
| 14 | −406.875493 | 15.578104 | | | 72.7 |
| 15 | −167.014571 | 41.099022 | SIO2 | 1.560491 | 76.7 |
| 16 | −97.881974 | 0.999302 | | | 86.2 |
| 17 | −289.132352 | 49.908319 | SIO2 | 1.560491 | 102.4 |
| 18 | −127.491717 | 0.999640 | | | 108.2 |
| 19 | −915.187280 | 29.128849 | SIO2 | 1.560491 | 114.2 |
| 20 | −267.279137 | 70.000315 | | | 116.1 |
| 21 | 0.000000 | −99.530888 | REFL | | 163.4 |
| 22 | −211.224346 | −59.634155 | SIO2 | 1.560491 | 129.3 |
| 23 | 847.318306 | −285.786240 | | | 127.5 |
| 24 | 108.606993 | −12.500000 | SIO2 | 1.560491 | 68.7 |
| 25 | −2037.814268 | −40.801930 | | | 77.3 |
| 26 | 98.650256 | −12.500000 | SIO2 | 1.560491 | 79.4 |
| 27 | 173.699507 | −12.863441 | | | 95.4 |
| 28 | 147.630649 | 12.863441 | REFL | | 98.7 |
| 29 | 173.699507 | 12.500000 | SIO2 | 1.560491 | 95.4 |
| 30 | 98.650256 | 40.801930 | | | 79.4 |
| 31 | −2037.814268 | 12.500000 | SIO2 | 1.560491 | 77.3 |
| 32 | 108.606993 | 285.786240 | | | 68.7 |
| 33 | 847.318306 | 59.634155 | SIO2 | 1.560491 | 127.5 |
| 34 | −211.224346 | 81.116047 | | | 129.3 |
| 35 | 0.000000 | −73.612596 | REFL | | 160.7 |
| 36 | −389.330139 | −33.487696 | SIO2 | 1.560491 | 114.9 |
| 37 | 1028.934202 | −0.999947 | | | 113.5 |
| 38 | −174.265376 | −32.363134 | SIO2 | 1.560491 | 104.3 |
| 39 | −396.847027 | −1.000532 | | | 99.8 |
| 40 | −121.243745 | −48.918207 | SIO2 | 1.560491 | 89.3 |
| 41 | −131.171270 | −29.702617 | | | 71.3 |
| 42 | 335.952888 | −10.034790 | SIO2 | 1.560491 | 69.3 |
| 43 | −82.977553 | −43.925742 | | | 61.4 |
| 44 | 142.301184 | −9.999862 | SIO2 | 1.560491 | 63.2 |
| 45 | −263.305242 | −23.458962 | | | 74.7 |
| 46 | 2291.125020 | ±61398344 | SIO2 | 1.560491 | 84.5 |
| 47 | 165.812687 | −1.061241 | | | 103.9 |
| 48 | 486.553030 | −37.309271 | SIO2 | 1.560491 | 113.9 |
| 49 | 194.984003 | −21.455915 | | | 120.7 |
| 50 | −2153.235102 | −50.329924 | SIO2 | 1.560491 | 142.6 |
| 51 | 291.296473 | −0.999132 | | | 144.8 |
| 52 | −443.499291 | −44.594835 | SIO2 | 1.560491 | 146.7 |
| 53 | 1173.500711 | −8.577265 | | | 145.5 |
| 54 | 0.000000 | 7.578035 | | | 138.4 |
| 55 | −337.532449 | −35.808358 | SIO2 | 1.560491 | 139.1 |
| 56 | −1836.960645 | −1.165380 | | | 136.4 |
| 57 | −439.395199 | −28.816834 | SIO2 | 1.560491 | 133.5 |
| 58 | 2161.178835 | −0.998190 | | | 130.3 |

TABLE 11-continued

| SURF | RADIUS | THICKNESS | MATERIAL | INDEX | SEMIDIAM. |
|---|---|---|---|---|---|
| 59 | −260.497359 | −36.004531 | SIO2 | 1.560491 | 115.8 |
| 60 | 5382.003743 | −0.997164 | | | 110.1 |
| 61 | −122.176927 | −36.201583 | SIO2 | 1.560491 | 86.2 |
| 62 | −321.548352 | −1.000000 | | | 76.5 |
| 63 | −54.686592 | −41.835126 | SIO2 | 1.560491 | 49.5 |
| 64 | 0.000000 | −3.000000 | H2O | 1.436823 | 25.2 |
| 65 | 0.000000 | 0.000000 | | | 18.8 |

TABLE 11A

ASPHERIC CONSTANTS

| | | | SRF | | |
|---|---|---|---|---|---|
| | 8 | 14 | 19 | 22 | 25 |
| K | 0 | 0 | 0 | 0 | 0 |
| C1 | 1.079370E−07 | 7.669220E−08 | −7.045424E−09 | 1.010508E−08 | 3.738770E−08 |
| C2 | 1.064327E−12 | −1.973038E−11 | −3.066122E−14 | 1.795924E−13 | −3.496492E−12 |
| C3 | −4.566909E−16 | 2.138994E−15 | −4.118337E−18 | 1.934995E−18 | 3.233016E−16 |
| C4 | 1.905320E−19 | −1.074179E−19 | 3.495758E−22 | 1.389960E−22 | −3.498294E−20 |
| C5 | −1.972022E−23 | −2.090955E−24 | −2.483792E−26 | −5.289985E−27 | 2.704951E−24 |
| C6 | 8.751032E−28 | 4.279927E−28 | 4.016359E−31 | 1.320749E−31 | −9.856748E−29 |

| | | | SRF | | |
|---|---|---|---|---|---|
| | 31 | 34 | 42 | 46 | 48 |
| K | 0 | 0 | 0 | 0 | 0 |
| C1 | 3.738770E−08 | 1.010508E−08 | 3.117477E−08 | 8.249850E−08 | 4.142725E−08 |
| C2 | −3.496492E−12 | 1.795924E−13 | −1.385143E−11 | −1.955317E−13 | −2.012061E−12 |
| C3 | 3.233016E−16 | 1.934995E−18 | 2.707311E−15 | 1.934995E−18 | 1.566310E−17 |
| C4 | −3.498294E−20 | 1.389960E−22 | −3.351896E−19 | −1.723197E−20 | 1.046236E−22 |
| C5 | 2.704951E−24 | −5.289985E−27 | 2.318550E−23 | −8.777152E−25 | 3.404661E−25 |
| C6 | −9.856748E−29 | 1.320749E−31 | −7.018917E−28 | −2.800720E−28 | −8.280605E−30 |

| | | SRF | |
|---|---|---|---|
| | 51 | 57 | 60 |
| K | 0 | 0 | 0 |
| C1 | 3.292883E−10 | 4.807681E−08 | 3.409977E−09 |
| C2 | −7.254285E−13 | −2.265563E−12 | −3.641765E−12 |
| C3 | 2.476488E−17 | 6.703492E−17 | 2.594792E−16 |
| C4 | −1.056859E−21 | −1.704146E−21 | −1.764035E−20 |
| C5 | 4.966804E−26 | 4.472968E−26 | 7.777614E−25 |
| C6 | −8.485797E−31 | −6.865707E−31 | −1.797945E−29 |

TABLE 12

| SURF | RADIUS | THICKNESS | MATERIAL | INDEX | SEMIDIAM. |
|---|---|---|---|---|---|
| 0 | 0.000000 | 35.040681 | | | 61.5 |
| 1 | 210.405327 | 30.736588 | SIO2 | 1.560491 | 81.0 |
| 2 | −829.214191 | 5.286654 | | | 81.6 |
| 3 | 107.948426 | 51.211605 | SIO2 | 1.560491 | 82.3 |
| 4 | 81.561700 | 24.185596 | | | 66.5 |
| 5 | 129.355284 | 38.167801 | SIO2 | 1.560491 | 67.5 |
| 6 | −166.842164 | 0.997639 | | | 65.8 |
| 7 | 73.621253 | 52.812760 | SIO2 | 1.560491 | 55.2 |
| 8 | 87.502326 | 23.343983 | | | 35.4 |
| 9 | −63.355137 | 18.274984 | SIO2 | 1.560491 | 38.4 |
| 10 | −64.795456 | 15.650649 | | | 46.8 |
| 11 | −65.436171 | 11.477841 | SIO2 | 1.560491 | 52.6 |
| 12 | −192.744558 | 16.904355 | | | 69.7 |
| 13 | −246.808133 | 48.828721 | SIO2 | 1.560491 | 85.8 |
| 14 | −107.969356 | 0.997713 | | | 94.9 |
| 15 | −447.790890 | 56.851474 | SIO2 | 1.560491 | 111.1 |
| 16 | −133.844748 | 0.997553 | | | 116.8 |
| 17 | 315.857486 | 38.321196 | SIO2 | 1.560491 | 120.8 |
| 18 | −1923.797869 | 0.996321 | | | 119.7 |
| 19 | 232.932637 | 43.497172 | SIO2 | 1.560491 | 114.0 |
| 20 | −887.954229 | 59.994922 | | | 110.5 |

TABLE 12-continued

| SURF | RADIUS | THICKNESS | MATERIAL | INDEX | SEMIDIAM. |
|---|---|---|---|---|---|
| 21 | 0.000000 | −177.093526 | REFL | | 80.1 |
| 22 | 102.645236 | −12.500000 | SIO2 | 1.560491 | 67.0 |
| 23 | 942.361489 | −43.357484 | | | 77.8 |
| 24 | 90.416551 | −12.500000 | SIO2 | 1.560491 | 79.9 |
| 25 | 149.946360 | −13.736983 | | | 97.4 |
| 26 | 131.782255 | 13.736983 | REFL | | 100.5 |
| 27 | 149.946360 | 12.500000 | SIO2 | 1.560491 | 97.4 |
| 28 | 90.416551 | 43.357484 | | | 79.9 |
| 29 | 942.361489 | 12.500000 | SIO2 | 1.560491 | 77.8 |
| 30 | 102.645236 | 177.093526 | | | 67.0 |
| 31 | 0.000000 | −60.055220 | REFL | | 75.6 |
| 32 | 104914.890260 | −35.073765 | SIO2 | 1.560491 | 98.4 |
| 33 | 219.963934 | −0.997320 | | | 101.4 |
| 34 | −485.974374 | −33.321196 | SIO2 | 1.560491 | 106.4 |
| 35 | 531.348627 | −0.997416 | | | 106.7 |
| 36 | −179.150861 | −35.974078 | SIO2 | 1.560491 | 104.0 |
| 37 | −726.299833 | −0.997789 | | | 101.1 |
| 38 | −143.133378 | −31.466370 | SIO2 | 1.560491 | 92.9 |
| 39 | −333.246416 | −43.619093 | | | 87.4 |
| 40 | 149.805913 | −9.999074 | SIO2 | 1.560491 | 78.6 |
| 41 | −96.090593 | −42.639692 | | | 69.3 |
| 42 | 224.529027 | −9.998160 | SIO2 | 1.560491 | 70.5 |
| 43 | −264.668390 | −13.559760 | | | 81.5 |
| 44 | −938.629305 | −29.640517 | SIO2 | 1.560491 | 87.3 |
| 45 | 304.621140 | −22.447192 | | | 93.1 |
| 46 | −943.485170 | −40.752283 | SIO2 | 1.560491 | 115.1 |
| 47 | 271.215785 | −2.888195 | | | 119.3 |
| 48 | −456.833471 | −43.199885 | SIO2 | 1.560491 | 132.8 |
| 49 | 693.683615 | −0.999609 | | | 133.5 |
| 50 | −281.164030 | −30.395117 | SIO2 | 1.560491 | 132.9 |
| 51 | −613.816799 | −6.979889 | | | 131.4 |
| 52 | 0.000000 | 4.747264 | | | 128.8 |
| 53 | −323.801518 | −45.333595 | SIO2 | 1.560491 | 131.0 |
| 54 | 567.522747 | −0.997957 | | | 129.5 |
| 55 | −227.500831 | −39.940578 | SIO2 | 1.560491 | 115.7 |
| 56 | 2013.736081 | −0.994433 | | | 111.6 |
| 57 | −127.539619 | −33.332450 | SIO2 | 1.560491 | 88.1 |
| 58 | −263.904129 | −0.995386 | | | 79.4 |
| 59 | −186.455700 | −17.466462 | SIO2 | 1.560491 | 75.0 |
| 60 | −223.493619 | −1.000000 | | | 65.7 |
| 61 | −50.654088 | −43.114607 | SIO2 | 1.560491 | 46.1 |
| 62 | 0.000000 | −1.001571 | H2O | 1.436823 | 20.2 |
| 63 | 0.000000 | 0.000000 | | | 18.4 |

TABLE 12A

ASPHERIC CONSTANTS

| | SRF | | | | |
|---|---|---|---|---|---|
| | 6 | 15 | 20 | 23 | 29 |
| K | 0 | 0 | 0 | 0 | 0 |
| C1 | 1.415105E−07 | −3.894450E−08 | 3.025563E−08 | 1.956249E−08 | 1.956249E−08 |
| C2 | 2.826103E−11 | 2.477873E−13 | −9.725078E−13 | −1.254267E−12 | −1.254267E−12 |
| C3 | −2.796060E−15 | −1.083388E−17 | 5.264859E−17 | 9.958049E−17 | 9.958049E−17 |
| C4 | −2.054534E−20 | −9.685453E−22 | −2.790853E−21 | −1.339908E−20 | −1.339908E−20 |
| C5 | 2.141589E−23 | 4.488758E−26 | 1.033038E−25 | 1.243181E−24 | 1.243181E−24 |
| C6 | 2.934466E−27 | −1.114090E−30 | −1.853921E−30 | −1.590289E−29 | −1.590289E−29 |
| | SRF | | | | |
| | 39 | 40 | 42 | 46 | 53 |
| K | 0 | 0 | 0 | 0 | 0 |
| C1 | −2.460699E−08 | −1.818564E−07 | 9.053886E−08 | 2.136533E−08 | 3.430277E−08 |
| C2 | 7.712743E−13 | −5.379726E−12 | −1.959930E−12 | 6.940713E−13 | 2.113104E−13 |
| C3 | −8.069808E−17 | 1.480406E−15 | −3.377347E−17 | −1.785783E−17 | −8.054096E−17 |
| C4 | −5.118403E−22 | −1.519056E−19 | 3.600872E−20 | −1.433861E−21 | 3.084255E−21 |
| C5 | −4.277639E−25 | 1.009523E−23 | −8.476096E−24 | 1.884530E−25 | −3.491487E−26 |
| C6 | 1.160028E−29 | −4.043479E−28 | 3.114715E−28 | −8.828841E−30 | 5.775365E−32 |

TABLE 12A-continued

| | ASPHERIC CONSTANTS | |
|---|---|---|
| | SRF | |
| | 55 | 58 |
| K | 0 | 0 |
| C1 | 2.382259E−08 | 9.580994E−08 |
| C2 | −8.346810E−13 | −3.279417E−11 |
| C3 | 1.015704E−16 | 5.067874E−15 |
| C4 | 5.829694E−22 | −5.784345E−19 |
| C5 | 6.456340E−26 | 4.554897E−23 |
| C6 | −7.406922E−30 | −1.883439E−27 |

TABLE 13

| SURF | RADIUS | THICKNESS | MATERIAL | INDEX | SEMIDIAM. |
|---|---|---|---|---|---|
| 0 | 0.000000 | 35.000921 | | | 64.0 |
| 1 | 187.873268 | 27.994570 | SIO2 | 1.560491 | 84.8 |
| 2 | 1232.241084 | 0.999905 | | | 84.9 |
| 3 | 208.335351 | 22.691065 | SIO2 | 1.560491 | 85.8 |
| 4 | 516.062469 | 36.805573 | | | 84.3 |
| 5 | 144.085611 | 11.684135 | SIO2 | 1.560491 | 79.4 |
| 6 | 104.200976 | 18.908624 | | | 74.4 |
| 7 | 198.091293 | 38.252361 | SIO2 | 1.560491 | 74.7 |
| 8 | −192.861116 | 2.099088 | | | 73.3 |
| 9 | 68.893595 | 56.883996 | SIO2 | 1.560491 | 61.6 |
| 10 | 85.948719 | 33.744342 | | | 40.9 |
| 11 | −114.007614 | 22.821973 | SIO2 | 1.560491 | 45.3 |
| 12 | −76.222967 | 9.221322 | | | 52.2 |
| 13 | −67.210067 | 9.999789 | SIO2 | 1.560491 | 53.7 |
| 14 | −429.663877 | 10.809503 | | | 70.6 |
| 15 | −265.085106 | 43.979820 | SIO2 | 1.560491 | 76.7 |
| 16 | −101.149234 | 0.999957 | | | 85.3 |
| 17 | −188.336349 | 61.381983 | SIO2 | 1.560491 | 94.4 |
| 18 | −125.228059 | 0.999649 | | | 108.4 |
| 19 | −831.599269 | 31.650721 | SIO2 | 1.560491 | 113.5 |
| 20 | −227.778209 | 70.000634 | | | 115.5 |
| 21 | 0.000000 | −10.976723 | REFL | | 113.6 |
| 22 | −197.591390 | −49.195844 | SIO2 | 1.560491 | 114.4 |
| 23 | 1113.814097 | −282.271651 | | | 112.2 |
| 24 | 95.811897 | −12.500000 | SIO2 | 1.560491 | 68.9 |
| 25 | 1585.519591 | −38.490833 | | | 81.2 |
| 26 | 106.142717 | −12.500000 | SIO2 | 1.560491 | 83.5 |
| 27 | 160.434031 | −12.092178 | | | 98.0 |
| 28 | 144.603311 | 12.092178 | REFL | | 101.8 |
| 29 | 160.434031 | 12.500000 | SIO2 | 1.560491 | 98.0 |
| 30 | 106.142717 | 38.490833 | | | 83.5 |
| 31 | 1585.519591 | 12.500000 | SIO2 | 1.560491 | 81.2 |
| 32 | 95.811897 | 282.271651 | | | 68.9 |
| 33 | 1113.814097 | 49.195844 | SIO2 | 1.560491 | 112.2 |
| 34 | −197.591390 | 10.976723 | | | 114.4 |
| 35 | 0.000000 | −70.000758 | REFL | | 113.0 |
| 36 | −227.942708 | −45.666153 | SIO2 | 1.560491 | 113.9 |
| 37 | 815.467694 | −8.857490 | | | 111.9 |
| 38 | −130.706498 | −42.732270 | SIO2 | 1.560491 | 96.7 |
| 39 | −422.473074 | −3.774367 | | | 91.0 |
| 40 | −347.973618 | −10.000122 | SIO2 | 1.560491 | 87.2 |
| 41 | −187.015492 | −26.831797 | | | 79.4 |
| 42 | 305.312838 | −9.999427 | SIO2 | 1.560491 | 77.7 |
| 43 | −96.429310 | −63.819408 | | | 67.9 |
| 44 | 128.506823 | −9.999684 | SIO2 | 1.560491 | 71.4 |
| 45 | −306.117569 | −15.977415 | | | 85.1 |
| 46 | 4806.899558 | −32.925545 | SIO2 | 1.560491 | 89.1 |
| 47 | 230.072868 | −16.329646 | | | 96.4 |
| 48 | 1322.097164 | −30.272168 | SIO2 | 1.560491 | 111.8 |
| 49 | 252.570224 | −1.000013 | | | 117.3 |
| 50 | −862.460198 | −42.042752 | SIO2 | 1.560491 | 133.4 |
| 51 | 448.126973 | −5.878180 | | | 135.8 |
| 52 | −378.669699 | −51.982596 | SIO2 | 1.560491 | 142.6 |
| 53 | 730.087868 | −26.644994 | | | 141.8 |
| 54 | 0.000000 | 0.211836 | | | 130.3 |
| 55 | −454.237341 | −34.638587 | SIO2 | 1.560491 | 132.4 |
| 56 | 896.710905 | −0.999763 | | | 131.1 |
| 57 | −281.292658 | −31.904925 | SIO2 | 1.560491 | 122.1 |
| 58 | −1508.491985 | −0.999650 | | | 118.8 |

TABLE 13-continued

| SURF | RADIUS | THICKNESS | MATERIAL | INDEX | SEMIDIAM. |
|---|---|---|---|---|---|
| 59 | −157.343378 | −32.737319 | SIO2 | 1.560491 | 105.3 |
| 60 | −431.549831 | −0.998214 | | | 98.8 |
| 61 | −227.748250 | −34.282018 | SIO2 | 1.560491 | 96.4 |
| 62 | 1679.133063 | −1.000000 | | | 90.0 |
| 63 | −57.914528 | −47.987219 | SIO2 | 1.560491 | 52.2 |
| 64 | 0.000000 | −3.000000 | H2O | 1.436822 | 24.4 |
| 65 | 0.000000 | 0.000000 | | | 19.0 |

TABLE 13A

ASPHERIC CONSTANTS

| | SRF | | | | |
|---|---|---|---|---|---|
| | 8 | 19 | 22 | 25 | 31 |
| K | 0 | 0 | 0 | 0 | 0 |
| C1 | 8.300393E−08 | −1.573837E−08 | 1.023614E−08 | 2.221568E−08 | 2.221568E−08 |
| C2 | 1.027628E−11 | −1.239737E−13 | 1.645106E−13 | −1.740421E−12 | −1.740421E−12 |
| C3 | −1.162954E−15 | 4.333229E−19 | 5.476658E−18 | 8.521877E−17 | 8.521877E−17 |
| C4 | 2.985096E−19 | 4.074898E−23 | 5.702605E−23 | −2.769929E−21 | −2.769929E−21 |
| C5 | −2.802134E−23 | −1.053291E−26 | 9.144213E−28 | −2.436823E−25 | −2.436823E−25 |
| C6 | 1.422951E−27 | 3.216727E−31 | 2.477447E−32 | 1.867891E−29 | 1.867891E−29 |

| | SRF | | | | |
|---|---|---|---|---|---|
| | 34 | 37 | 39 | 42 | 48 |
| K | 0 | 0 | 0 | 0 | 0 |
| C1 | 1.023614E−08 | −2.156946E−08 | 2.940607E−08 | −4.027138E−08 | 3.236874E−08 |
| C2 | 1.645106E−13 | 7.245612E−13 | −3.554065E−12 | −8.699926E−12 | −3.262283E−13 |
| C3 | 5.476658E−18 | −3.214615E−17 | 2.494890E−15 | 1.342629E−15 | 2.281353E−17 |
| C4 | 5.702605E−23 | 1.250838E−21 | −1.750741E−20 | −1.587155E−19 | 2.583318E−22 |
| C5 | 9.144213E−28 | −3.654841E−26 | 8.304704E−25 | 1.051342E−23 | −8.007782E−27 |
| C6 | 2.477447E−32 | 5.939707E−31 | −4.233041E−29 | −3.667649E−28 | 2.555841E−30 |

| | SRF | | |
|---|---|---|---|
| | 55 | 57 | 60 |
| K | 0 | 0 | 0 |
| C1 | 2.858710E−08 | −6.660513E−09 | −8.504243E−08 |
| C2 | −4.529671E−13 | 1.798520E−13 | 9.820443E−13 |
| C3 | −2.789924E−17 | 8.149876E−17 | −5.540310E−17 |
| C4 | 2.259110E−21 | −5.213396E−22 | 1.576819E−20 |
| C5 | −7.536599E−26 | −1.301705E−27 | −9.640368E−25 |
| C6 | 9.633331E−31 | −5.575917E−31 | 1.171801E−29 |

TABLE 15

| SURF | RADIUS | THICKNESS | MATERIAL | INDEX | SEMIDIAM. |
|---|---|---|---|---|---|
| 0 | 0.000000 | 35.638328 | | | 64.5 |
| 1 | 180.670546 | 28.377083 | SIO2 | 1.560491 | 86.9 |
| 2 | 823.598018 | 1.194225 | | | 86.9 |
| 3 | 205.952639 | 21.462318 | SIO2 | 1.560491 | 87.9 |
| 4 | 398.186838 | 32.742116 | | | 86.4 |
| 5 | 132.286925 | 9.999671 | SIO2 | 1.560491 | 82.8 |
| 6 | 105.118100 | 22.332626 | | | 78.4 |
| 7 | 169.334381 | 39.894990 | SIO2 | 1.560491 | 78.9 |
| 8 | −204.634515 | 0.998375 | | | 77.3 |
| 9 | 71.137197 | 56.763393 | SIO2 | 1.560491 | 63.5 |
| 10 | 89.028585 | 28.411826 | | | 42.3 |
| 11 | −109.689407 | 29.990063 | SIO2 | 1.560491 | 42.5 |
| 12 | −79.244543 | 11.316478 | | | 52.9 |
| 13 | −69.719014 | 9.999481 | SIO2 | 1.560491 | 55.1 |
| 14 | −486.086468 | 8.908815 | | | 72.6 |
| 15 | −280.858669 | 63.675056 | SIO2 | 1.560491 | 77.0 |
| 16 | −111.752476 | 0.999172 | | | 95.1 |
| 17 | −263.723959 | 47.422516 | SIO2 | 1.560491 | 107.8 |
| 18 | −134.607968 | 0.998507 | | | 113.2 |
| 19 | −648.995845 | 28.867753 | SIO2 | 1.560491 | 116.3 |
| 20 | −239.623615 | 69.998695 | | | 118.1 |

TABLE 15-continued

| SURF | RADIUS | THICKNESS | MATERIAL | INDEX | SEMIDIAM. |
|---|---|---|---|---|---|
| 21 | 0.000000 | −9.999382 | REFL | | 115.6 |
| 22 | −176.982011 | −52.138664 | SIO2 | 1.560491 | 117.7 |
| 23 | 2325.743514 | −250.507300 | | | 115.3 |
| 24 | 98.260574 | −12.500000 | SIO2 | 1.560491 | 68.0 |
| 25 | 8846.828964 | −46.770944 | | | 78.6 |
| 26 | 91.149491 | −12.500000 | SIO2 | 1.560491 | 80.6 |
| 27 | 149.955261 | −18.614447 | | | 98.7 |
| 28 | 143.121066 | 18.614447 | REFL | | 106.4 |
| 29 | 149.955261 | 12.500000 | SIO2 | 1.560491 | 98.7 |
| 30 | 91.149491 | 46.770944 | | | 80.6 |
| 31 | 8846.828964 | 12.500000 | SIO2 | 1.560491 | 78.6 |
| 32 | 98.260574 | 250.507300 | | | 68.0 |
| 33 | 2325.743514 | 52.138664 | SIO2 | 1.560491 | 115.3 |
| 34 | −176.982011 | 9.999382 | | | 117.7 |
| 35 | 0.000000 | −69.999093 | REFL | | 117.4 |
| 36 | −198.540813 | −50.399536 | SIO2 | 1.560491 | 120.7 |
| 37 | −96842.830748 | −0.998438 | | | 118.2 |
| 38 | −171.973861 | −30.749387 | SIO2 | 1.560491 | 106.4 |
| 39 | −310.515975 | −0.999047 | | | 100.9 |
| 40 | −148.789628 | −29.674304 | SIO2 | 1.560491 | 92.9 |
| 41 | −216.223375 | −29.457017 | | | 83.9 |
| 42 | 244.105965 | −9.998957 | SIO2 | 1.560491 | 81.6 |
| 43 | −94.244903 | −51.985700 | | | 68.7 |
| 44 | 177.704589 | −9.999140 | SIO2 | 1.560491 | 70.5 |
| 45 | −255.547186 | −23.809565 | | | 80.1 |
| 46 | 1016.476754 | −31.174795 | SIO2 | 1.560491 | 85.3 |
| 47 | 185.094367 | −0.999190 | | | 93.0 |
| 48 | 1691.382932 | −25.547970 | SIO2 | 1.560491 | 105.3 |
| 49 | 356.397350 | −45.184652 | | | 109.5 |
| 50 | −673.758971 | −45.536220 | SIO2 | 1.560491 | 137.5 |
| 51 | 386.080342 | −0.998330 | | | 139.3 |
| 52 | −725.704793 | −34.052538 | SIO2 | 1.560491 | 143.2 |
| 53 | 1177.576128 | −20.729220 | | | 143.2 |
| 54 | 0.000000 | 19.731628 | | | 138.3 |
| 55 | −296.953200 | −49.211938 | SIO2 | 1.560491 | 142.1 |
| 56 | 755.844934 | −0.996608 | | | 140.3 |
| 57 | −413.530408 | −40.022653 | SIO2 | 1.560491 | 135.6 |
| 58 | 728.550434 | −0.994509 | | | 133.1 |
| 59 | −253.678570 | −33.049432 | SIO2 | 1.560491 | 114.4 |
| 60 | −3840.733691 | −0.992017 | | | 108.6 |
| 61 | −147.857222 | −36.663873 | SIO2 | 1.560491 | 91.0 |
| 62 | −727.362791 | −1.000000 | | | 82.4 |
| 63 | −54.588882 | −41.518373 | SIO2 | 1.560491 | 49.4 |
| 64 | 0.000000 | −3.000000 | H2O | 1.436822 | 25.6 |
| 65 | 0.000000 | 0.000000 | | | 19.1 |

TABLE 15A

ASPHERIC CONSTANTS

| | \multicolumn{5}{c}{SRF} |
|---|---|---|---|---|---|
| | 8 | 19 | 22 | 25 | 31 |
| K  | 0 | 0 | 0 | 0 | 0 |
| C1 | 1.080775E−07 | −1.359371E−08 | 1.195268E−08 | 1.894952E−08 | 1.894952E−08 |
| C2 | 4.576422E−12 | −1.179706E−13 | 3.137653E−13 | −2.377925E−12 | −2.377925E−12 |
| C3 | −8.540180E−16 | −1.702891E−18 | 4.990292E−18 | 2.890682E−16 | 2.890682E−16 |
| C4 | 2.711292E−19 | 8.483261E−23 | 5.081387E−22 | −5.626586E−20 | −5.626586E−20 |
| C5 | −3.150111E−23 | −9.645405E−27 | −1.599365E−26 | 6.907483E−24 | 6.907483E−24 |
| C6 | 1.652368E−27 | 2.669817E−31 | 6.313609E−31 | −3.643846E−28 | −3.643846E−28 |

| | \multicolumn{5}{c}{SRF} |
|---|---|---|---|---|---|
| | 34 | 42 | 46 | 48 | 51 |
| K  | 0 | 0 | 0 | 0 | 0 |
| C1 | 1.195268E−08 | −5.071114E−08 | 2.526230E−08 | 1.948430E−08 | −7.924272E−09 |
| C2 | 3.137653E−13 | −7.730551E−12 | 5.333528E−12 | −3.427570E−12 | −2.800312E−13 |
| C3 | 4.990292E−18 | 1.390231E−15 | −2.388835E−16 | 8.808674E−17 | −1.107739E−18 |
| C4 | 5.081387E−22 | −1.451491E−19 | 1.259420E−20 | −8.959654E−22 | −6.249802E−22 |
| C5 | −1.599365E−26 | 9.288570E−24 | −1.438626E−24 | 8.169992E−25 | 3.539057E−26 |
| C6 | 6.313609E−31 | −2.767389E−28 | 4.673358E−29 | −4.150555E−29 | −3.955788E−31 |

TABLE 15A-continued

| | ASPHERIC CONSTANTS | | |
|---|---|---|---|
| | SRF | | |
| | 56 | 57 | 60 |
| K | 0 | 0 | 0 |
| C1 | −5.185154E−08 | 2.760546E−08 | 2.284067E−09 |
| C2 | 1.533838E−12 | −1.425919E−12 | −5.023236E−12 |
| C3 | −3.899899E−17 | 4.438919E−17 | 4.371011E−16 |
| C4 | 2.974803E−21 | 1.556484E−21 | −3.186523E−20 |
| C5 | −1.127749E−25 | −7.877661E−26 | 1.530451E−24 |
| C6 | 1.290864E−30 | 3.875637E−31 | −3.713691E−29 |

TABLE 16

| SURF | RADIUS | THICKNESS | MATERIAL | INDEX | SEMIDIAM. |
|---|---|---|---|---|---|
| 0 | 0.000000 | 35.000018 | | | 61.5 |
| 1 | 176.014829 | 27.505489 | SIO2 | 1.560491 | 83.2 |
| 2 | 841.641338 | 3.539440 | | | 83.3 |
| 3 | 235.708002 | 18.995896 | SIO2 | 1.560491 | 84.2 |
| 4 | 435.386108 | 31.751453 | | | 83.2 |
| 5 | 145.827863 | 9.997737 | SIO2 | 1.560491 | 81.5 |
| 6 | 108.756276 | 21.241416 | | | 77.5 |
| 7 | 172.246858 | 43.116768 | SIO2 | 1.560491 | 78.7 |
| 8 | −170.835113 | 1.011739 | | | 77.5 |
| 9 | 69.519772 | 62.982649 | SIO2 | 1.560491 | 62.1 |
| 10 | 79.357512 | 24.125307 | | | 37.1 |
| 11 | −105.554185 | 28.151777 | SIO2 | 1.560491 | 40.1 |
| 12 | −75.432491 | 8.970185 | | | 50.0 |
| 13 | −65.960377 | 9.998436 | SIO2 | 1.560491 | 51.6 |
| 14 | −458.378416 | 15.879266 | | | 68.1 |
| 15 | −182.010566 | 40.279435 | SIO2 | 1.560491 | 74.6 |
| 16 | −98.619683 | 0.998823 | | | 84.4 |
| 17 | −298.466841 | 53.135226 | SIO2 | 1.560491 | 100.4 |
| 18 | −121.383228 | 0.999120 | | | 106.3 |
| 19 | −835.480319 | 32.135277 | SIO2 | 1.560491 | 109.9 |
| 20 | −214.880198 | 81.470423 | | | 111.6 |
| 21 | 0.000000 | −104.650759 | REFL | | 105.0 |
| 22 | −181.003736 | −50.001353 | SIO2 | 1.560491 | 108.2 |
| 23 | 25242.924145 | −247.127318 | | | 104.9 |
| 24 | 102.272953 | −12.500000 | SIO2 | 1.560491 | 70.6 |
| 25 | 2103.060508 | −45.023548 | | | 79.1 |
| 26 | 93.409938 | −12.500000 | SIO2 | 1.560491 | 81.3 |
| 27 | 183.538848 | −17.774476 | | | 102.5 |
| 28 | 145.905578 | 17.774476 | REFL | | 106.5 |
| 29 | 183.538848 | 12.500000 | SIO2 | 1.560491 | 102.5 |
| 30 | 93.409938 | 45.023548 | | | 81.3 |
| 31 | 2103.060508 | 12.500000 | SIO2 | 1.560491 | 79.1 |
| 32 | 102.272953 | 247.127318 | | | 70.6 |
| 33 | 25242.924145 | 50.001353 | SIO2 | 1.560491 | 104.9 |
| 34 | −181.003736 | 104.650759 | | | 108.2 |
| 35 | 0.000000 | −69.997840 | REFL | | 105.8 |
| 36 | −274.353554 | −38.229015 | SIO2 | 1.560491 | 110.1 |
| 37 | 1131.690506 | −0.997876 | | | 108.9 |
| 38 | −183.833011 | −33.580596 | SIO2 | 1.560491 | 101.6 |
| 39 | −632.386130 | −3.643030 | | | 97.6 |
| 40 | −138.532192 | −34.568737 | SIO2 | 1.560491 | 86.8 |
| 41 | −189.656554 | −26.890307 | | | 75.9 |
| 42 | 255.989593 | −9.998587 | SIO2 | 1.560491 | 73.9 |
| 43 | −92.462677 | −50.122191 | | | 64.9 |
| 44 | 175.417954 | −9.998324 | SIO2 | 1.560491 | 68.1 |
| 45 | −239.557458 | −20.895117 | | | 78.3 |
| 46 | 893.327075 | −36.743354 | SIO2 | 1.560491 | 83.5 |
| 47 | 180.351521 | −1.580032 | | | 92.3 |
| 48 | 1793.077203 | −23.224027 | SIO2 | 1.560491 | 102.7 |
| 49 | 346.025735 | −46.740042 | | | 107.1 |
| 50 | −587.720308 | −49.840882 | SIO2 | 1.560491 | 138.2 |
| 51 | 362.715565 | −0.996413 | | | 139.9 |
| 52 | −802.776800 | −32.541316 | SIO2 | 1.560491 | 143.2 |
| 53 | 1200.879163 | −20.610535 | | | 143.1 |
| 54 | 0.000000 | 19.614848 | | | 138.0 |
| 55 | −277.707719 | −52.291236 | SIO2 | 1.560491 | 141.8 |
| 56 | 708.666176 | −0.995494 | | | 139.7 |
| 57 | −424.462858 | −35.408449 | SIO2 | 1.560491 | 134.6 |
| 58 | 920.517618 | −0.994818 | | | 131.9 |

TABLE 16-continued

| SURF | RADIUS | THICKNESS | MATERIAL | INDEX | SEMIDIAM. |
|---|---|---|---|---|---|
| 59 | −257.650413 | −33.302544 | SIO2 | 1.560491 | 115.0 |
| 60 | −3892.659133 | −0.993481 | | | 109.3 |
| 61 | −150.518437 | −37.001664 | SIO2 | 1.560491 | 91.7 |
| 62 | −815.328045 | −1.000000 | | | 83.2 |
| 63 | −54.709895 | −42.146539 | SIO2 | 1.560491 | 49.5 |
| 64 | 0.000000 | −3.000000 | H2O | 1.436822 | 24.8 |
| 65 | 0.000000 | 0.000000 | | | 18.4 |

TABLE 16A

ASPHERIC CONSTANTS

| | SRF | | | | |
|---|---|---|---|---|---|
| | 8 | 19 | 22 | 25 | 31 |
| K | 0 | 0 | 0 | 0 | 0 |
| C1 | 9.477707E−08 | −1.630325E−08 | 8.446555E−09 | 3.545371E−09 | 3.545371E−09 |
| C2 | 1.961231E−12 | −9.812446E−14 | 2.275492E−13 | −6.774437E−13 | −6.774437E−13 |
| C3 | −4.595943E−16 | −1.945238E−18 | −8.360514E−19 | 4.237596E−17 | 4.237596E−17 |
| C4 | 2.712352E−19 | 2.190264E−22 | 1.164424E−21 | −5.726376E−21 | −5.726376E−21 |
| C5 | −3.717129E−23 | −2.392299E−26 | −6.873389E−26 | 1.719638E−25 | 1.719638E−25 |
| C6 | 2.062145E−27 | 8.993812E−31 | 2.030241E−30 | 1.264086E−29 | 1.264086E−29 |

| | SRF | | | | |
|---|---|---|---|---|---|
| | 34 | 42 | 46 | 48 | 51 |
| K | 0 | 0 | 0 | 0 | 0 |
| C1 | 8.446555E−09 | −3.731377E−08 | −7.541203E−09 | 3.402805E−08 | −7.582220E−09 |
| C2 | 2.275492E−13 | −5.506103E−12 | 3.280912E−12 | −2.111476E−12 | −1.607342E−13 |
| C3 | −8.360514E−19 | 1.183283E−15 | −1.338960E−16 | 3.392400E−17 | −9.929315E−18 |
| C4 | 1.164424E−21 | −1.705010E−19 | −2.204551E−20 | −3.518123E−21 | −4.709955E−22 |
| C5 | −6.873389E−26 | 1.532771E−23 | 5.087511E−26 | 1.006578E−24 | 4.064977E−26 |
| C6 | 2.030241E−30 | −6.241836E−28 | −4.751065E−28 | −2.276157E−29 | −5.868799E−31 |

| | SRF | | |
|---|---|---|---|
| | 56 | 57 | 60 |
| K | 0 | 0 | 0 |
| C1 | −5.466505E−08 | 3.173474E−08 | 4.604026E−09 |
| C2 | 1.620583E−12 | −1.360966E−12 | −4.261817E−12 |
| C3 | −3.331287E−17 | 4.744992E−17 | 3.289463E−16 |
| C4 | 2.561164E−21 | 9.163771E−22 | −2.280425E−20 |
| C5 | −1.070898E−25 | −7.066436E−26 | 9.960289E−25 |
| C6 | 1.395421E−30 | 7.159877E−31 | −2.271390E−29 |

TABLE 17

| SURF | RADIUS | THICKNESS | MATERIAL | INDEX | SEMIDIAM. |
|---|---|---|---|---|---|
| 0 | 0.000000 | 35.062171 | | | 61.5 |
| 1 | 160.377892 | 33.915692 | SIO2 | 1.560491 | 85.2 |
| 2 | 4339.545820 | 35.211752 | | | 85.0 |
| 3 | 134.501543 | 9.996831 | SIO2 | 1.560491 | 83.7 |
| 4 | 111.692176 | 24.343835 | | | 80.0 |
| 5 | 176.022408 | 44.412851 | SIO2 | 1.560491 | 81.0 |
| 6 | −158.125766 | 1.097941 | | | 79.5 |
| 7 | 70.127955 | 63.281412 | SIO2 | 1.560491 | 62.6 |
| 8 | 80.899024 | 23.149420 | | | 37.4 |
| 9 | −104.439732 | 28.493683 | SIO2 | 1.560491 | 39.7 |
| 10 | −76.691544 | 9.373106 | | | 50.2 |
| 11 | −66.201313 | 9.999364 | SIO2 | 1.560491 | 51.9 |
| 12 | −449.321456 | 12.356383 | | | 69.1 |
| 13 | −193.830863 | 41.850652 | SIO2 | 1.560491 | 73.7 |
| 14 | −96.808240 | 0.997395 | | | 83.6 |
| 15 | −309.193570 | 53.879882 | SIO2 | 1.560491 | 100.4 |
| 16 | −121.506051 | 0.996721 | | | 106.4 |
| 17 | −1347.934891 | 32.667851 | SIO2 | 1.560491 | 110.7 |
| 18 | −232.958167 | 69.997839 | | | 112.2 |
| 19 | 0.000000 | −95.009945 | REFL | | 106.8 |
| 20 | −169.601782 | −49.964697 | SIO2 | 1.560491 | 108.4 |

TABLE 17-continued

| SURF | RADIUS | THICKNESS | MATERIAL | INDEX | SEMIDIAM. |
|---|---|---|---|---|---|
| 21 | −2559.597028 | −244.909101 | | | 104.7 |
| 22 | 94.645450 | −12.500000 | SIO2 | 1.560491 | 70.0 |
| 23 | 2366.726589 | −50.185589 | | | 83.9 |
| 24 | 96.645650 | −12.500000 | SIO2 | 1.560491 | 86.5 |
| 25 | 158.153978 | −11.143815 | | | 106.9 |
| 26 | 150.128583 | 11.143815 | REFL | | 111.0 |
| 27 | 158.153978 | 12.500000 | SIO2 | 1.560491 | 106.9 |
| 28 | 96.645650 | 50.185589 | | | 86.5 |
| 29 | 2366.726589 | 12.500000 | SIO2 | 1.560491 | 83.9 |
| 30 | 94.645450 | 244.909101 | | | 70.0 |
| 31 | −2559.597028 | 49.964697 | SIO2 | 1.560491 | 104.7 |
| 32 | −169.601782 | 95.009945 | | | 108.4 |
| 33 | 0.000000 | −69.996314 | REFL | | 106.9 |
| 34 | −281.792007 | −41.385881 | SIO2 | 1.560491 | 110.8 |
| 35 | 657.889902 | −0.997396 | | | 109.7 |
| 36 | −174.312217 | −32.438650 | SIO2 | 1.560491 | 100.1 |
| 37 | −476.477690 | −1.935634 | | | 95.7 |
| 38 | −123.498799 | −34.625674 | SIO2 | 1.560491 | 85.0 |
| 39 | −152.214034 | −29.454227 | | | 73.4 |
| 40 | 230.398053 | −9.988522 | SIO2 | 1.560491 | 71.5 |
| 41 | −84.263230 | −42.301978 | | | 62.8 |
| 42 | 148.358426 | −9.995751 | SIO2 | 1.560491 | 64.2 |
| 43 | −285.965468 | −29.500257 | | | 76.2 |
| 44 | 1365.214672 | −52.201213 | SIO2 | 1.560491 | 91.3 |
| 45 | 197.964169 | −1.405485 | | | 110.1 |
| 46 | 471.452295 | −43.072393 | SIO2 | 1.560491 | 120.4 |
| 47 | 209.873148 | −1.120291 | | | 130.5 |
| 48 | −1186.156898 | −60.630783 | SIO2 | 1.560491 | 155.2 |
| 49 | 325.015642 | −0.999174 | | | 157.9 |
| 50 | −2211.880008 | −27.251892 | SIO2 | 1.560491 | 162.5 |
| 51 | 1353.381133 | −0.997683 | | | 163.0 |
| 52 | −333.578758 | −60.245043 | SIO2 | 1.560491 | 162.7 |
| 53 | 664.853013 | −3.960500 | | | 160.4 |
| 54 | 0.000000 | 2.974292 | | | 153.2 |
| 55 | −436.081909 | −40.203050 | SIO2 | 1.560491 | 152.1 |
| 56 | 1058.418471 | −0.974875 | | | 149.3 |
| 57 | −242.988440 | −46.663567 | SIO2 | 1.560491 | 127.0 |
| 58 | 1737.489827 | −0.944194 | | | 120.7 |
| 59 | −113.935104 | −37.162408 | SIO2 | 1.560491 | 86.5 |
| 60 | −237.094762 | −1.000000 | | | 75.1 |
| 61 | −53.008742 | −37.444181 | SIO2 | 1.560491 | 48.1 |
| 62 | 0.000000 | −3.000000 | H2O | 1.436823 | 26.7 |
| 63 | 0.000000 | 0.000000 | | | 18.4 |

TABLE 17A

ASPHERIC CONSTANTS

| | SRF | | | | |
|---|---|---|---|---|---|
| | 6 | 17 | 20 | 23 | 29 |
| K | 0 | 0 | 0 | 0 | 0 |
| C1 | 1.567356E−07 | −1.504554E−08 | 1.102741E−08 | 1.329977E−08 | 1.329977E−08 |
| C2 | −1.454311E−12 | −1.033827E−13 | 3.161475E−13 | −6.446967E−13 | −6.446967E−13 |
| C3 | −4.821299E−16 | −5.875858E−18 | −3.234527E−18 | 2.574587E−17 | 2.574587E−17 |
| C4 | 3.177351E−19 | 7.367131E−22 | 1.863348E−21 | 2.145483E−21 | 2.145483E−21 |
| C5 | −4.247779E−23 | −5.690740E−26 | −1.058278E−25 | −6.859442E−25 | −6.859442E−25 |
| C6 | 2.417313E−27 | 1.690737E−30 | 3.288177E−30 | 4.363205E−29 | 4.363205E−29 |

| | SRF | | | | |
|---|---|---|---|---|---|
| | 32 | 40 | 44 | 46 | 49 |
| K | 0 | 0 | 0 | 0 | 0 |
| C1 | 1.102741E−08 | −7.623733E−08 | 5.961950E−08 | 4.163425E−08 | 1.556511E−08 |
| C2 | 3.161475E−13 | −2.696128E−12 | 2.260719E−12 | −2.205874E−12 | −9.513867E−13 |
| C3 | −3.234527E−18 | 1.720996E−15 | 1.675440E−17 | −2.145810E−18 | 1.334037E−17 |
| C4 | 1.863348E−21 | −3.583626E−19 | 9.620913E−21 | −9.265446E−21 | −6.577842E−22 |
| C5 | −1.058278E−25 | 3.893269E−23 | −4.439958E−24 | 1.471307E−24 | 4.785308E−26 |
| C6 | 3.288177E−30 | −1.781650E−27 | −3.165933E−29 | −4.599952E−29 | −1.010940E−30 |

TABLE 17A-continued

ASPHERIC CONSTANTS

| | SRF | | |
|---|---|---|---|
| | 53 | 55 | 58 |
| K | 0 | 0 | 0 |
| C1 | −4.190276E−08 | 3.093715E−08 | 6.193974E−09 |
| C2 | 1.643663E−12 | −1.212659E−12 | −3.507726E−12 |
| C3 | −4.727323E−17 | 4.234860E−17 | 2.841523E−16 |
| C4 | 7.314393E−22 | −1.652445E−21 | −1.871154E−20 |
| C5 | 7.386195E−27 | 5.642952E−26 | 7.577332E−25 |
| C6 | −2.389707E−31 | −7.153949E−31 | −1.502450E−29 |

TABLE 18

| Tab. | $D_{max}$ | $D_M$ | $D_M/D_{max}$ | Y' | NA | $N_L$ | $N_{OP}$ | COMP1 | COMP2 | COMP3 |
|---|---|---|---|---|---|---|---|---|---|---|
| 1 | 256.8 | 235.2 | 0.92 | 14.4 | 1.2 | 23 | 3 | 12.4 | 284.5 | 94.8 |
| 3 | 252.9 | 243.3 | 0.96 | 14.4 | 1.1 | 25 | 3 | 14.5 | 362.4 | 120.8 |
| 9 | 270.6 | 230.6 | 0.85 | 16.0 | 1.2 | 28 | 3 | 11.7 | 328.9 | 109.6 |
| 10 | 277.8 | 236.4 | 0.85 | 16.0 | 1.2 | 28 | 3 | 12.1 | 337.6 | 112.5 |
| 11 | 293.4 | 197.4 | 0.67 | 16.0 | 1.3 | 27 | 3 | 10.9 | 293.0 | 97.7 |
| 12 | 267.0 | 201.0 | 0.75 | 16.0 | 1.25 | 27 | 3 | 10.7 | 288.4 | 96.1 |
| 13 | 285.2 | 203.6 | 0.71 | 16.0 | 1.25 | 27 | 3 | 11.4 | 308.0 | 102.7 |
| 15 | 286.4 | 212.8 | 0.74 | 16.1 | 1.3 | 27 | 3 | 10.5 | 283.8 | 94.6 |
| 16 | 286.4 | 213.0 | 0.74 | 15.4 | 1.3 | 27 | 3 | 11.0 | 297.6 | 99.2 |
| 17 | 326.0 | 222.0 | 0.68 | 15.4 | 1.35 | 26 | 3 | 11.6 | 302.5 | 100.8 |

What is claimed is:

1. A catadioptric projection objective for imaging a pattern, which is arranged on an object plane of the projection objective, on an image plane of the projection objective, comprising:
a first objective part imaging an object field to form a first real intermediate image,
a second objective part forming a second real intermediate image using the radiation coming from the first objective part; and
a third objective part imaging the second real intermediate image on the image plane; wherein
the second objective part is a catadioptric objective part with a concave mirror;
a first folding mirror deflecting the radiation from the object plane in the direction of the concave mirror and a second folding mirror deflecting the radiation from the concave mirror in the direction of the image plane are provided; and
a field lens with a positive refractive power is arranged between the first real intermediate image and the concave mirror, in a region close to the field of the first real intermediate image.

2. The projection objective as claimed in claim 1, wherein the field lens is arranged in an optical vicinity of at least one of the first and second real intermediate images in a region in which a chief ray height of the image is large in comparison to a marginal ray height.

3. The projection objective as claimed in claim 1, wherein the field lens is a single lens.

4. The projection objective as claimed in claim 1, wherein the field lens is arranged closer to the first folding mirror than to the concave mirror.

5. The projection objective as claimed in claim 1, wherein field lens with positive refractive power is arranged geometrically between the concave mirror and either of the first and second folding mirrors in a region through which the beam passes twice, in such a manner that a first lens area of the field lens is arranged in the beam path between the object plane and the concave mirror, and a second lens area of the field lens is arranged in the beam path between the concave mirror and the image plane.

6. The projection objective as claimed in claim 1, wherein the field lens is arranged in the optical vicinity of the first real intermediate image, which is located in the beam path upstream from the concave mirror, and in the optical vicinity of the second real intermediate image, which is located in the beam path downstream from the concave mirror.

7. The projection objective as claimed in claim 1, wherein the field lens is arranged in a region through which the beam passes twice and has a first lens area, through which the beam passes in a first direction, and a second lens area, through which the beam passes in a second direction, with the first lens area and the second lens area not overlapping one another, at least on one side of the field lens.

8. The projection objective as claimed in claim 1, wherein the projection objective has an image-side numerical aperture of NA>0.85, and an image-side working distance of A≦10 mm.

9. The projection objective as claimed in claim 8, wherein the image-side working distance is between about 1 mm and about 8 mm.

10. The projection objective as claimed in claim 1, configured as an immersion objective such that an immersion medium with a high refractive index is introduced between an exit surface of the projection objective and an incoupling surface of thea substrate during operation.

11. The projection objective as claimed in claim 10, wherein the immersion medium has a refractive index of $n_I$>1.3 at an operating wavelength of the projection objective.

12. The projection objective as claimed in claim 10, which has an image-side numerical aperture of NA≧1 in conjunction with the immersion medium.

13. The projection objective as claimed in claim 12, wherein the numerical aperture is NA≧1.2.

14. The projection objective as claimed in claim 1, which has exactly two real intermediate images.

15. The projection objective as claimed in claim 1, wherein the first and second real intermediate images are arranged in a vicinity of a folding mirror.

16. The projection objective as claimed in claim 1, wherein all of the intermediate images are arranged at a distance from a folding mirror.

17. The projection objective as claimed in claim 1, wherein the third objective part is refractive.

18. The projection objective as claimed in claim 17, wherein the third objective part has a first lens group which follows the second real intermediate image and has a positive refractive power, a second lens group, which immediately follows the first lens group and has a negative refractive power, a third lens group which immediately follows the second lens group and has a positive refractive power, a fourth lens group which immediately follows the third lens group and has a positive refractive power, and a system diaphragm which is arranged in a transitional region from the third lens group to the fourth lens group.

19. The projection objective as claimed in claim 18, wherein the third lens group has an entry surface which is located in a vicinity of a point of inflection of a marginal ray height between the second lens group and the third lens group, with no negative lens with any substantial refractive power being arranged between the entry surface and the system diaphragm.

20. The projection objective as claimed in claim 19, wherein only positive lenses are arranged between the entry surface and the image plane.

21. The projection objective as claimed in claim 1, wherein a last optical element of the projection objective immediately upstream of the image plane is a plano-convex lens composed of calcium fluoride with a curved entry surface and an essentially planar exit surface.

22. The projection objective as claimed in claim 1, wherein at least one folding mirror is provided in the first objective part, such that the optical axis is folded at least once within the first objective part.

23. The projection objective as claimed in claim 1, wherein a folding mirror is arranged within at least one of the objective parts in-such a manner that a field lens is arranged between the folding mirror and an intermediate image which is located closest to the folding mirror.

24. The projection objective as claimed in claim 1, wherein two of the objective parts are catadioptric, and each contains one concave mirror.

25. The projection objective as claimed in claim 1, wherein the first objective part is a catadioptric objective part with a concave mirror and an associated folding mirror, which is used as the first folding mirror.

26. The projection objective as claimed in claim 1, wherein the folding mirrors are arranged such that a first beam section, which runs from the object plane to the concave mirror and a second beam section, which runs from the concave mirror to the image plane are generated, and one folding mirror is arranged with respect to the concave mirror such that one of the beam sections is folded on the folding mirror and the other beam section passes the folding mirror without any vignetting, and the first beam section and the second beam section cross over in a crossing area.

27. The projection objective as claimed in claim 26, wherein the first folding mirror is arranged such that the first beam section is folded on the first folding mirror, and the second beam section passes the first folding mirror without any vignetting.

28. The projection objective as claimed in claim 1, which has a catadioptric objective part that has a concave mirror and the first folding mirror, which is associated with the concave mirror, for deflecting the radiation coming from the object plane to the concave mirror,
wherein the second folding mirror is provided for deflecting the radiation reflected from the concave mirror to the image plane, and the second folding mirror is at least partially located in an axial region which is located between the object plane and the first folding mirror in the direction of the optical axis.

29. The projection objective as claimed in claim 1, wherein the first folding mirror has an inner mirror edge which is close to the optical axis, and an intermediate image is arranged in the geometric vicinity of the inner mirror edge.

30. The projection objective as claimed in claim 1, which is designed for ultraviolet light from a wavelength range between about 120 nm and about 260 nm.

31. A projection exposure system for microlithography comprising an illumination system and
the catadioptric projection objective as claimed in claim 1.

32. A method for producing at least one of semiconductor components and other finely structured components, comprising:
providing a mask with a predetermined pattern in a region of the object plane of the catadioptric projection objective according to claim 1;
illuminating the mask with ultraviolet light at a predetermined wavelength; and
projecting an image of the pattern onto a light-sensitive substrate, which is arranged in the region of the image plane of the projection objective.

33. The method according to claim 32
wherein, during projecting, the beam passes through an immersion medium which is arranged between a last optical surface of the projection objective and the substrate.

34. The projection objective according to claim 1, wherein a lateral axis offset AO is defined between a first part of the optical axis defined by the first objective part and a second part of the optical axis defined by the second objective part and aligned parallel to the first part of the optical axis,
an object-image-shift OIS is defined between an object field center and an image field center,
a finite object center height h is defined as a lateral distance between the object field center of an effective object field and the first part of the optical axis,
the projection objective has a magnification ratio β,
and wherein the following condition holds:

$$0 \leq OIS \leq |h \cdot (1+|\beta|)|.$$

35. The projection objective according to claim 34, wherein the condition OIS=0 holds.

36. The projection objective according to claim 1, wherein a refractive power and a position of the field lens is set such that for a first chief ray direction cosine CRA1 at the first real intermediate image the following relation holds:

$$|CRA1| < |\beta_1 * (Y_{OB})/(L_{HOA})|$$

where $\beta_1$ denotes a magnification of the first objective part,
$Y_{OB}$ is an object height of an outermost field point for which a chief ray is considered and
$L_{HOA}$ is a geometrical distance from the first real intermediate image to the concave mirror, which is a length of the horizontal axis.

37. The projection objective according to claim 1, wherein a first chief ray direction cosine CRA1 at the first real intermediate image and a second chief ray direction cosine CRA2 at a second intermediate image is defined and wherein the following conditions are fulfilled:

$$|CRA1| < |\beta_1 * (Y_{OB})/(L_{HOA})|$$

$$|CRA2| < |\beta_1 * (Y_{OB})/(L_{HOA})|$$

where $\beta_1$ denotes a magnification of the first objective part, $Y_{OB}$ is an object height of an outermost field point for which a chief ray is considered and
$L_{HOA}$ is a geometrical distance from the first real intermediate image to the concave mirror, which is a length of the horizontal axis.

38. The projection objective according to claim 1, wherein a first axial length AL1 of the first objective part is smaller than a third axial length AL3 of the third objective part, wherein the axial length AL1 is measured between the object plane and an intersection of the optical axis with the first folding mirror and the axial length AL3 is measured between the intersection of the optical axis with the second folding mirror and the image plane.

39. The projection objective according to claim 38, wherein the condition AL1/AL3<0.9 holds.

40. The projection objective according to claim 1, wherein an intermediate image is extended axially in an intermediate image space defined between a position of a paraxial intermediate image and an axial position of a marginal ray intermediate image and where no optical surface is positioned within the intermediate image space.

41. The projection objective as claimed in claim 1, wherein the projection objective forms no more intermediate images than the first and second real intermediate images.

42. The projection objective as claimed in claim 1, wherein the projection objective comprises exactly one concave mirror.

* * * * *

UNITED STATES PATENT AND TRADEMARK OFFICE
CERTIFICATE OF CORRECTION

PATENT NO. : 8,107,162 B2
APPLICATION NO. : 11/596868
DATED : January 31, 2012
INVENTOR(S) : Aurelian Dodoc, Wilhelm Ulrich and Alexander Epple It is certified that error appears in the above-identified patent and that said Letters Patent is hereby corrected as shown below:

In the Specifications

Column 21, line 14: delete "Petzvalsum" and insert -- Petzval sum --, therefor

Column 26, line 1 (adjacent to Surface no. 31 Table 2): delete "No..33" and insert -- No. 33 --, therefor Column 29, line 1 (adjacent to Surface no. 31 Table 4): delete "No..33" and insert -- No. 33 --, therefor Column 37, line 48 (table 11): delete " 46     2291.1250201 61398344 " and insert -- 46    2291,125201    -61,398344 --, therefor In the Claims Column 55, line 38: Claim 1, after "using" delete "the"

Column 55, line 38: Claim 1, before "from" delete "coming"

Column 55, line 64: Claim 5, delete "field" and insert -- the field --, therefor Column 56, line 59: Claim 10, delete "thea" and insert -- a --, therefor Column 56, line 62: Claim 11, delete "$n_l>1.3$" and insert -- $n_l \geq 1.3$ --, therefor Column 56, line 64: Claim 12, delete "$NA \geq 1$" and insert -- $NA>1$ --, therefor Signed and Sealed this
Thirteenth Day of August, 2013

Teresa Stanek Rea
*Acting Director of the United States Patent and Trademark Office*

CERTIFICATE OF CORRECTION (continued)
U.S. Pat. No. 8,107,162 B2

In the Claims

Column 57, line 43: Claim 23, delete "in-such a manner" and insert -- such --, therefor Column 57, line 52: Claim 25, delete "used as the" and insert -- the --, therefor Column 57, line 55: Claim 26, delete "mirror" and insert -- mirror, --, therefor Column 57, line 57: Claim 26, delete "plane" and insert -- plane, --, therefor Column 58, line 33: Claim 33, delete "32" and insert -- 32, --, therefor